United States Patent
Hayano

(10) Patent No.: US 12,058,928 B2
(45) Date of Patent: Aug. 6, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., LTD., Yongin-si (KR)

(72) Inventor: Tetsuji Hayano, Yokohama (JP)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 1037 days.

(21) Appl. No.: 16/985,583

(22) Filed: Aug. 5, 2020

(65) Prior Publication Data

US 2021/0111344 A1    Apr. 15, 2021

(30) Foreign Application Priority Data

Oct. 10, 2019 (KR) .................. 10-2019-0125555

(51) Int. Cl.
*H01L 51/00* (2006.01)
*H10K 85/30* (2023.01)
(Continued)

(52) U.S. Cl.
CPC ......... *H10K 85/322* (2023.02); *H10K 85/636* (2023.02); *H10K 85/657* (2023.02); *H10K 50/11* (2023.02)

(58) Field of Classification Search
CPC .. H10K 85/322; H10K 85/636; H10K 85/657; H10K 50/11; H10K 85/626;
(Continued)

(56) References Cited

U.S. PATENT DOCUMENTS 10,205,105 B2    2/2019  Kwong et al.
2014/0027734 A1*  1/2014  Kwong ............... H10K 85/615
                                                 546/13
(Continued)

FOREIGN PATENT DOCUMENTS

CN    107266484 A    10/2017
CN    109438446 A     3/2019
(Continued)

OTHER PUBLICATIONS

Examination report dated Feb. 17, 2021 from the European Patent Office in respect of the European Patent Application No. 20198755 which corresponds to the above-identified U.S. application.
(Continued)

*Primary Examiner* — Ermias T Woldegeorgis
(74) *Attorney, Agent, or Firm* — CANTOR COLBURN LLP

(57) ABSTRACT

An organic electroluminescence device of an embodiment includes a first electrode, a second electrode, and an emission layer disposed between the first electrode and the second electrode, wherein the polycyclic compound includes a boranamine derivative, a first ring and a second ring, each directly linked to a boron atom of the boranamine derivative, a third ring and a fourth ring, each directly linked to a nitrogen atom of the boranamine derivative, and at least one substituted or unsubstituted boryl group, linked to at least one ring among the first to fourth rings, thereby showing long-life characteristics and excellent color reproducibility.

20 Claims, 2 Drawing Sheets

(51) Int. Cl.
*H10K 85/60* (2023.01)
*H10K 50/11* (2023.01)

(58) Field of Classification Search
CPC ............... H10K 85/631; H10K 85/633; H10K 85/6572; H10K 2101/10; H10K 50/12; C07F 5/02; C09K 11/06
See application file for complete search history.

(56) References Cited

U.S. PATENT DOCUMENTS

| | | | |
|---|---|---|---|
| 2015/0097162 A1* | 4/2015 | Ono | C09K 11/06 556/407 |
| 2015/0236274 A1 | 8/2015 | Hatakeyama et al. | |
| 2018/0040821 A1 | 2/2018 | Hatakeyama et al. | |
| 2019/0214575 A1 | 7/2019 | Ono et al. | |

FOREIGN PATENT DOCUMENTS

| | | |
|---|---|---|
| JP | 6393657 B2 | 9/2018 |
| KR | 1020150056567 A | 5/2015 |
| KR | 1020170126888 A | 11/2017 |
| KR | 101815653 B1 | 1/2018 |
| WO | 2014042197 A1 | 3/2014 |
| WO | 2015102118 A1 | 7/2015 |
| WO | 2016143624 A1 | 9/2016 |

OTHER PUBLICATIONS

Doping Polycyclic Arenes with Nitrogen-Boron-Nitrogen (NBN) Units, Org. Lett. 2018, 20, 21, 6741-6745,Queen's University, (Oct. 15, 2018).
First N-Borylated Emitters Displaying Highly Efficient Thermally Activated Delayed Fluorescence and High-Performance OLEDs, ACS Appl. Mater. Interfaces 2017, 9, 32, 27090-27101, Yun Chi(National Tsing Hua University) (Jul. 21, 2017).

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATIONS

This U.S. non-provisional patent application claims priority under 35 U.S.C. § 119 to Korean Patent Application No. 10-2019-0125555, filed on Oct. 10, 2019, the content of which are hereby incorporated in its entirety.

BACKGROUND

The present disclosure herein relates to an organic electroluminescence device and a polycyclic compound used therein, and more particularly, to a polycyclic compound used as a light-emitting material and an organic electroluminescence device including the same.

Recently, there has been increased interest in the development of an organic electroluminescence display device as an image display. Different from a liquid crystal display device, the organic electroluminescence display device is a so-called self-luminescent display device in which holes and electrons injected from a first electrode and a second electrode recombine in an emission layer, and a light-emitting material including an organic compound in the emission layer emits light to produce a display.

In the application of an organic electroluminescence device to a display device, a decrease of the driving voltage, and an increase of the emission efficiency and the life of the organic electroluminescence device are desirable. Therefore, there is a need for materials with improved properties such as driving voltage and emission efficiency for an organic electroluminescence device.

Particularly, recently, in order to accomplish an organic electroluminescence device with high efficiency, techniques have been developed such as phosphorescence emission which uses energy in a triplet state, or delayed fluorescence emission which uses the generating phenomenon of singlet excitons by the collision of triplet excitons (triplet-triplet annihilation, TTA), and materials that undergo thermally activated delayed fluorescence (TADF) using the delayed fluorescence phenomenon have been developed.

SUMMARY

The present disclosure provides an organic electroluminescence device showing good life characteristics and excellent emission efficiency.

The present disclosure also provides a polycyclic compound which is a material for an organic electroluminescence device having high color purity and long-life characteristics.

An embodiment of the inventive concept provides a polycyclic compound represented by the following Formula 1:

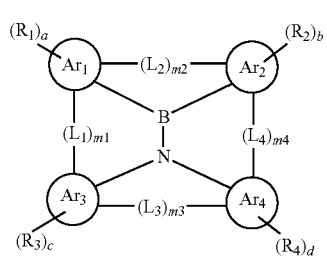

Formula 1

In Formula 1, $Ar_1$ to $Ar_4$ are each independently a substituted or unsubstituted aryl group of 6 to 30 carbon atoms for forming a ring, or a substituted or unsubstituted heteroaryl group of 2 to 30 carbon atoms for forming a ring, a to d are each independently an integer of 0 to 4, wherein at least one among a to d is an integer of 1 or more. m1 to m4 are each independently 0 or 1, $L_1$ to $L_4$ are each independently a direct linkage, *—O—*, *—S—*, *—C(=O)—*, *—$SO_2$—*, or *—NRa—*. $R_1$ to $R_4$, and Ra are each independently a hydrogen atom, a deuterium atom, a halogen atom, a cyano group, a nitro group, a substituted or unsubstituted amine group, a substituted or unsubstituted alkoxy group, a substituted or unsubstituted aryloxy group, a substituted or unsubstituted alkylthio group, a substituted or unsubstituted arylthio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_1$ to $R_4$, and Ra are each independently optionally linked with an adjacent group to form a ring, and when at least one among a to d is an integer of 1 or more, then at least one among $R_1$ to $R_4$ is a substituted or unsubstituted boryl group.

In an embodiment, Formula 1 may be represented by any one among Formula 1A to Formula 1C:

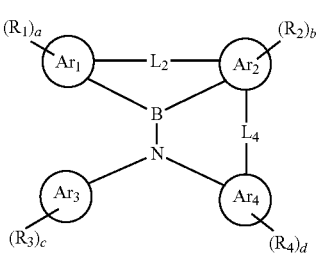

Formula 1A

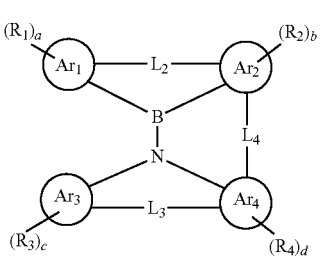

Formula 1B

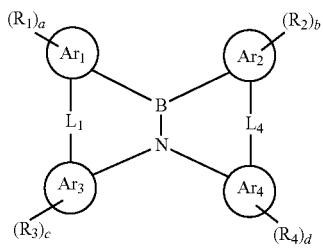

Formula 1C

In Formula 1A to Formula 1C, $Ar_1$ to $Ar_4$, a to d, $L_1$ to $L_4$, and $R_1$ to $R_4$ are the same as defined in Formula 1.

In an embodiment, Formula 1 may be represented by Formula 1D:

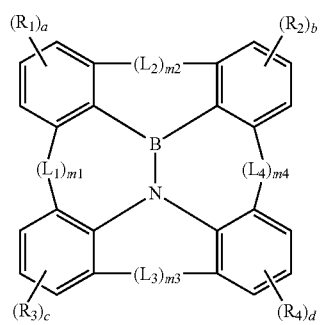

Formula 1D

In Formula 1D, a to d, m1 to m4, $L_1$ to $L_4$, and $R_1$ to $R_4$ are the same as defined in Formula 1.

In an embodiment, Formula 1 may be represented by any one among

Formula 1-1 to Formula 1-4

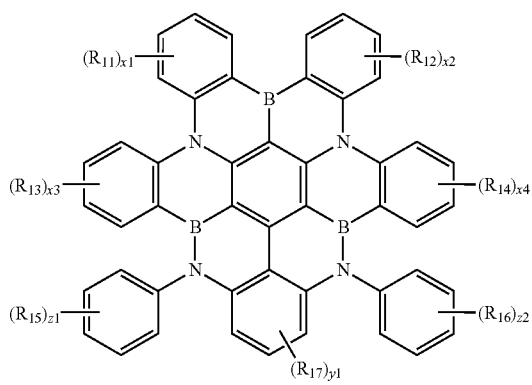

Formula 1-1

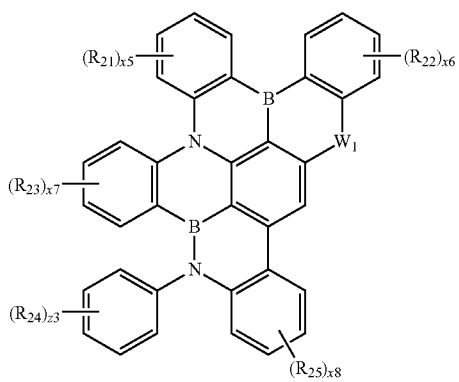

Formula 1-2

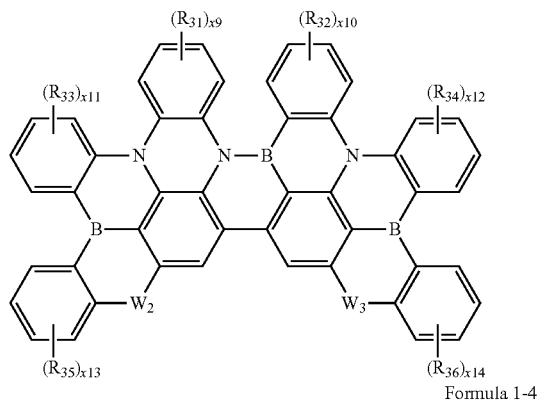

Formula 1-3

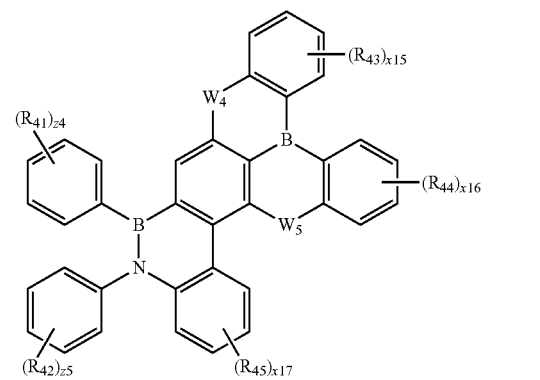

Formula 1-4

In Formula 1-1, $y_1$ is an integer of 0 to 3. In Formula 1-1 to Formula 1-4, $R_{11}$ to $R_{17}$, $R_{21}$ to $R_{25}$, $R_{31}$ to $R_{36}$, and $R_{41}$ to $R_{45}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{11}$ to $R_{17}$, $R_{21}$ to $R_{25}$, $R_{31}$ to $R_{36}$, and $R_{41}$ to $R_{45}$ are each independently optionally linked with an adjacent group to form a ring. x11 to x17 are each independently an integer of 0 to 4, z1 to z5 are each independently an integer of 0 to 5. $W_1$ to $W_5$ are each independently a direct linkage, *—O—*, or, *—NRa—*, and Ra is the same as defined in Formula 1.

In an embodiment, at least one among $R_1$ to $R_4$ may be a deuterium atom, an alkyl group of 1 to 20 carbon atoms, which is substituted with a deuterium atom, an alkenyl group of 2 to 20 carbon atoms, which is substituted with a deuterium atom, an aryl group of 6 to 30 carbon atoms for forming a ring, which is substituted with a deuterium atom, or a heteroaryl group of 2 to 30 carbon atoms for forming a ring, which is substituted with a deuterium atom.

In an embodiment, the polycyclic compound represented by Formula 1 may be a blue dopant emitting blue light having a central wavelength of about 470 nm or less.

In an embodiment, the polycyclic compound represented by Formula 1 may be a material for emitting thermally activated delayed fluorescence.

In an embodiment of the inventive concept, there is provided an organic electroluminescence device including a first electrode; a second electrode disposed on the first electrode; and an emission layer disposed between the first electrode and the second electrode and including a polycyclic compound, wherein the polycyclic compound includes a boranamine derivative; a first ring and a second ring, each directly linked to a boron atom of the boranamine derivative; a third ring and a fourth ring, each directly linked to a nitrogen atom of the boranamine derivative; and at least one substituted or unsubstituted boryl group linked to at least one ring among the first to fourth rings. The first electrode and the second electrode each independently comprise at least one of Ag, Mg, Cu, Al, Pt, Pd, Au, Ni, Nd, Ir, Cr, Li, Ca, LiF/Ca, LiF/Al, Mo, Ti, In, Sn, Zn, a compound comprising two or more of the foregoing, an oxide thereof, or a combination thereof.

In an embodiment, a boron atom of the substituted or unsubstituted boryl group may not be directly linked to a neighboring nitrogen atom.

In an embodiment, at least two adjacent rings selected among the first to fourth rings may be directly linked, linked with each other via a linker, or linked with an adjacent substituent to form a condensed ring.

In an embodiment, the condensed ring may include an azaborinine moiety.

In an embodiment, the first to fourth rings may be each independently a substituted or unsubstituted aryl group of 6 to 30 carbon atoms for forming a ring, or a substituted or unsubstituted heteroaryl group of 2 to 30 carbon atoms for forming a ring.

In an embodiment, the first to fourth rings may be each independently a substituted or unsubstituted benzene ring.

In an embodiment, at least one hydrogen atom in the polycyclic compound may be substituted with a deuterium atom.

In an embodiment, the polycyclic compound included in the emission layer may be the polycyclic compound represented by Formula 1 above.

In an embodiment, the emission layer may emit delayed fluorescence.

In an embodiment, the emission layer may include a host and a dopant, and the dopant may include the polycyclic compound.

In an embodiment, the emission layer may emit light having a central wavelength of about 430 nm to about 470 nm.

BRIEF DESCRIPTION OF THE FIGURES

The accompanying drawings are included to provide a further understanding of the inventive concept and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
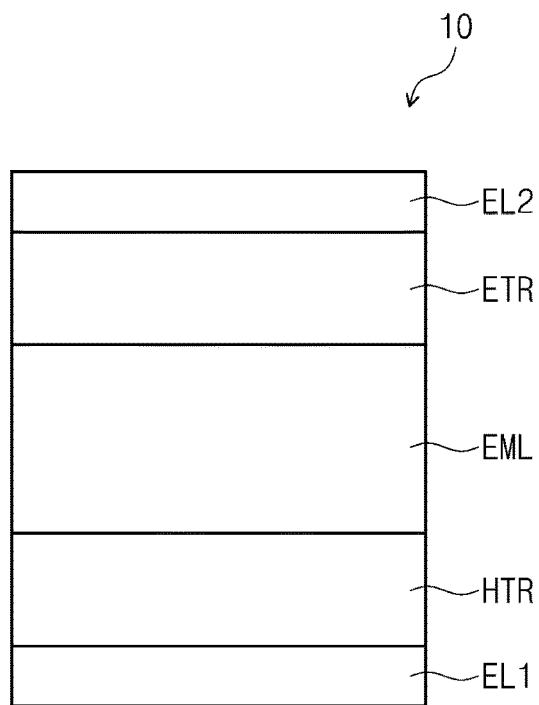
FIG. 1 is a cross-sectional view schematically illustrating an organic electroluminescence device according to an exemplary embodiment.

The inventive concept may have various modifications and may be embodied in different forms, and example embodiments will be explained in detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

It will be understood that when an element (or region, layer, part, etc.) is referred to as being "on", "connected to" or "coupled to" another element, it can be directly on, connected or coupled to the other element or a third intervening elements may be present. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the inventive concept will be explained with reference to attached drawings.

FIGS. 1 to 4 are cross-sectional views schematically showing organic electroluminescence devices according to exemplary embodiments of the inventive concept. Referring to FIGS. 1 to 4, in an organic electroluminescence device 10 according to an embodiment, a first electrode EL1 and a second electrode EL2 are oppositely disposed, and between the first electrode EL1 and the second electrode EL2, an emission layer EML may be disposed.

In addition, the organic electroluminescence device 10 of an embodiment further includes a plurality of functional groups between the first electrode EL1 and the second electrode EL2 in addition to the emission layer EML. The plurality of the functional groups may include a hole transport region HTR and an electron transport region ETR. That is, the organic electroluminescence device 10 of an embodiment may include a first electrode EL1, a hole transport region HTR, an emission layer EML, an electron transport region ETR, and a second electrode, laminated one by one. In addition, the organic electroluminescence device 10 of an embodiment may include a capping layer CPL disposed on the second electrode EL2.

The organic electroluminescence device 10 of an embodiment may include a polycyclic compound of an embodiment, which will be explained later, in the emission layer EML disposed between the first electrode EL1 and the second electrode EL2. However, an embodiment of the inventive concept is not limited thereto, and the organic electroluminescence device 10 of an embodiment may include a polycyclic compound of an embodiment, which will be explained later, in the hole transport region HTR or the electron transport region ETR, which are a plurality of the functional groups disposed between the first electrode EL1 and the second electrode EL2, in addition to the emission layer EML.

Figure 2:
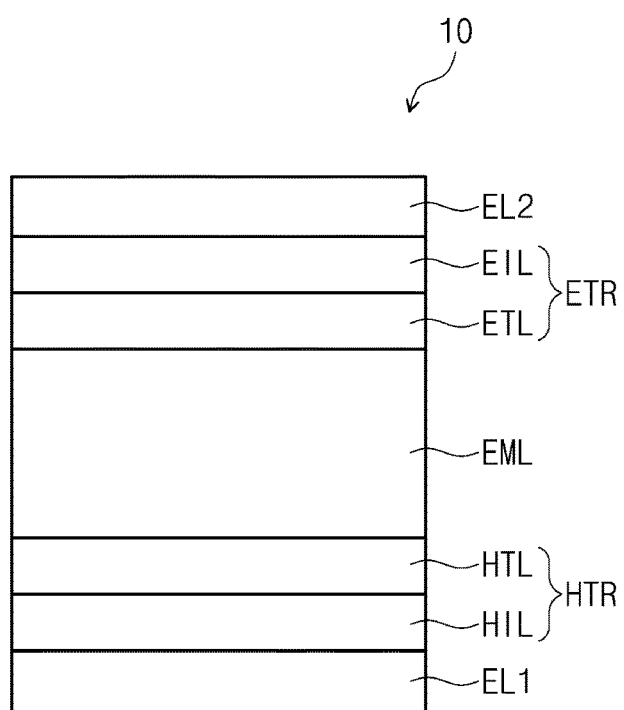
FIG. 2 is a cross-sectional view schematically illustrating an organic electroluminescence device according to an exemplary embodiment.
Figure 3:
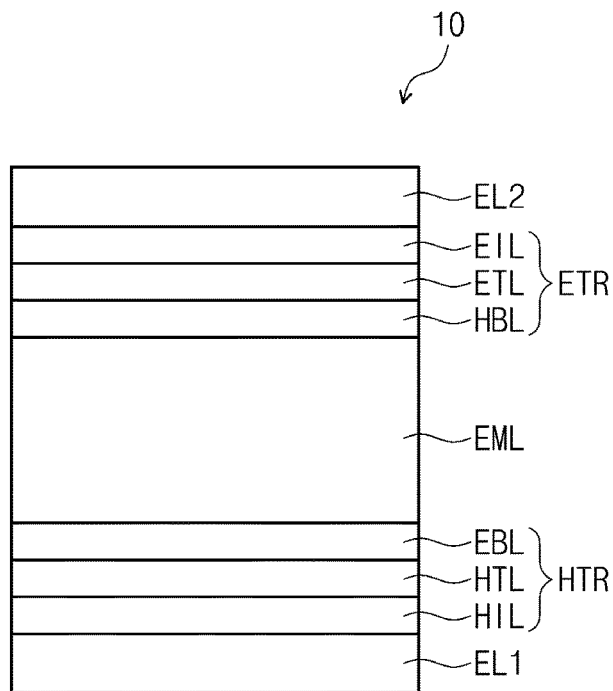
FIG. 3 is a cross-sectional view schematically illustrating an organic electroluminescence device according to an exemplary embodiment.
Figure 4:
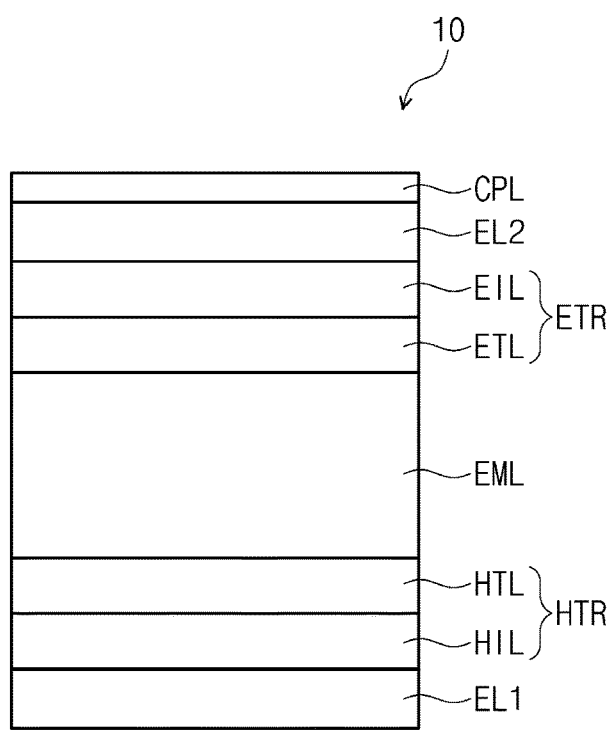
FIG. 4 is a cross-sectional view schematically illustrating an organic electroluminescence device according to an exemplary embodiment.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment including a capping layer CPL disposed on the second electrode EL2.

The first electrode EL1 has conductivity. The first electrode EL1 may be formed using a metal alloy or a conductive compound. The first electrode EL1 may be an anode. The first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, an embodiment of the inventive concept is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), or an electron blocking layer EBL. The thickness of the hole transport region HTR may be from about 50 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer (not shown), hole injection layer HIL/hole buffer layer (not shown), hole transport layer HTL/hole buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalenyl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport layer HTL may include, for example, carbazole derivatives such as N-phenyl carbazole and polyvinyl carbazole, fluorene-based derivatives, N,N'-bis(3- methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphtha-lenyl)-N,N'-diphenyl-benzidine (NPB), 4,4'-cyclohex-ylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide, and molybdenum oxide, without limitation.

As described above, the hole transport region HTR may further include at least one of a hole buffer layer (now shown) or an electron blocking layer EBL in addition to the hole injection layer HIL and the hole transport layer HTL. The hole buffer layer (not shown) may compensate for an optical resonance distance according to the wavelength of light emitted from an emission layer EML and may increase light emission efficiency. Materials which may be included in a hole transport region HTR may be used as materials included in a hole buffer layer (not shown). The electron blocking layer EBL is a layer playing the role of preventing the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of an embodiment, the emission layer EML may include the polycyclic compound of an embodiment.

The polycyclic compound according to an embodiment may include a boranamine derivative. The boranamine derivative includes a direct linkage moiety between a boron atom (B) and a nitrogen atom (N), and may include a

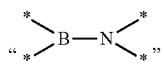

moiety.

The polycyclic compound according to an embodiment may include a boranamine derivative, first and second rings, each linked to the B atom of the boranamine derivative, and third and fourth rings, which each linked to the N atom of the boranamine derivative. In addition, the polycyclic compound of an embodiment may include at least one substituted or unsubstituted boryl group, which is substituted in at least one among the first to fourth rings.

In addition, in the polycyclic compound of an embodiment, the B atom of the substituted or unsubstituted boryl group is not directly linked to the N atom of the boranamine derivative, and the B atom of the substituted or unsubstituted boryl group may not be directly linked to the N atom of adjacent substituents.

Meanwhile, in the description, a substituent of a substituted groups corresponds to at least one of a deuterium atom, a halogen atom, a cyano group, a nitro group, an amino group, a silyl group, an alkoxy group, an aryloxy group, an alkylthio group, an arylthio group, a sulfinyl group, a sulfonyl group, a carbonyl group, a boryl group, a phosphine oxide group, a phosphine sulfide group, an alkyl group, an alkenyl group, an alkynyl group, an alkoxy group, a hydrocarbon ring group, an aryl group, a heterocyclic group or any combination thereof. In addition, each of the exemplified substituents may be substituted or unsubstituted. For example, a biphenyl group may be interpreted as an aryl group or a phenyl group substituted with a phenyl group.

In the description, the term "linked with an adjacent group to form a ring" means forming a substituted or unsubstituted hydrocarbon ring, or a substituted or unsubstituted heterocycle via the combination with adjacent groups. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination of adjacent groups may be combined with another ring to form a spiro structure.

In the description, the term "adjacent group" means a pair of substituent groups where the first substituent is connected to an atom that is directly connected to another atom substituted with the second substituent, a pair of substituent groups connected to the same atom and different from each other, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the description, examples of the halogen atom may include a fluorine atom, a chlorine atom, a bromine atom or an iodine atom.

In the description, the alkyl may be a linear, branched or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring group means an optional functional group or substituent derived from an aliphatic hydrocarbon ring. The hydrocarbon ring group may be a saturated hydrocarbon ring group of 5 to 20 carbon atoms for forming a ring.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the heterocyclic group may include one or more among B, O, N, P, Si, Se, Ge, and S as heteroatoms. If the heterocyclic group includes two or more heteroatoms, two or more heteroatoms may be the same or different. The heterocyclic group may be a monocyclic heterocyclic group or a polycyclic heterocyclic group, and has a concept including a heteroaryl group. The carbon number for forming a ring of the heteroaryl group may be 2 to 30, 2 to 20, or 2 to 10.

In the description, the heteroaryl group may include one or more among B, O, N, P, Si, Se, Ge, and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming a ring of the heteroaryl group may be 2 to 30, 2 to 20, or 2 to 10. Examples of the heteroaryl group may include thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, isooxazolyl, thiadiazolyl, phenothiazinyl, dibenzosilolyl, dibenzofuranyl, etc., without limitation.

In the description, the alkoxy group may be a linear, branched or cyclic chain. The carbon number of the alkoxy group is not specifically limited but may be, for example, 1 to 20 or 1 to 10. Examples of the alkoxy group may include methoxy, ethoxy, n-propoxy, isopropoxy, butoxy, pentyloxy, hexyloxy, octyloxy, nonyloxy, decyloxy, etc. However, an embodiment of the inventive concept is not limited thereto.

In the description, the carbon number for forming a ring of the aryl oxy group is not specifically limited, bur for example, may be 6 to 30, 6 to 20, or 6 to 15.

In the description, the alkylthio group may be a linear, branched or cyclic chain. The carbon number of the alkylthio group is not specifically limited but may be, for example, 1 to 20 or 1 to 10. Examples of the alkylthio group may include —S-methyl, —S-ethyl, —S-n-propyl, —S-isopropyl, and the like. However, an embodiment of the inventive concept is not limited thereto.

In the description, the carbon number for forming a ring of the aryl thio group is not specifically limited, bur for example, may be 6 to 30, 6 to 20, or 6 to 15.

In the description, the boryl group includes an alkyl boryl group and an aryl boryl group. Examples of the boryl group include a trimethylboryl group, a triethylboryl group, a t-butyldimethylboryl group, a triphenylboryl group, a diphenylboryl group, a phenylboryl group, etc., without limitation. For example, the alkyl group in the alkyl boryl group may be the same as the above-exemplified alkyl groups, and the aryl group in the aryl boryl group may be the same as the above-exemplified aryl groups.

In the description, the alkenyl group may be a linear chain or a branched chain. The carbon number of the alkenyl group is not specifically limited but may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the description, the carbon number of the amine group is not specifically limited, but may be 1 to 30. The amine group may include an alkyl amine group, and an aryl amine group. Examples of the amine group include a methylamine group, a dimethylamine group, a phenylamine group, a diphenylamine group, a naphthylamine group, a 9-methylanthracenylamine group, a triphenylamine group, etc., without limitation. For example, the alkyl group in the alkyl amine group may be the same as the above-exemplified alkyl groups, and the aryl group in the aryl amine group may be the same as the above-exemplified aryl groups.

In the description, the direct linkage may mean a single bond.

Meanwhile, in the description, "—*" means a connected position.

In the polycyclic compound according to an embodiment, the first to fourth rings combined with the boranamine derivative may be each independently a substituted or unsubstituted aryl group of 6 to 30 carbon atoms for forming a ring, or a substituted or unsubstituted heteroaryl group of 2 to 30 carbon atoms for forming a ring. For example, in the polycyclic compound according to an embodiment, the first to fourth rings may be each independently a substituted or unsubstituted benzene ring.

In the polycyclic compound of an embodiment, at least two first to fourth rings adjacent to each other may be linked with each other to form a ring. For example, two or more neighboring first to fourth rings may be directly linked, linked with each other via a linker, or linked with an adjacent substituent from each other to form a condensed ring. In the polycyclic compound of an embodiment, the condensed ring formed by the combination of neighboring rings may include an azaborinine moiety.

In addition, at least one substituted or unsubstituted boryl group included in the polycyclic compound of an embodiment may be combined with an adjacent linker, or adjacent substituents to form a condensed ring. For example, the condensed ring formed by the combination of the substituted or unsubstituted boryl group with an adjacent group may include an azaborinine ring.

That is, in the polycyclic compound of an embodiment, at least one substituted or unsubstituted boryl group may be linked with at least one of the adjacent first to fourth rings, an adjacent linker, and an adjacent substituent to form a condensed ring.

The emission layer EML of an organic electroluminescence device 10 of an embodiment may include a polycyclic compound of an embodiment, represented by the following Formula 1:

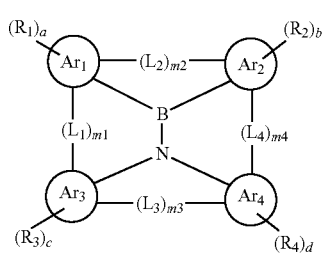

Formula 1

In Formula 1, $Ar_1$ to $Ar_4$ may be each independently a substituted or unsubstituted aryl groups of 6 to 30 carbon atoms for forming a ring, or a substituted or unsubstituted heteroaryl group of 2 to 30 carbon atoms for forming a ring. For example, $Ar_1$ to $Ar_4$ may be each independently a substituted or unsubstituted benzene ring. Meanwhile, in $Ar_1$ to $Ar_4$, $Ar_1$ and $Ar_2$ may correspond to the first ring and the second ring, which are directly linked with the boron atom of the boranamine derivative, and $Ar_3$ and $Ar_4$ may correspond to the third ring and the fourth ring, which are directly linked with the nitrogen atom of the boranamine derivative.

In Formula 1, a to d are each independently an integer of 0 to 4. In addition, in Formula 1, at least one among a to d is an integer of 1 or more. Meanwhile, in case where a to d are each independently an integer of 2 or more, a plurality of $R_1$ groups to $R_4$ groups may be each independently the same or at least one thereof may be different. For example, in case where a is an integer of 2 or more, a plurality of $R_1$ groups may be the same or at least one thereof may be different from the remainder. The above explanation is an illustration, and the same explanation may be applied to $R_2$ to $R_4$ groups for cases where each of "b" to d is an integer of 2 or more.

In the polycyclic compound represented by Formula 1, $R_1$ to $R_4$ may be each independently a hydrogen atom, a deuterium atom, a halogen atom, a cyano group, a nitro group, a substituted or unsubstituted amine group, a substituted or unsubstituted alkoxy group, substituted or unsubstituted aryloxy group, a substituted or unsubstituted alkylthio group, a substituted or unsubstituted arylthio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, or $R_1$ to $R_4$ may be each independently optionally linked with an adjacent group to form a ring. In addition, at least one among $R_1$ to $R_4$ is a substituted or unsubstituted boryl group.

That is, in case where at least one among a to d is an integer of 1 or more, at least one among $R_1$ to $R_4$ groups may be a substituted or unsubstituted boryl group. Accordingly, the polycyclic compound of an embodiment may further include at least one boron atom as a ring-forming atom in addition to the boron atom in B—N having a direct linkage between a boron atom and a nitrogen atom. The additional boron atom excluding the boron atom in the B—N bond may not be directly combined with a nitrogen atom.

In Formula 1, m1 to m4 are each independently 0 or 1. In case where m1 to m4 are 0, it means that neighboring rings are not connected with each other. In the polycyclic compound of an embodiment, at least one among m1 to m4 may be 1. For example, m2 and m4 may be 1, and m1 and m3 may be 0. In addition, m1 may be 0, and m2 to m4 may be 1. However, an embodiment of the inventive concept is not limited thereto, and at least one selected among m1 to m4 may be 1.

In Formula 1, $L_1$ to $L_4$ may be each independently a direct linkage, *—O—*, *—S—*, *—C(=O)—*, *—SO$_2$—*, or *—NRa—*. Meanwhile, Ra may be a hydrogen atom, a deuterium atom, a halogen atom, a cyano group, a nitro group, a substituted or unsubstituted amine group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, $L_1$ to $L_4$ may be each independently optionally linked with an adjacent group to form a ring.

For example, in case where any one among $L_1$ to $L_4$ is a direct linkage, two neighboring rings may be connected via a single bond. In case where any one among $L_1$ to $L_4$ is NRa, two neighboring rings may be linked with each other via the nitrogen atom (N) of NRa.

Two neighboring rings linked with each other via any one among the linkers, i.e., $L_1$ to $L_4$, may form a condensed ring including at least one among the boron atom and the nitrogen atom of a boranamine as a ring-forming atom. For example, the condensed ring formed by linking neighboring two rings via a linker may include an azaborinine moiety.

In addition, a substituent of $Ar_1$ to $Ar_4$, and neighboring linkers among $L_1$ to $L_4$, which are connecting linkers of two neighboring rings may be linked with each other to form a condensed ring. For example, a substituent of one of $Ar_1$ to $Ar_4$ and a linker adjacent to the selected ring may be linked with each other to form a condensed ring including an azaborinine moiety.

In the polycyclic compound of an embodiment, the condensed ring formed by linking a substituent of one of $Ar_1$ to $Ar_4$, and a linker adjacent to the selected ring and substituent, may include a moiety represented by any one among the following FR-1 to FR-3:

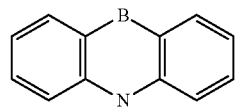

FR-1

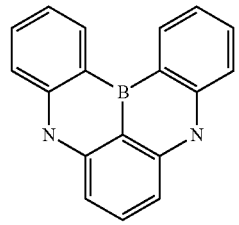

FR-2

FR-3

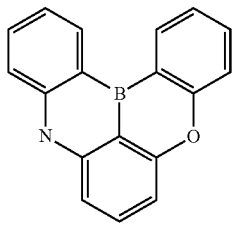

Meanwhile, in the polycyclic compound of an embodiment, represented by Formula 1, at least one of $R_1$ to $R_4$ may be a deuterium atom or a substituent substituted with a deuterium atom. For example, at least one of $R_1$ to $R_4$ may be a deuterium atom, an alkyl group of 1 to 20 carbon atoms, which is substituted with a deuterium atom, an alkenyl group of 2 to 20 carbon atoms, which is substituted with a deuterium atom, an aryl group of 6 to 30 carbon atoms for forming a ring, which is substituted with a deuterium atom, or a heteroaryl group of 2 to 30 carbon atoms for forming a ring, which is substituted with a deuterium atom. In addition, in case where $R_1$ groups to $R_4$ groups are in plurality, at least one among the plurality of $R_1$ to $R_4$ groups may be a deuterium atom or a substituent which is substituted with a deuterium atom.

Formula 1 may be represented by any one among the following Formula 1A to Formula 1C:

Formula 1A

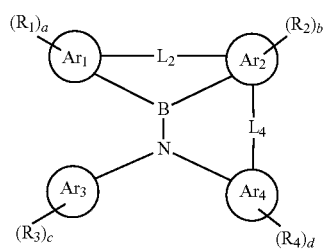

Formula 1B

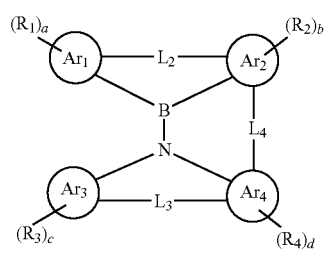

Formula 1C

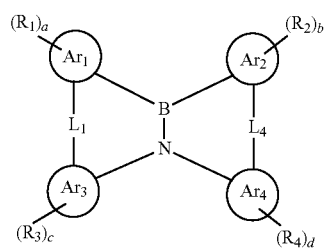

In Formula 1A to Formula 1C, the same explanation referring to Formula 1 may be applied to $Ar_1$ to $Ar_4$, a to d, $L_1$ to $L_4$, and $R_1$ to $R_4$.

In the polycyclic compound of an embodiment, represented by Formula 1A, any one among $L_2$ and $L_4$ may be a direct linkage. For example, in the polycyclic compound of an embodiment, represented by Formula 1A, $L_4$ may be a direct linkage, and $L_2$ may be NRa. However, an embodiment of the inventive concept is not limited thereto.

In addition, in the polycyclic compound of an embodiment, represented by Formula 1B, any one among $L_2$ and $L_4$ may be a direct linkage. For example, in the polycyclic compound of an embodiment, represented by Formula 1B, $L_4$ may be a direct linkage, and $L_2$ and $L_3$ may be NRa. $L_2$ and $L_3$ may be the same or different from each other. Meanwhile, an embodiment of the inventive concept is not limited thereto. $L_2$ to $L_4$ may be each independently one kind of the linker defined in Formula 1.

In the polycyclic compound of an embodiment, represented by Formula 1C, any one among $L_1$ and $L_4$ may be a direct linkage. For example, in the polycyclic compound of an embodiment, represented by Formula 1C, $L_4$ may be a direct linkage, and $L_1$ may be NRa. However, an embodiment of the inventive concept is not limited thereto.

In an embodiment, Formula 1 may be represented by the following Formula 1D:

Formula 1D

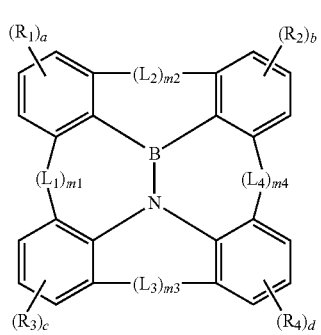

In Formula 1D, the same explanation referring to FIG. 1 may be applied to a to d, m1 to m4, $L_1$ to $L_4$, and $R_1$ to $R_4$.

In an embodiment, Formula 1 may be represented by any one among the following Formula 1-1 to Formula 1-4:

Formula 1-1

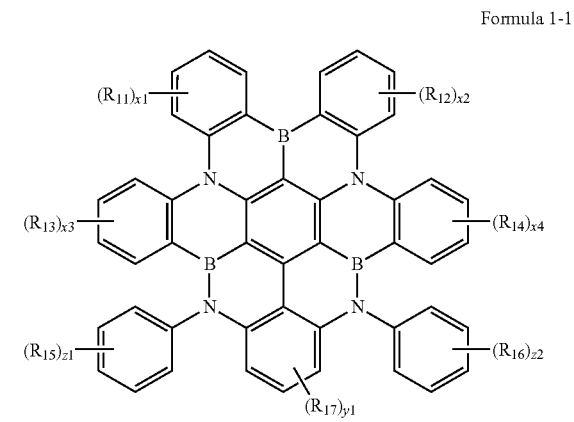

-continued

Formula 1-2

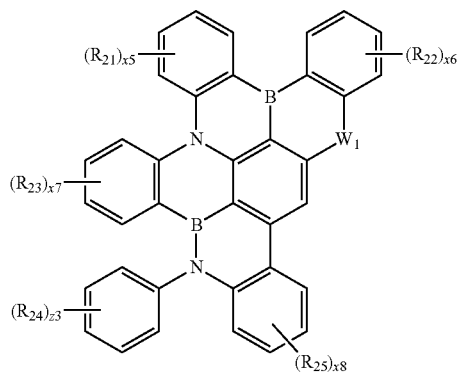

Formula 1-3

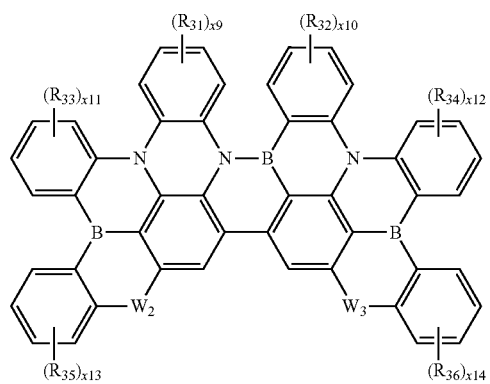

Formula 1-4

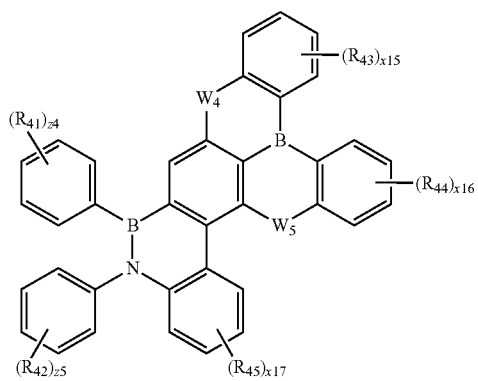

In Formula 1-1 to Formula 1-4, $R_{11}$ to $R_{17}$, $R_{21}$ to $R_{25}$, $R_{31}$ to $R_{36}$, and $R_{41}$ to $R_{45}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{11}$ to $R_{17}$, $R_{21}$ to $R_{25}$, $R_{31}$ to $R_{36}$, and $R_{41}$ to $R_{45}$ may each be independently optionally linked with an adjacent group to form a ring.

In Formula 1-1 to Formula 1-4, x11 to x17 are each independently an integer of 0 to 4, and z1 to z5 are each independently an integer of 0 to 5.

In Formula 1-1 to Formula 1-4, $W_1$ to $W_5$ are each independently a direct linkage, *—O—*, or *—NRa—*. Meanwhile, Ra in NRa may be a hydrogen atom, a deuterium atom, a halogen atom, a cyano group, a nitro group, a substituted or unsubstituted amine group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and $W_1$ to $W_5$ may each be optionally linked with an adjacent group to form a ring.

In addition, in Formula 1-1, $y_1$ may be an integer of 0 to 3.

The polycyclic compound of an embodiment includes a direct linkage moiety (B—N bond) of a boron atom (B) and a nitrogen atom (N), and aromatic rings forming the polycyclic compound are crosslinked from each other and fixed due to the B—N bond, thereby improving the stability of the polycyclic compound molecule. Accordingly, if the polycyclic compound of an embodiment is used as a material for an emission layer of an organic electroluminescence device, the life characteristics of the organic electroluminescence device may be improved.

In addition, the polycyclic compound of an embodiment further includes at least one boron atom which is not directly linked with a nitrogen atom, in addition to the boron atom of the B—N bond, and the skeleton change of a molecule may be minimized even in case of an excited state.

That is, the polycyclic compound of an embodiment has a molecular structure further including at least one boron atom which is not directly linked with a nitrogen atom, in addition to the boron atom of the B—N bond, and a low $\Delta E_{ST}$ value is shown. Accordingly, the polycyclic compound may be used as a material for thermally activated delayed fluorescence (TADF) and show narrow full width at half maximum properties in a light-emitting wavelength region.

The polycyclic compound of an embodiment may be any one among the compounds represented in Compound Group 1. The organic electroluminescence device 10 of an embodiment may include at least one polycyclic compound among the polycyclic compounds represented in Compound Group 1 in an emission layer EML.

Compound Group 1

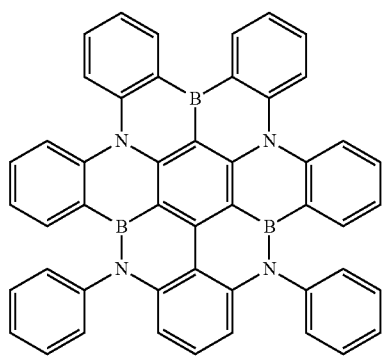

1

2
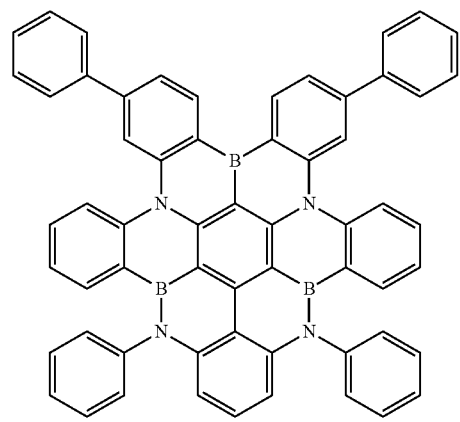
3
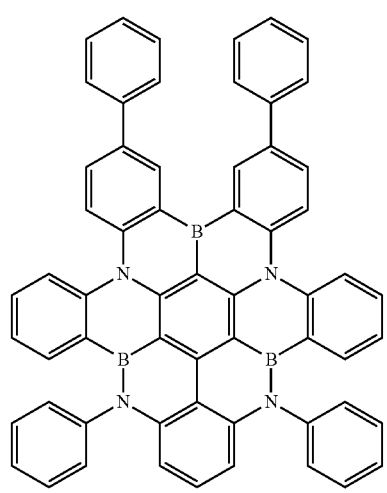
4
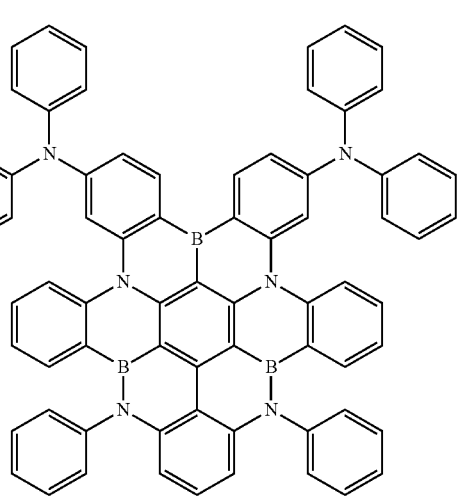
5
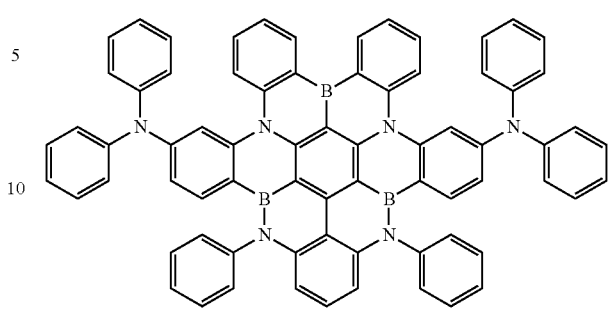
6
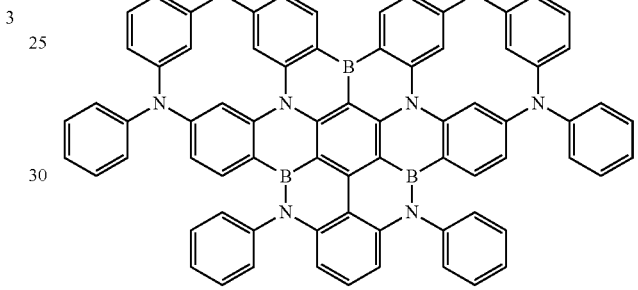
7
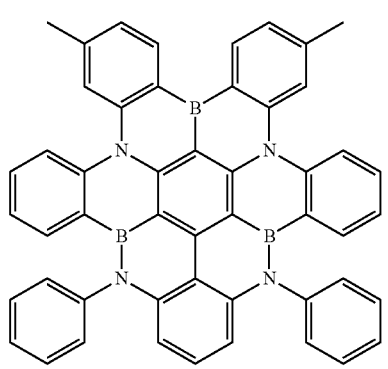
8
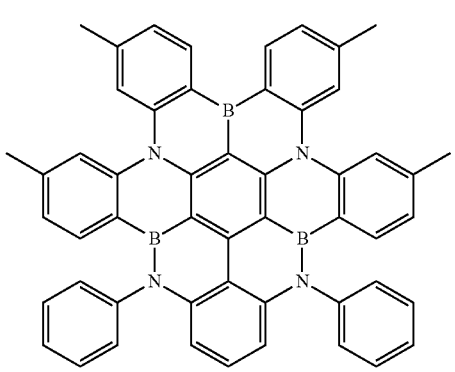

9
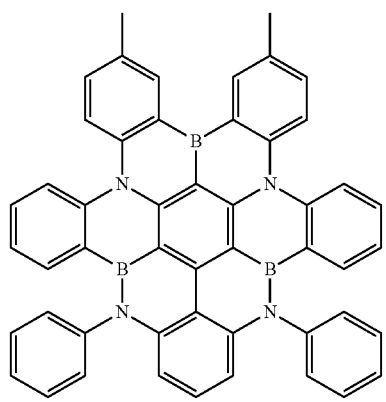
10
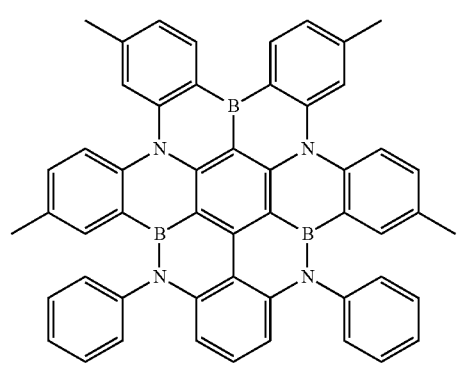
11
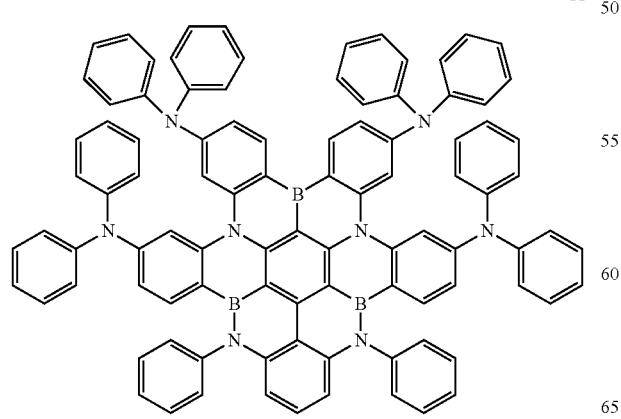
12
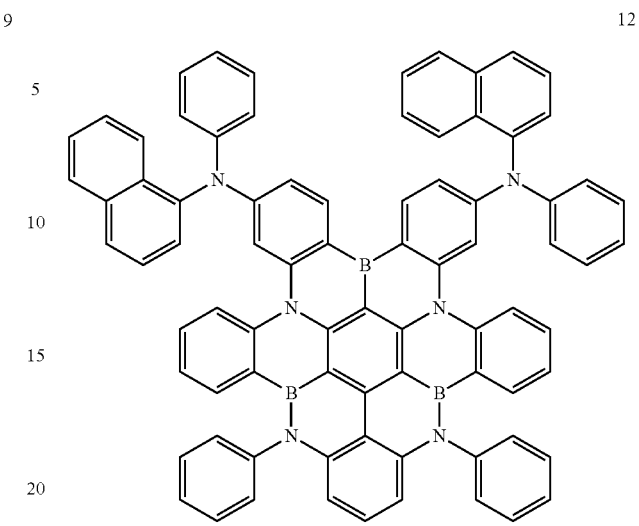
13
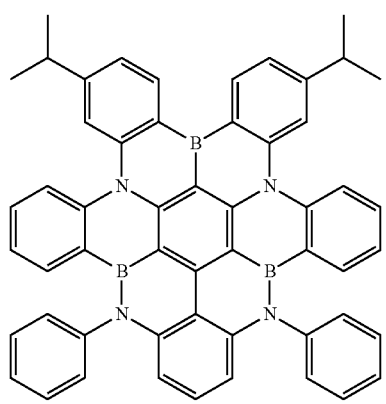
14
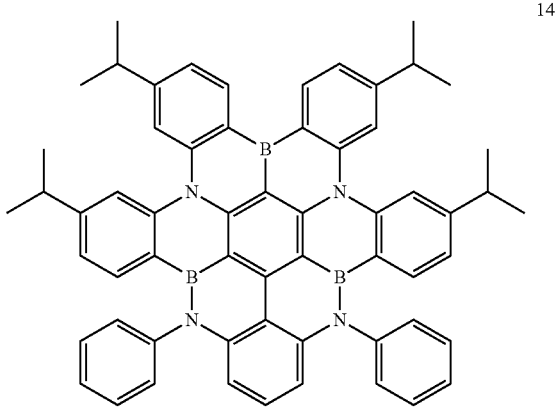

15
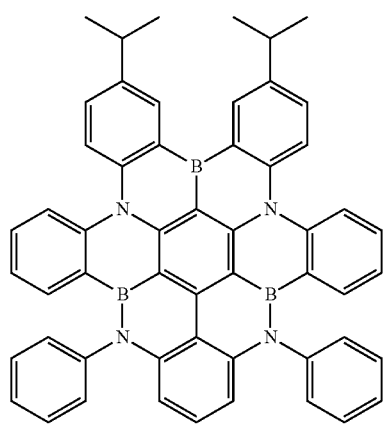
16
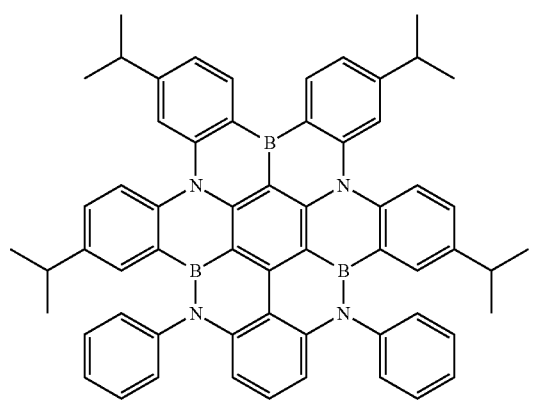
17
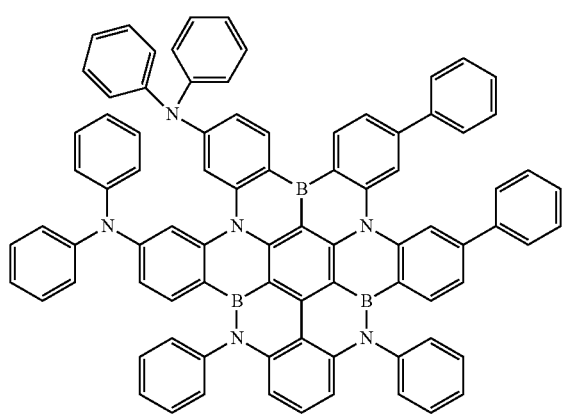
18
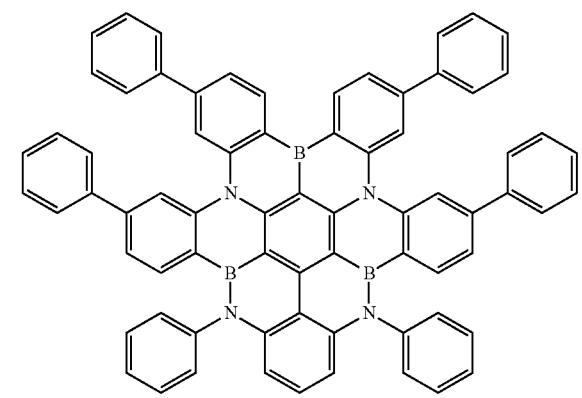
19
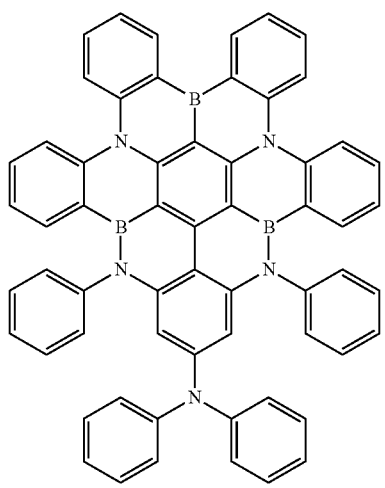
20
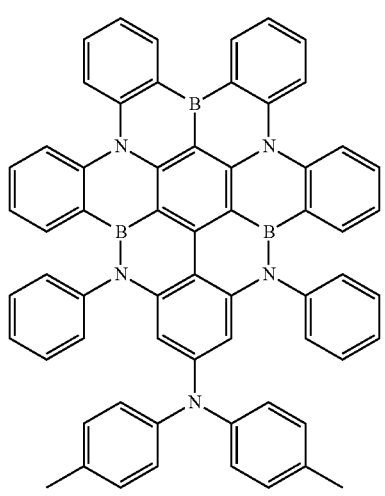

21
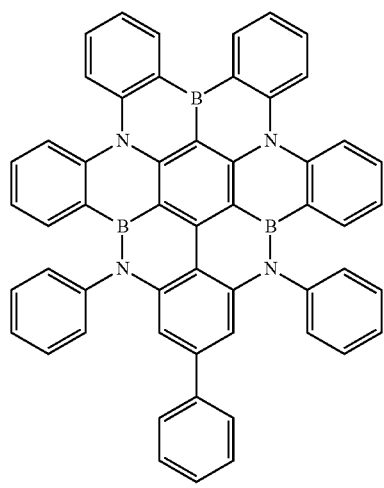
22
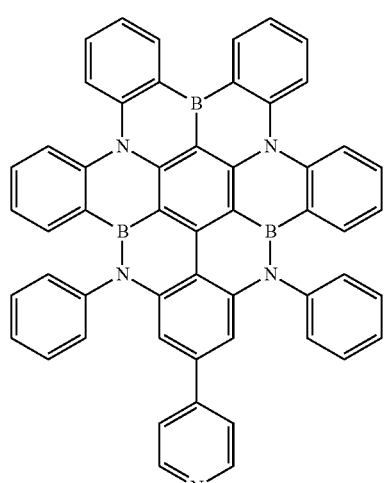
23
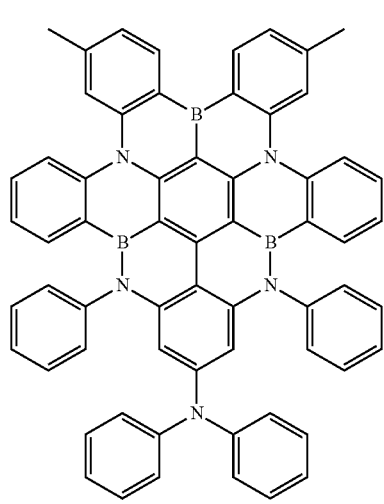
24
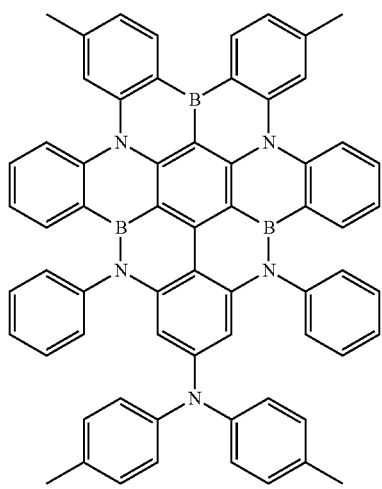
25
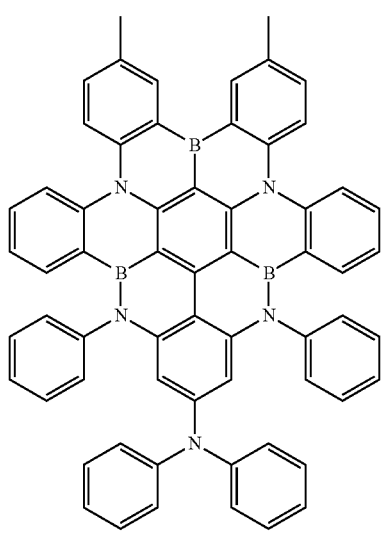
26
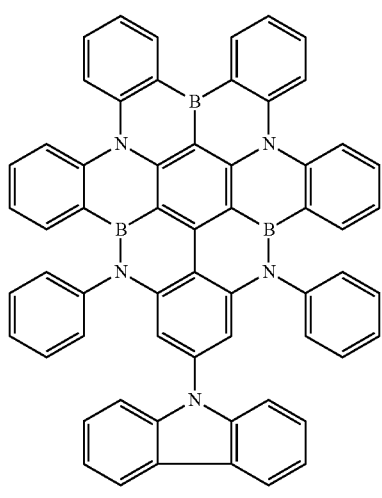

27
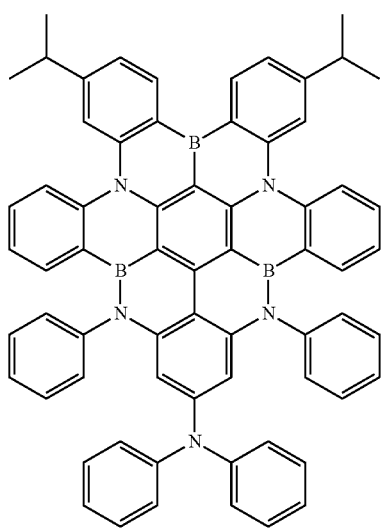
28
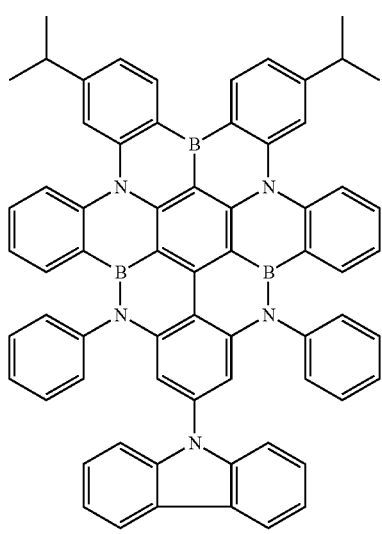
29
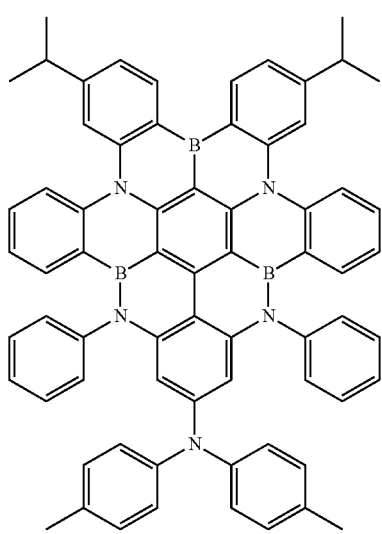
30
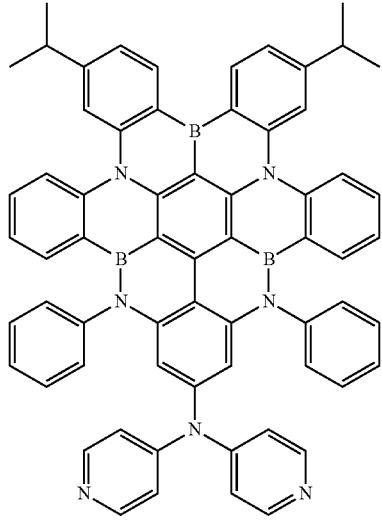
31
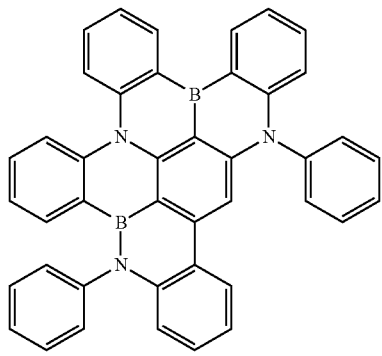
32
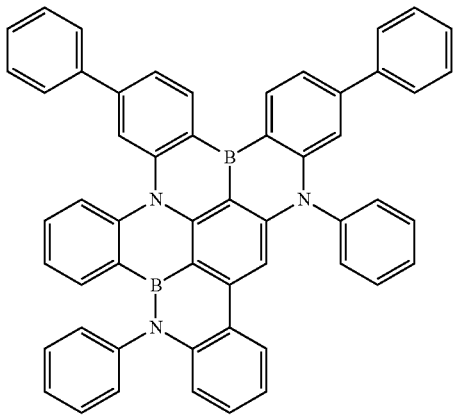

33
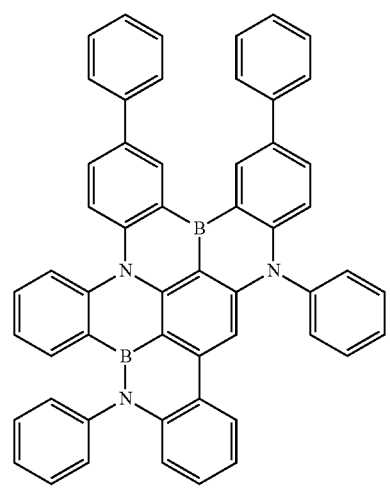
34
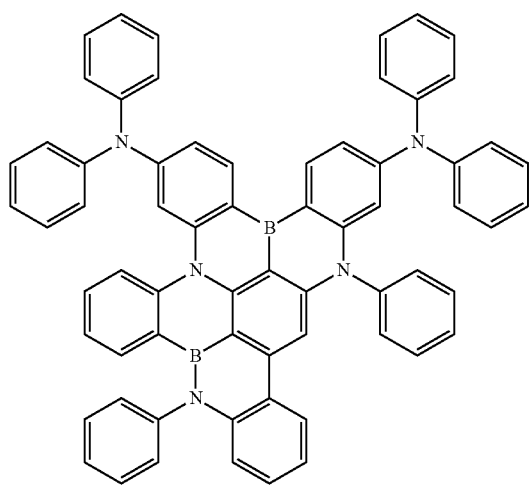
35
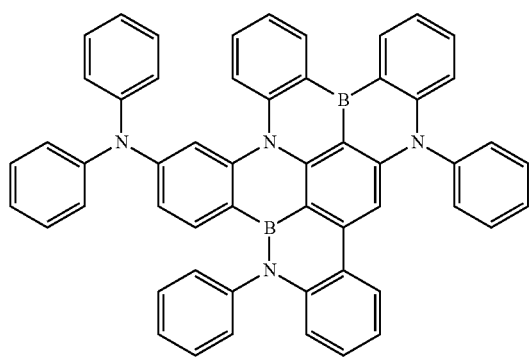
36
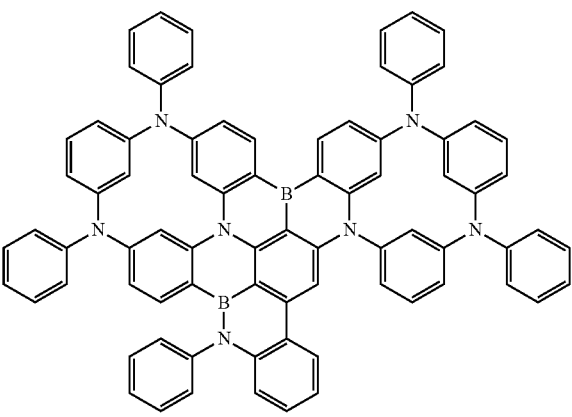
37
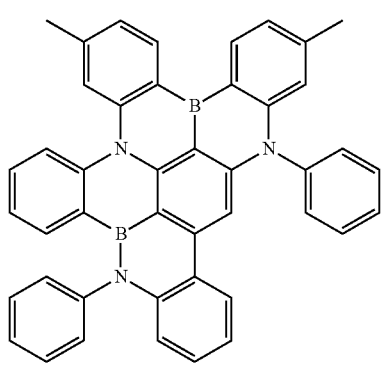
38
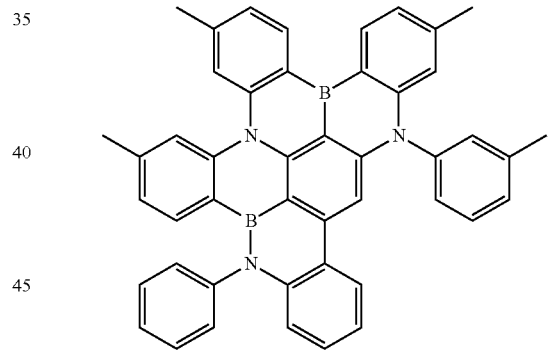
39
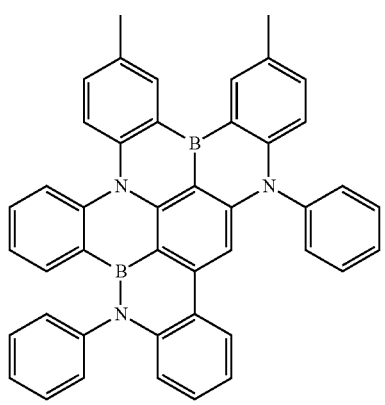

40
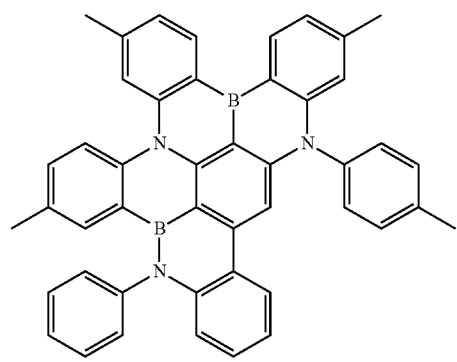
41
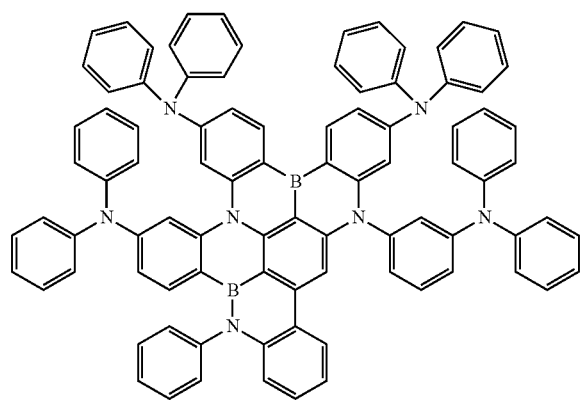
42
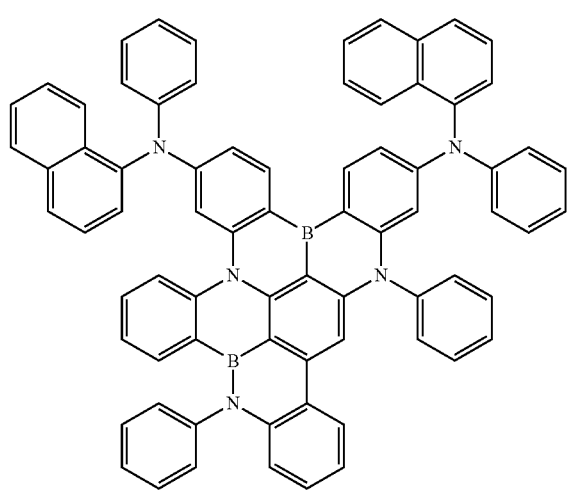
43
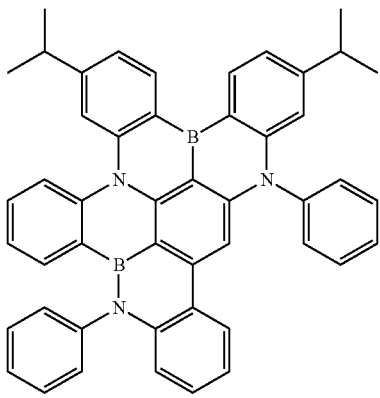
44
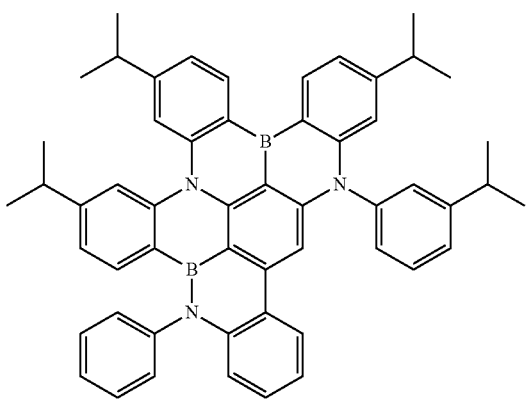
45
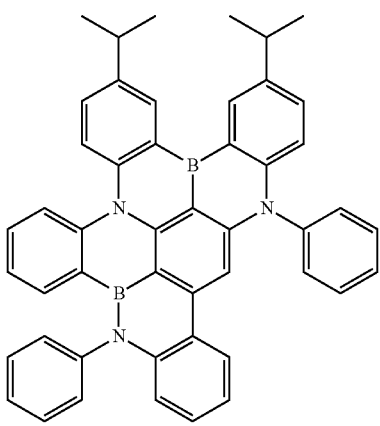
46
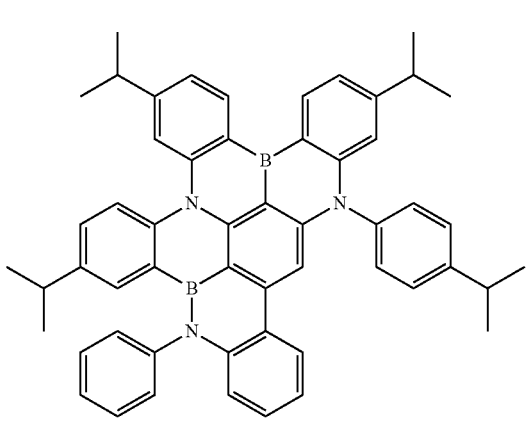

-continued
47
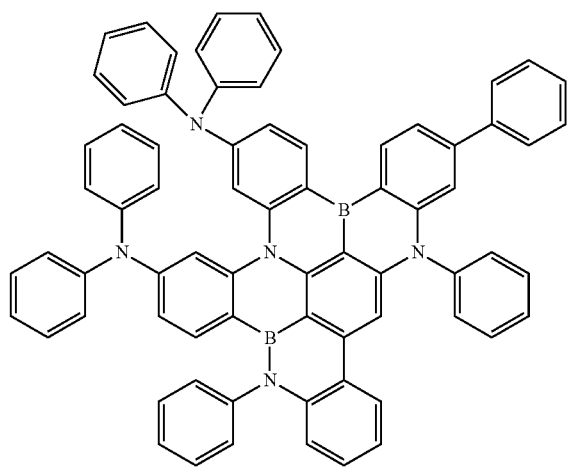
48
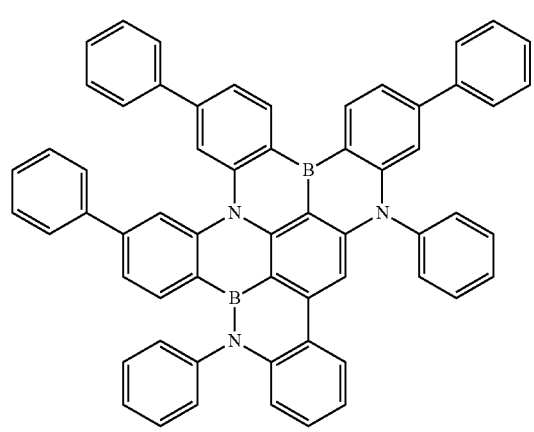
49
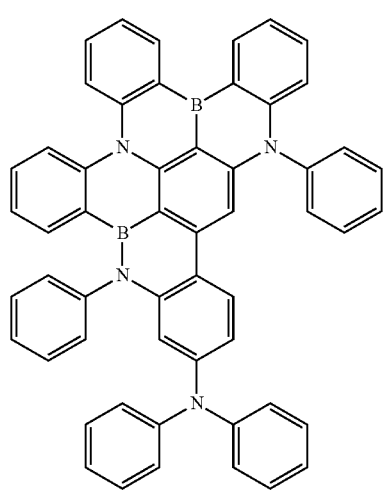
-continued
50
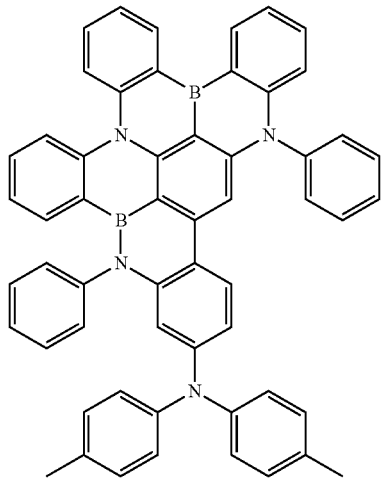
51
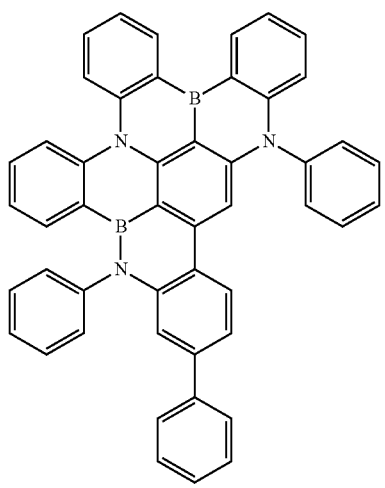
52
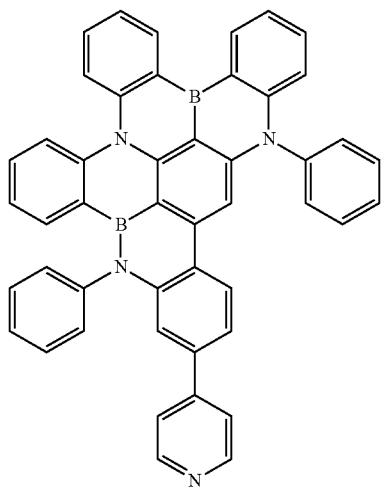

53
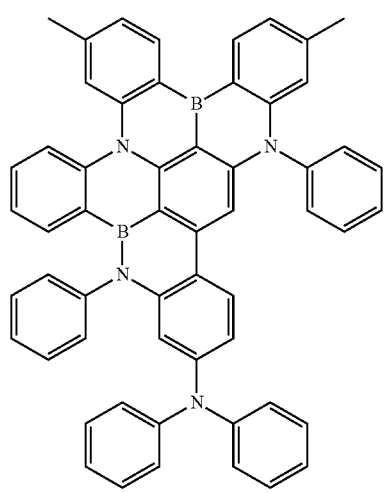
54
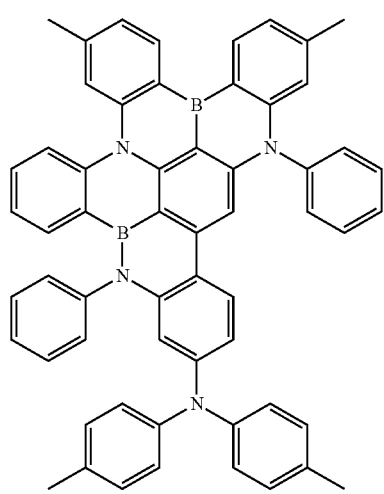
55
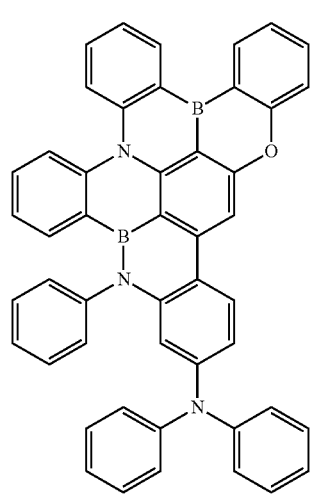
56
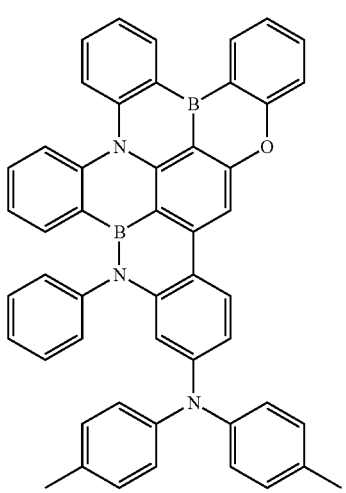
57
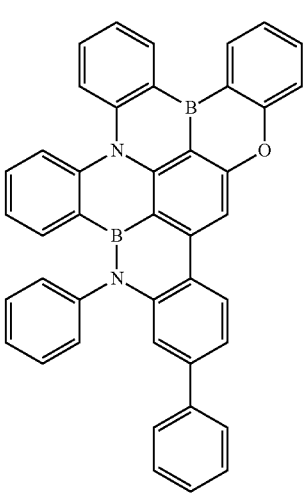
58
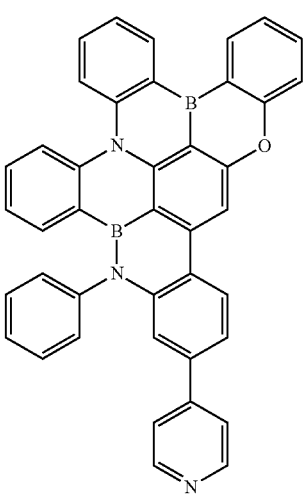

59
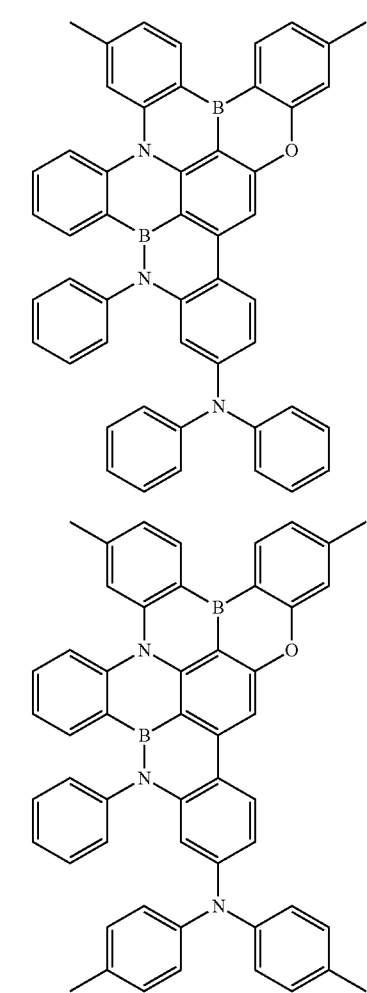
60
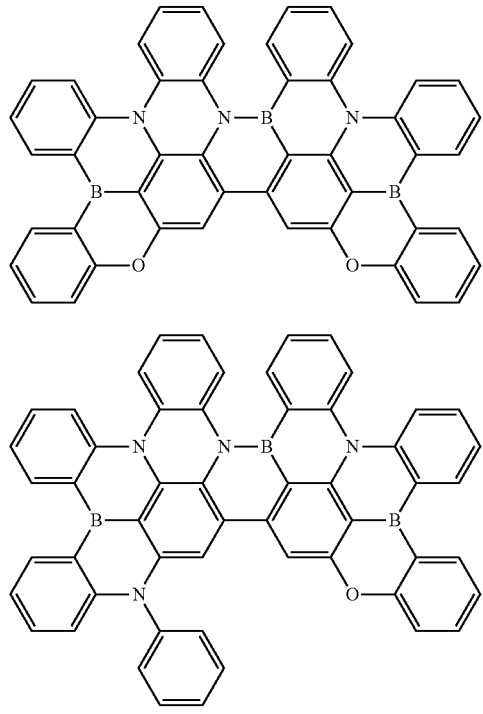
61
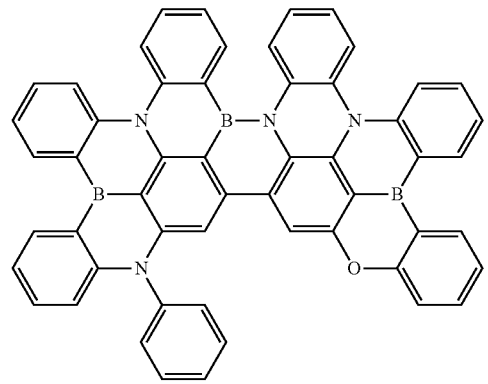
62
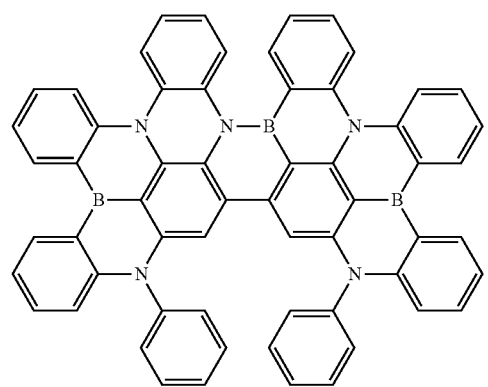
63
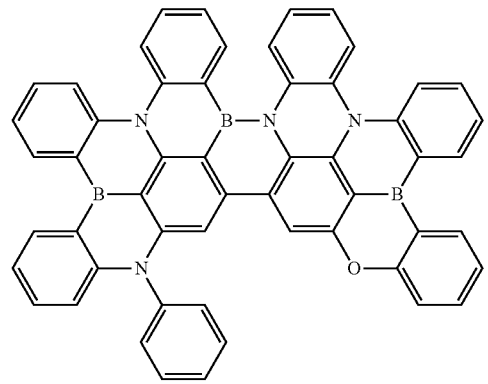
64
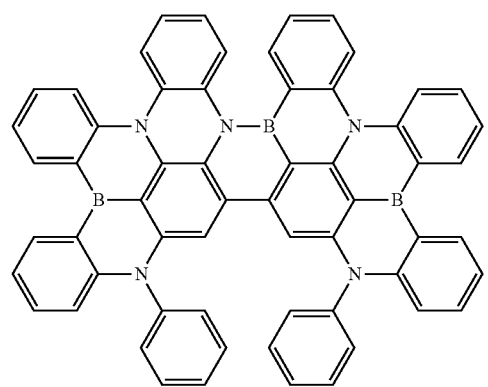
65
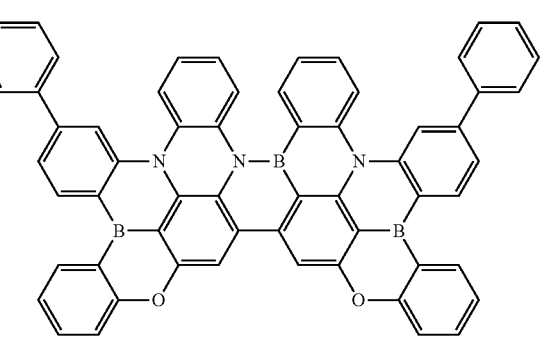
66
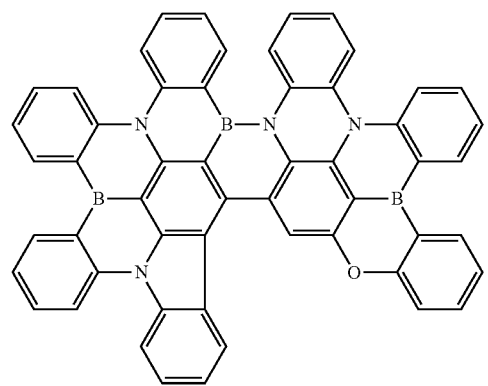

67
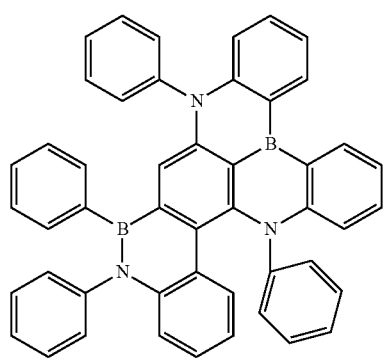
68
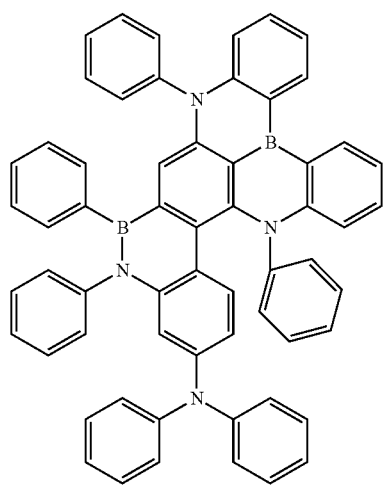
69
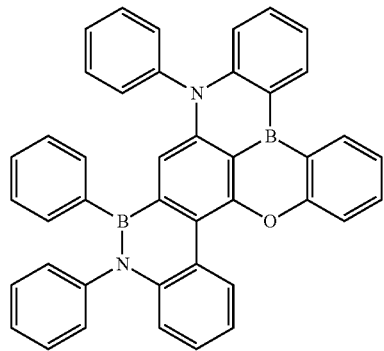
70
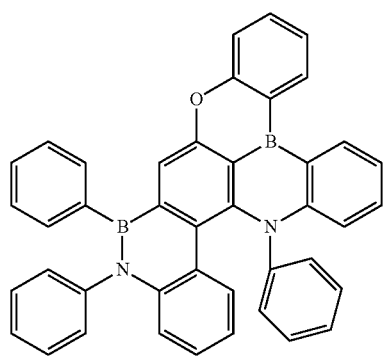
71
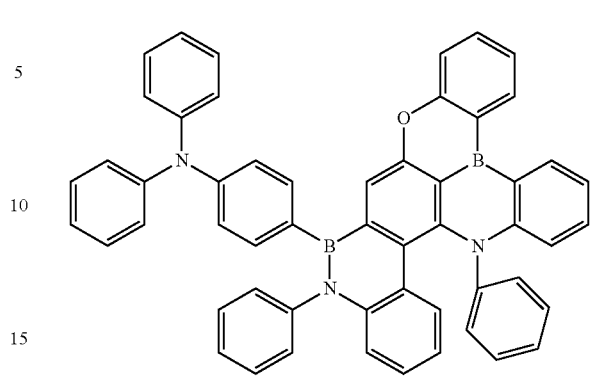
72
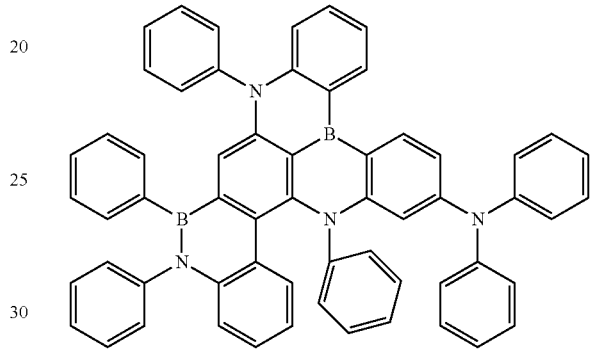
73
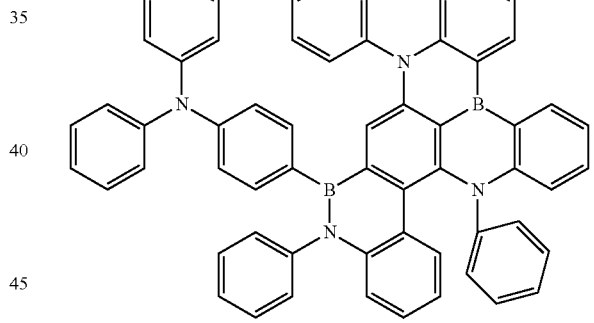
74
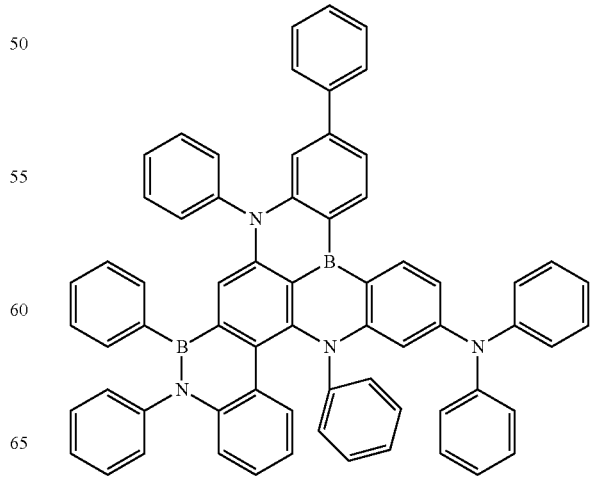

75

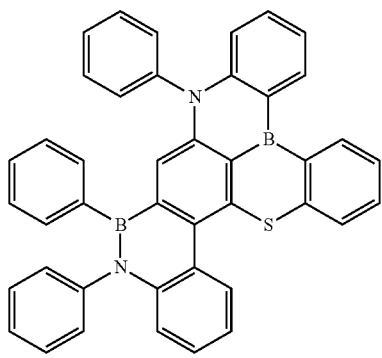

76

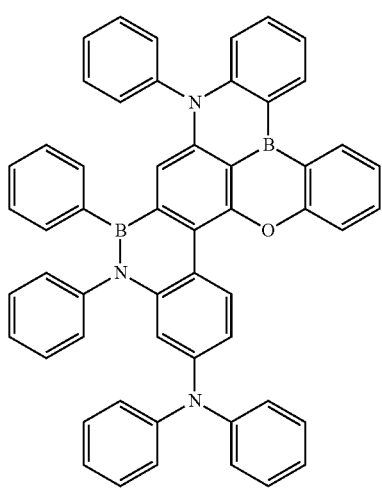

77

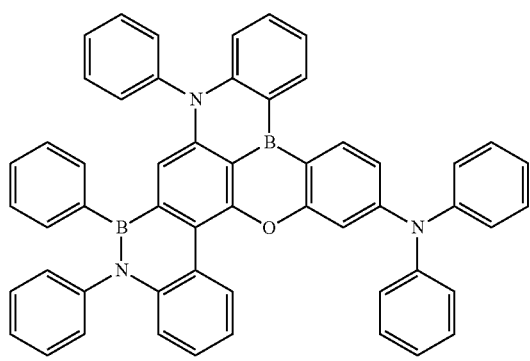

78

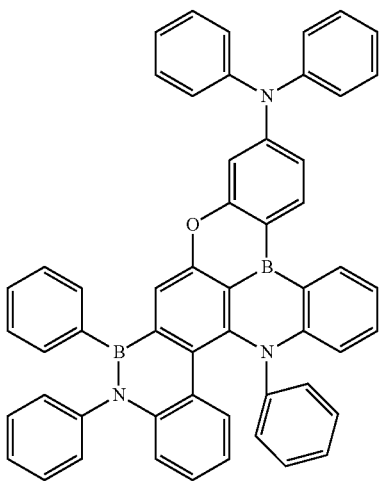

Meanwhile, in the polycyclic compound of an embodiment, at least one among hydrogen atoms may be substituted with a deuterium atom. That is, an optional hydrogen atom in one molecule of the polycyclic compound according to an embodiment may be substituted with a deuterium atom.

For example, the polycyclic compound of an embodiment may include Compound 21-D shown below, which corresponds to Compound 21 in Compound Group 1, where hydrogen atoms are partially substituted with deuterium atoms.

21-D

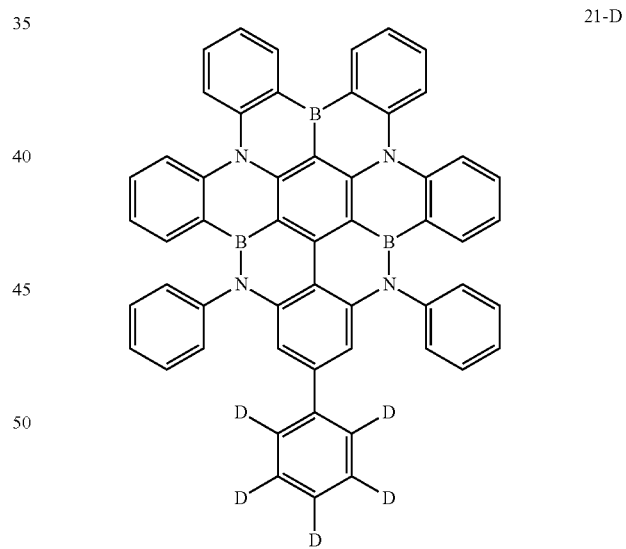

Compound 21-D is an illustration, and in the polycyclic compound according to an embodiment, represented in Compound Group 1, an optional hydrogen atom in a molecule may be substituted with a deuterium atom.

The polycyclic compound of an embodiment may be used as a blue emission material. For example, the polycyclic compound of according to an embodiment may be used as a light-emitting material emitting blue light having a light-emitting central wavelength (λmax) in a wavelength region of about 470 nm or less. For example, the polycyclic compound of an embodiment may be a light-emitting material having a light-emitting central wavelength in a wavelength region of about 430 nm to about 470 nm. The polycyclic compound of an embodiment, represented by Formula 1 may be a blue thermally activated delayed fluorescence dopant.

The polycyclic compound of an embodiment may be a material for emitting thermally activated delayed fluorescence. The polycyclic compound of an embodiment is provided with aromatic rings linked to each other by a B—N bond and may maintain a stable molecular structure and show a narrow full width at half maximum during emitting light. That is, the organic electroluminescence device of an embodiment includes the polycyclic compound of an embodiment in an emission layer and may show long-life characteristics and excellent color reproducibility.

In the organic electroluminescent device 10 of an embodiment, the emission layer EML may emit delayed fluorescence. For example, the emission layer EML may emit thermally activated delayed fluorescence (TADF).

Meanwhile, though not shown in the drawings, the organic electroluminescence device 10 of an embodiment may include a plurality of emission layers. The plurality of emission layers may be laminated one by one and provided. For example, the organic electroluminescence device 10 including a plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the polycyclic compound of an embodiment.

In an embodiment, the emission layer EML includes a host and a dopant and may include the polycyclic compound of an embodiment as a dopant. For example, in the organic electroluminescence device 10 of an embodiment, the emission layer EML may include a host for emitting delayed fluorescence and a dopant for emitting delayed fluorescence and may include the polycyclic compound as a dopant for emitting delayed fluorescence. The emission layer EML may include at least one among the polycyclic compounds as a thermally activated delayed fluorescence dopant.

In an embodiment, the emission layer EML may be a delayed fluorescence emission layer, and the emission layer EML may include a known host material and the above-described polycyclic compound. For example, in an embodiment, the polycyclic compound may be used as a TADF dopant.

Meanwhile, in an embodiment, the emission layer EML may include a known host material. For example, in an embodiment, the emission layer EML may include as a host material, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), bis2-(diphenylphosphino)phenylether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzob,dfuran (PPF), 3,3'-bis(N-carbazolyl)-1,1'-biphenyl (mCBP), 1,3-bis(N-carbazolyl)benzene (mCP), etc. However, an embodiment of the inventive concept is not limited thereto. Any known host materials for emitting delayed fluorescence other than the suggested host materials may be included.

Meanwhile, in the organic electroluminescence device 10 of an embodiment, the emission layer EML may further include a known dopant material. In an embodiment, the emission layer EML may include as a dopant, styryl derivatives (for example, 1,4-bis2-(3-N-ethylcarbazolyl)vinylbenzene (BCzVB), 4-(di-p-tolylamino)-4'-(di-p-tolylamino) styrylstilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

In the organic electroluminescence device 10 of an embodiment, as shown in FIGS. 1 to 4, the electron transport region ETR is provided on the emission layer EML. The electron transport region ETR may include at least one of an hole blocking layer HBL, an electron transport layer ETL or an electron injection layer EIL. However, an embodiment of the inventive concept is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri(3-pyridyl)-phen-3-ylbenzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzoimidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2), 9,10-di(naphthalen-2-yl)anthracene (ADN), 1,3-bis3,5-di(pyridine-3-yl)phenylbenzene (BmPyPhB), or a mixture thereof, without limitation. The thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include, a metal halide such as LiF, NaCl, CsF, RbCl and RbI, a metal in lanthanoides such as Yb, a metal oxide such as $Li_2O$ and BaO, or lithium quinolate (LiQ). However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Though not shown, the second electrode EL2 may be connected with an auxiliary electrode. If the second electrode EL2 is connected with the auxiliary electrode, the resistance of the second electrode EL2 may decrease.

Meanwhile, on the second electrode EL2 of the organic electroluminescence device 10 of an embodiment, a capping layer CPL may be further disposed. The capping layer CPL may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazole-9-yl) triphenylamine (TCTA), N,N'-bis(naphthalen-1-yl), etc.

The organic electroluminescence device 10 according to an embodiment of the inventive concept includes the polycyclic compound of an embodiment in the emission layer EML disposed between the first electrode EL1 and the second electrode EL2, thereby showing excellent emission efficiency and a narrow full width at half maximum in a light-emitting wavelength region of blue light. In addition, the polycyclic compound according to an embodiment may emit thermally activated delayed fluorescence, and the emission layer EML may include the polycyclic compound of an embodiment to emit thermally activated delayed fluorescence and show high emission efficiency properties.

Meanwhile, the compound of an embodiment may be included in an organic layer other than the emission layer EML as a material for the organic electroluminescence device 10. For example, the organic electroluminescence device 10 according to an embodiment of the inventive concept may include the compound in at least one functional layer disposed between the first electrode EL1 and the second electrode EL2, or in the capping layer (CPL) disposed on the second electrode EL2.

The polycyclic compound of an embodiment has a combined structure by connecting aromatic rings including a B—N direct linkage moiety, and at least one B which is not directly linked with N as ring-forming heteroatom, and shows a high lowest triplet excitation energy level, and accordingly, may be used as a material for emitting delayed fluorescence. In addition, the organic electroluminescence device of an embodiment, including the polycyclic compound of an embodiment in an emission layer may emit blue light having a narrow full width at half maximum and show long-life characteristics.

Hereinafter, the polycyclic compound according to an embodiment and the organic electroluminescence device of an embodiment of the inventive concept will be particularly explained referring to embodiments and comparative embodiments. The following embodiments are only illustrations to assist the understanding of the inventive concept, and the scope of the inventive concept is not limited thereto.

EXAMPLES

1. Synthesis of Polycyclic Compound of an Embodiment

First, the synthetic method of the polycyclic compound according to an embodiment will be particularly explained referring to the synthetic method of Compound 1. In addition, the synthetic methods of the polycyclic compounds explained below are only embodiments, and the synthetic method of the polycyclic compound according to an embodiment of the inventive concept is not limited thereto.

(1) Synthesis of Compound 1

Compound 1 according to an embodiment may be synthesized, for example, by the steps of Reaction 1 below.

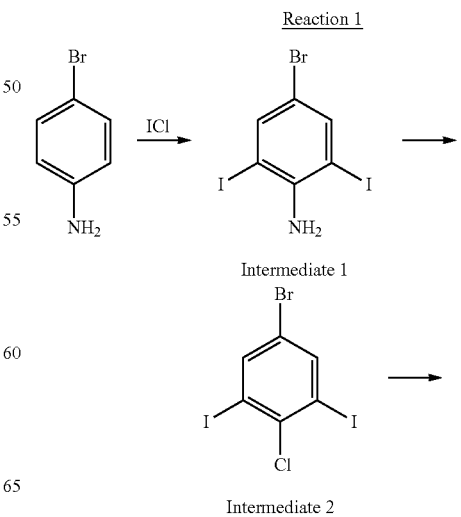

-continued

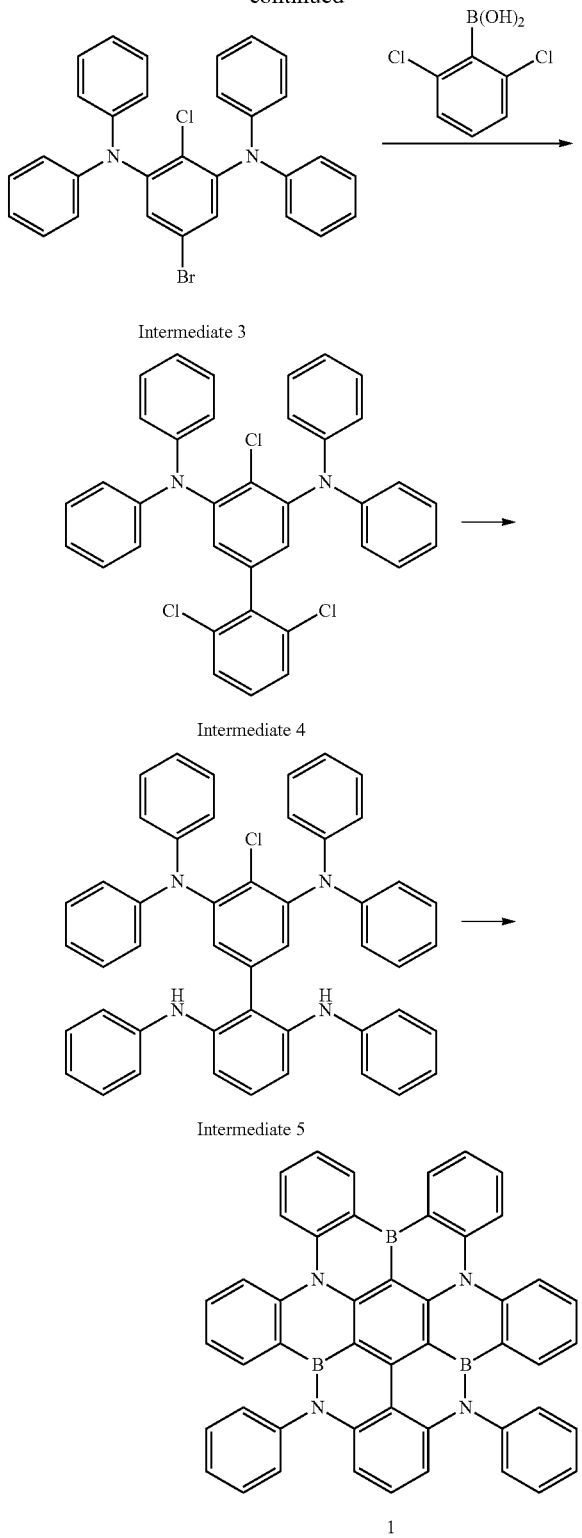

Intermediate 3

Intermediate 4

Intermediate 5

1

3-bromoaniline (28.4 g), and methanol (800 ml) including iodine monochloride (75 g) were stirred at room temperature for about 8 hours. The reaction solution was poured into water, and a target material was extracted with dichloromethane, dried with magnesium sulfate and concentrated under a reduced pressure. Then, the mixture thus obtained was separated by silica gel chromatography to obtain 31.0 g (yield 44%) of Intermediate 1.

Then, to Intermediate 1 (31 g) obtained in the above step, 6 N hydrochloric acid (300 ml) was added and then stirred. Then, at 0° C., stirring was performed for about 1 hour while adding an aqueous solution (20 ml) including sodium nitride (7.3 g) dropwise, and then, copper chloride (10.5 g) was added thereto. After that, the temperature of the reaction solution was elevated to room temperature and stirring was performed for about 1 hour. Stirring was performed again at about 60° C. for about 30 minutes. Then, the reaction solution was cooled to room temperature, and a target material was extracted with dichloromethane. An organic layer was washed with sodium bicarbonate, dried with magnesium sulfate, and concentrated under a reduced pressure. The mixture thus obtained was separated by silica gel chromatography to obtain 29.6 g (yield 94%) of Intermediate 2.

Then, a toluene (70 ml) solution including Intermediate 2 (6 g), diphenylamine (4.8 g), sodium butoxide (3.9 g), Pd$_2$(dba)$_3$ (0.25 g), and XantPhos (0.3 g) was heated and refluxed under heating conditions in an oil bath for about 15 hours. Then, the reaction solution was cooled to room temperature and then, poured into water. A target material was extracted with toluene, dried with magnesium sulfate and concentrated under a reduced pressure. The mixture thus obtained was separated by silica gel chromatography to obtain 2.3 g (yield 32%) of Intermediate 3.

A mixture of toluene (20 ml), ethanol (10 ml) and water (10 ml) solution including Intermediate 3 (2.3 g), 2,6-dichlorophenylboronic acid (1.3 g), potassium phosphate (3 g), and PdCl$_2$(dppf) (65 mg) was heated and refluxed for about 3 hours under heating conditions in an oil bath. The reaction solution was cooled to room temperature and then, poured into water. A target material was extracted with toluene, dried with magnesium sulfate and concentrated under a reduced pressure. The mixture thus obtained was separated by silica gel chromatography to obtain 2.4 g (yield 90%) of Intermediate 4.

A toluene (100 ml) solution including Intermediate 4 (2.4 g) obtained in the above step, aniline (1.1 g), sodium butoxide (4 g), Pd$_2$(dba)$_3$ (0.3 g), and PH(tBu)$_3$/BF$_4$ (0.4 g) was heated and refluxed under heating conditions in an oil bath for about 4 hours. Then, the reaction solution was cooled to room temperature and then, poured into water. A target material was extracted with ethyl acetate, dried with magnesium sulfate and concentrated under a reduced pressure. The mixture thus obtained was separated by silica gel chromatography to obtain 2 g (yield 70%) of Intermediate 5.

A t-butylbenzene (60 ml) solution including Intermediate 5 (2 g) obtained in the above step was cooled to about −78° C. A t-BuLi/pentane solution (7 ml) was added thereto, followed by stirring at about 60° C. for about 1 hour. Then, the reaction solution was cooled to about −35° C., and a heptane solution (11 ml) of 1 M BBr$_3$ was added thereto dropwise, followed by stirring at room temperature for about 3 hours. The solution was cooled again to about −40° C., and diisopropylethylamine (2.5 ml) was added thereto dropwise, followed by heating and stirring at about 165° C. for about 8 hours. A target material was extracted with ethyl acetate, dried with magnesium sulfate and concentrated under a reduced pressure. The mixture thus obtained was separated by silica gel chromatography to obtain 0.6 g (yield 30%) of Compound 1 as a target material. In addition, by FAB-MS measurement, the molecular weight of the target material was found 694. The target material thus obtained was purified again by sublimation and used as a specimen for evaluation.

(2) Synthesis of Compound 20

Compound 20 according to an embodiment may be synthesized, for example, by the steps described in the following Reaction 2:

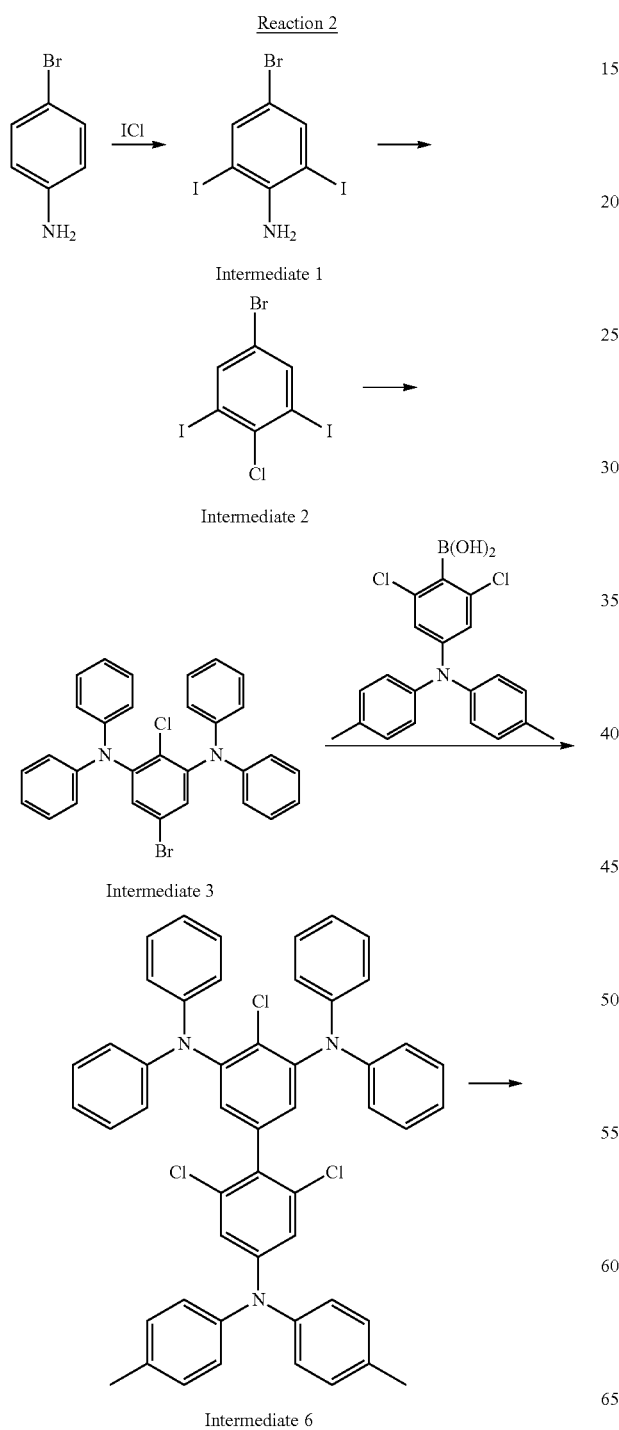

Reaction 2

Intermediate 1

Intermediate 2

Intermediate 3

Intermediate 6

Intermediate 7

20

The synthesis of Compound 20 was performed by the same steps in the synthetic method of Compound 1 except for using (2,6-dichloro-4-(di-p-tolylamino)-phenyl)boronic acid instead of 2,6-dichlorophenylboronic acid (1.3 g) added to Intermediate 3 in the synthetic method of Compound 1. By FAB-MS measurement, the molecular weight of a target material was found 889. The target material thus obtained was purified again by sublimation and used as a specimen for evaluation.

(3) Synthesis of Compound 55

Compound 55 according to an embodiment may be synthesized, for example, by the steps described in the following Reaction 3:

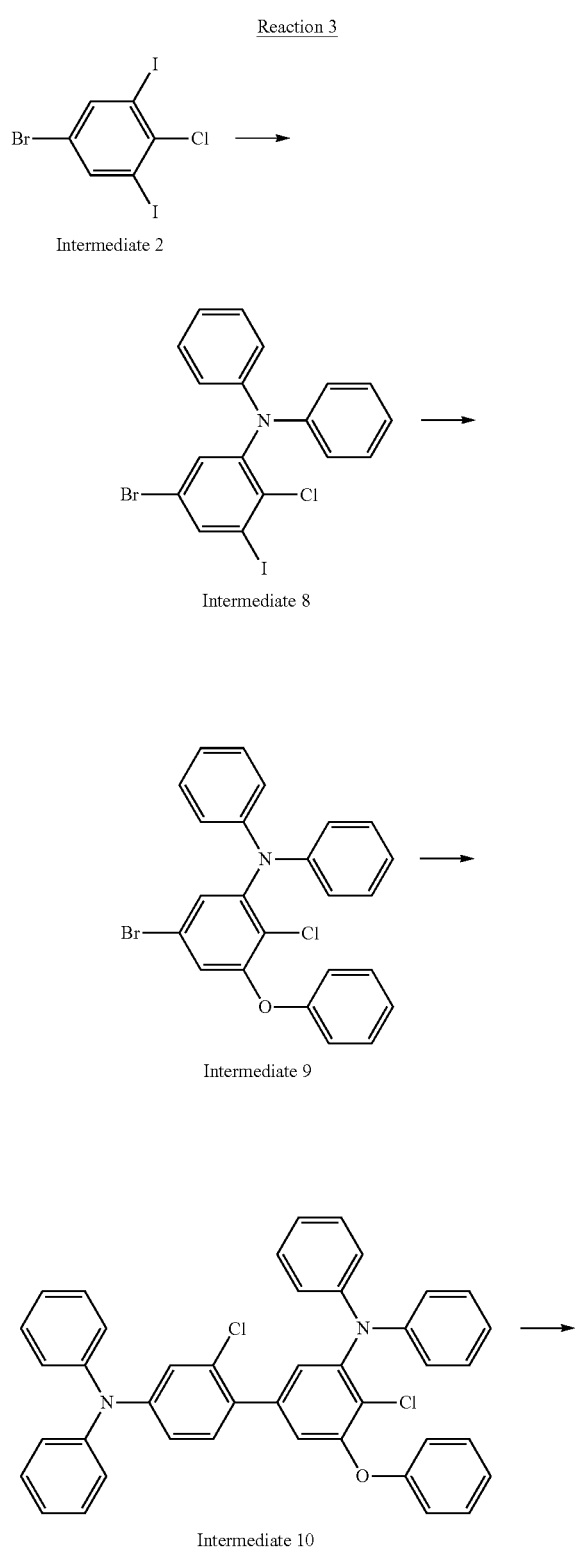

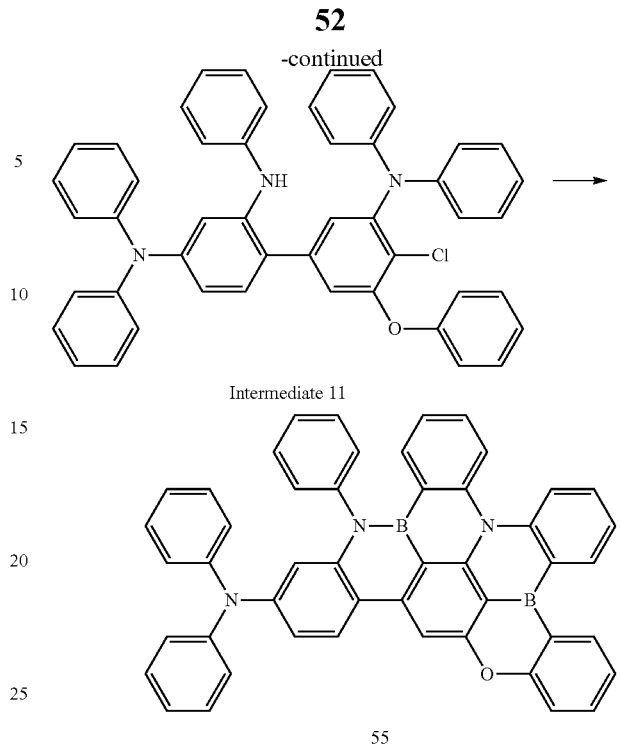

A toluene (70 ml) solution including Intermediate 2 (6 g), diphenylamine (2.4 g), sodium butoxide (2.0 g), $Pd_2(dba)_3$ (0.13 g), and XantPhos (0.15 g) was heated and refluxed under heating conditions in an oil bath for about 15 hours. The reaction solution was cooled to room temperature and then, poured into water. A target material was extracted with toluene, dried with magnesium sulfate and concentrated under a reduced pressure. The mixture thus obtained was separated by silica gel chromatography to obtain 4.6 g (yield 70%) of Intermediate 8.

A dioxane (15 ml) solution including Intermediate 8 (4.6 g) obtained in the above step, phenol (1.3 g), CuI (63 mg), $Cs_2CO_3$ (6.2 g) and N,N-dimethylglycine (0.3 g) was heated and refluxed under heating conditions in an oil bath for about 15 hours. The reaction solution was cooled to room temperature and then, poured into water. A target material was extracted with ethyl acetate, dried with magnesium sulfate and concentrated under a reduced pressure. The mixture thus obtained was separated by silica gel chromatography to obtain 2.8 g (yield 65%) of Intermediate 9.

A toluene (20 ml), ethanol (10 ml) and water (10 ml) solution including Intermediate 9 (2.8 g) obtained in the above step, 2-chloro-4-(diphenylamino)phenylboronic acid (3.0 g), potassium phosphate (2.6 g), and $PdCl_2(dppf)$ (60 mg) was heated and refluxed for about 5 hours under heating conditions in an oil bath. The reaction solution was cooled to room temperature and then, poured into water. A target material was extracted with toluene, dried with magnesium sulfate and concentrated under a reduced pressure. The mixture thus obtained was separated by silica gel chromatography to obtain 3.6 g (yield 89%) of Intermediate 10.

A toluene (40 ml) solution including Intermediate 10 (3.6 g) obtained in the above step, aniline (0.8 g), sodium butoxide (1.1 g), $Pd_2(dba)_3$ (0.2 g), and $PH(tBu)_3/BF_4$ (0.3 g) was heated and refluxed under heating conditions in an oil bath for about 4 hours. The reaction solution was cooled to room temperature and then, poured into water. A target material was extracted with ethyl acetate, dried with magnesium sulfate and concentrated under a reduced pressure. The mixture thus obtained was separated by silica gel chromatography to obtain 2.9 g (yield 75%) of Intermediate 11.

A t-butylbenzene (60 ml) solution including Intermediate 11 (2.9 g) obtained in the above step was cooled to about −78° C. A t-BuLi/pentane solution (ca. 1.9 mol/L, 5 ml) was added thereto, followed by stirring at about 60° C. for about 1 hour. Then, the reaction solution was cooled to about −35° C., and a heptane solution (10 ml) of 1 M BBr$_3$ was added thereto dropwise, followed by stirring at room temperature for about 3 hours. The solution was cooled again to about −40° C., and diisopropylethylamine (2.5 ml) was added thereto dropwise, followed by heating and stirring at about 165° C. for about 8 hours. The reaction mixture was cooled back to room temperature and then, poured into soda water. A target material was extracted with ethyl acetate, dried with magnesium sulfate and concentrated under a reduced pressure. The mixture thus obtained was separated by silica gel chromatography to obtain 0.7 g (yield 25%) of Compound 55 as a target material. In addition, by FAB-MS measurement, the molecular weight of the target material was found 687. The target material thus obtained was purified again by sublimation and used as a specimen for evaluation.

2. Manufacture and Evaluation of Organic Electroluminescence Device

Evaluation on the emission properties of a polycyclic compound, and the organic electroluminescence device of an embodiment including the polycyclic compound of an embodiment in an emission layer, was conducted by methods described below. The manufacturing method of an organic electroluminescence device for device evaluation is described below.

Organic electroluminescence devices of Example 1 to Example 3 were manufactured using the polycyclic compounds of Compounds 1, 20 and 55 as dopant materials for an emission layer, respectively. The organic electroluminescence devices of Comparative Example 1 to Comparative Example 3 were manufactured using Comparative Compounds C1, C2 and C3 as dopant materials of an emission layer, respectively.

The compounds used in Example 1 to Example 3, and Comparative Example 1 to Comparative Example 3 are shown in Table 1 below.

TABLE 1

Compound 1

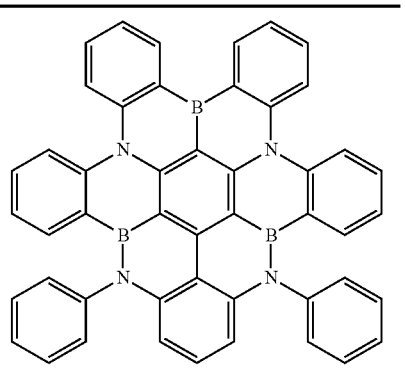

TABLE 1-continued

Compound 20

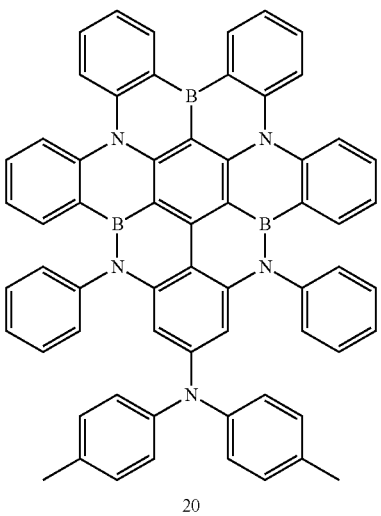 [SMILES: Cc1ccc(N(c2ccc(C)cc2)c2cc3c4c(c2)N(c2ccccc2)B2c5ccccc5N5c6ccccc6B6c7ccccc7N7c8ccccc8B(c8c-4c2c5c6c87)N3c2ccccc2)cc1]

Compound 55

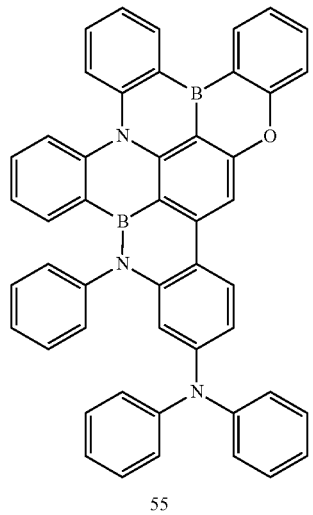 [SMILES: c1ccc(N2B3c4ccccc4N4c5ccccc5B5c6ccccc6Oc6cc(c3c4c65)-c3ccc(N(c4ccccc4)c4ccccc4)cc32)cc1]

Comparative Compound C1

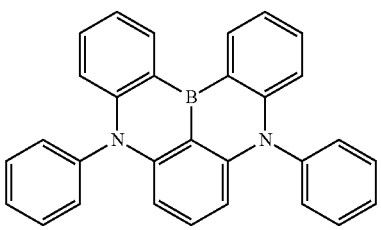

TABLE 1-continued

Comparative
Compound C2

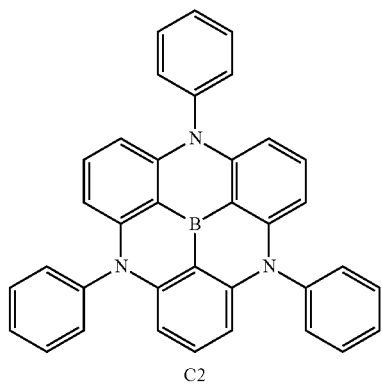

C2

Comparative
Compound C3

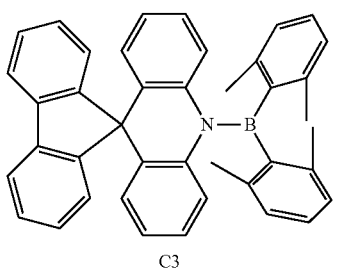

C3

Manufacture of Organic Electroluminescence Device

On a glass substrate, ITO with a thickness of about 1,500 Å was patterned and washed with ultra-pure water, cleaned with ultrasonic waves, exposed to UV for about 30 minutes and treated with ozone. Then, HAT-CN was deposited to a thickness of about 100 Å, α-NPD was deposited to about 800 Å, and mCP was deposited to a thickness of about 50 Å to form a hole transport region.

Then, the polycyclic compound of an embodiment or the Comparative Compound and a host material were co-deposited in a ratio of 6:94 to form a layer into a thickness of about 200 Å to form an emission layer. That is, the emission layer formed by the co-deposition was conducted by mixing Compound 1, 20 and 55 with a host material and depositing in Example 1 to Example 3, respectively, or by mixing Comparative Compounds C1, C2 and C3 with a host material and depositing in Comparative Example 1 to Comparative Example 3, respectively. During forming the emission layer, mCP was used as the host material.

After that, on the emission layer, a layer with a thickness of about 100 Å was formed using DPEPO, a layer with a thickness of about 300 Å using TPBi, and a layer with a thickness of about 50 Å was formed using Liq to form an electron transport region. Then, a second electrode with a thickness of about 1,000 Å was formed using aluminum (Al).

The hole transport region, the emission layer, the electron transport region, and the second electrode were formed using a vacuum deposition apparatus.

Evaluation of Properties of Organic Electroluminescence Device

In Table 2, the evaluation results on the organic electroluminescence devices of Example 1 to Example 3, and Comparative Example 1 to Comparative Example 3 are shown. In Table 2, the maximum light-emitting wavelength ($\lambda_{max}$), the full width at half maximum (FWHM) in a light-emitting wavelength region, emission efficiency and device life of the organic electroluminescence devices thus manufactured are compared and are shown. In the evaluation results of the properties on the Examples and the Comparative Examples shown in Table 2, the maximum light-emitting wavelength ($\lambda_{max}$) represents a wavelength showing the maximum value in emission spectrum, and the emission efficiency represents where luminance of 100 cd/m² is shown. In addition, the device life is represented by a relative value if the device life of Comparative Example 1 is set to 100%.

TABLE 2

| Division | Dopant material | $\lambda_{max}$ (nm) | Full width at half maximum | Emission efficiency | Device life |
|---|---|---|---|---|---|
| Example 1 | Compound 1 | 469 nm | 23 nm | 15.5% | 165% |
| Example 2 | Compound 20 | 465 nm | 28 nm | 17.8% | 158% |
| Example 3 | Compound 55 | 462 nm | 26 nm | 21.5% | 135% |
| Comparative Example 1 | Comparative Compound C1 | 459 nm | 30 nm | 5% | 100% |
| Comparative Example 2 | Comparative Compound C2 | 446 nm | 23 nm | 8% | 105% |
| Comparative Example 3 | Comparative Compound C3 | 538 nm | 63 nm | 18.5% | 130% |

Referring to the results of Table 21, it was confirmed that the organic electroluminescence devices of Example 1 to Example 3 emitted light in a blue wavelength region of about 470 nm or less and light having a narrow full width at half maximum of less than about 30 nm. In addition, the organic electroluminescence devices of Example 1 to Example 3, including the polycyclic compound according to an embodiment showed excellent emission efficiency properties and excellent device life characteristics.

In comparison, Comparative Example 1 showed a full width at half maximum of about 30 nm and emitted light in a blue wavelength region, but lower emission efficiency and device life characteristics when compared with the Examples. In Comparative Example 2, a crosslinked structure was shown via the combination of aromatic rings from each other to show emission properties having a relatively narrow full width at half maximum, but device life was better for the Examples. In addition, Comparative Example 3 used Comparative Compound C3 which was a polycyclic compound having a structure including a B—N direct linkage, but different from the Examples, had a structure excluding an additional B atom, and light in a longer wavelength region than the Examples in a light-emitting wavelength region was emitted, and the full width at half maximum was shown large.

The polycyclic compound of an embodiment includes a B—N direct linkage moiety and has a combined structure of aromatic rings from each other, which include at least one B atom which is not directly combined with an N atom. Accordingly, a molecular structure is stabilized even in an excited state, and emission properties having a narrow full width at half maximum may be shown, and the long-life characteristics of a device may be achieved. In addition, the organic electroluminescence device of an embodiment includes the polycyclic compound of an embodiment in an emission layer, and a narrow full width at half maximum is shown in an light-emitting wavelength region to show excellent color properties and improved life characteristics.

The organic electroluminescence device of an embodiment may show device properties with improved life characteristics.

In addition, the organic electroluminescence device of an embodiment may emit blue light having a narrow full width at half maximum.

The polycyclic compound of an embodiment is included in an emission layer of an organic electroluminescence device and may contribute to the increase of the life of the organic electroluminescence device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic electroluminescence device, comprising:
   a first electrode;
   a second electrode disposed on the first electrode; and
   an emission layer disposed between the first electrode and the second electrode and comprising a polycyclic compound,
   wherein the polycyclic compound comprises:
   a boranamine derivative;
   a first ring and a second ring, each directly linked to a boron atom of the boranamine derivative;
   a third ring and a fourth ring, each directly linked to a nitrogen atom of the boranamine derivative; and
   at least one substituted or unsubstituted boryl group, linked to at least one ring among the first to fourth rings,
   wherein at least two adjacent rings of the first to fourth rings are linked to each other via a linker, or linked to an adjacent substituent to form an azaborinine moiety,
   wherein the first electrode and the second electrode each independently comprise at least one of Ag, Mg, Cu, Al, Pt, Pd, Au, Ni, Nd, Ir, Cr, Li, Ca, LiF/Ca, LiF/Al, Mo, Ti, In, Sn, Zn, a compound comprising two or more of the foregoing, an oxide thereof, or a combination thereof.

2. The organic electroluminescence device of claim 1, wherein the polycyclic compound is represented by Formula 1:

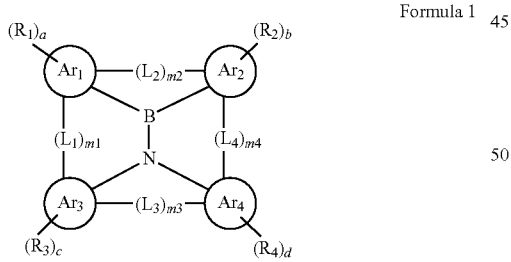

Formula 1 wherein in Formula 1,

Ar$_1$ to Ar$_4$ are each independently a substituted or unsubstituted aryl group of 6 to 30 carbon atoms for forming a ring, or a substituted or unsubstituted heteroaryl group of 2 to 30 carbon atoms for forming a ring, a to d are each independently an integer of 0 to 4, wherein at least one of a to d is an integer of 1 or more, m1 to m4 are each independently 0 or 1, L$_1$ to L$_4$ are each independently a direct linkage, *—O—*, *—S—*, *—C(=O)—*, *—SO$_2$—*, or *—NRa—*, R$_1$ to R$_4$, and Ra are each independently a hydrogen atom, a deuterium atom, a halogen atom, a cyano group, a nitro group, a substituted or unsubstituted amine group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, R$_1$ to R$_4$, and Ra are each independently optionally linked with an adjacent group to form a ring, and when at least one among a to d is an integer of 1 or more, then at least one among R$_1$ to R$_4$ is a substituted or unsubstituted boryl group, and wherein at least two adjacent rings of the Ar$_1$ to A$_4$ rings are linked to each other via the linker, or linked to an adjacent substituent to form the azaborinine moiety.

3. The organic electroluminescence device of claim 2, wherein Formula 1 is represented by any one among Formula 1A to Formula 1C:

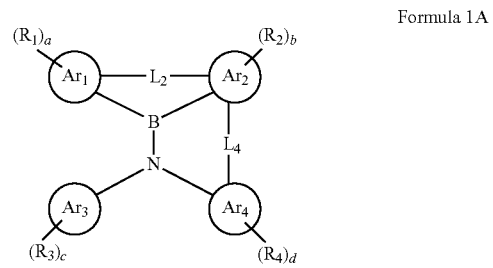

Formula 1A

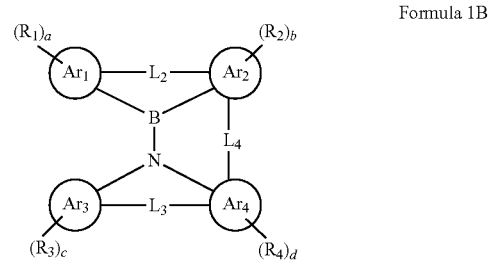

Formula 1B

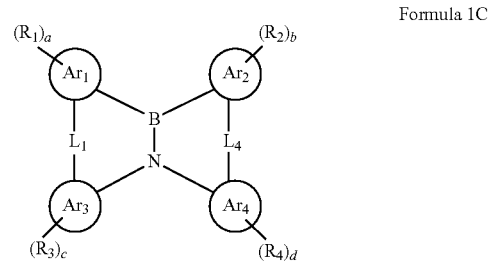

Formula 1C wherein in Formula 1A to Formula 1C,
Ar$_1$ to Ar$_4$, a to d, L$_1$ to L$_4$, and R$_1$ to R$_4$ are the same as defined in Formula 1.

4. The organic electroluminescence device of claim 2, wherein Formula 1 is represented by Formula 1D:

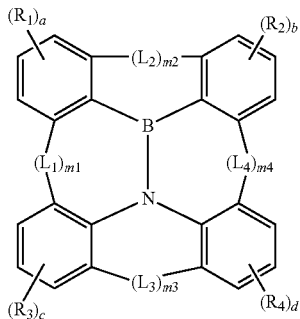

Formula 1D in Formula 1D, a to d, m1 to m4, $L_1$ to $L_4$, and $R_1$ to $R_4$ are the same as defined in Formula 1.

5. The organic electroluminescence device of claim 2, wherein Formula 1 is represented by any one among Formula 1-1 to Formula 1-4:

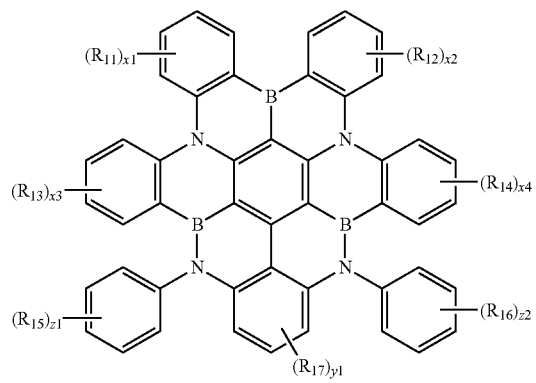

Formula 1-1

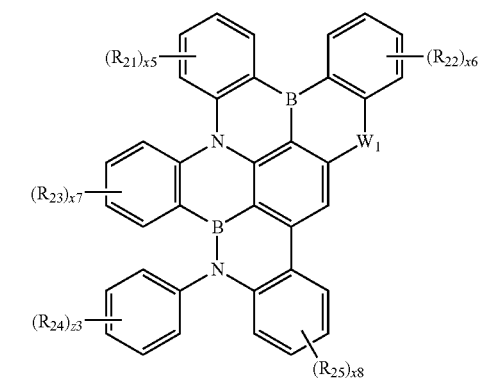

Formula 1-2

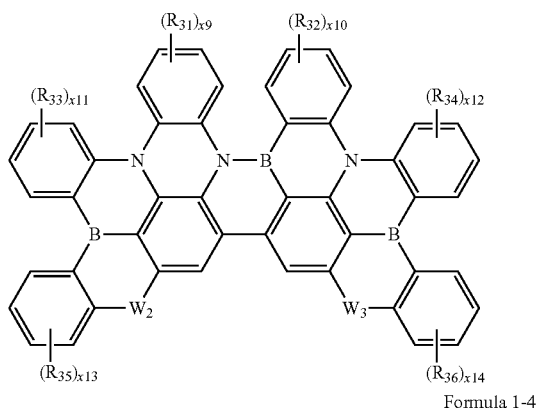

Formula 1-3

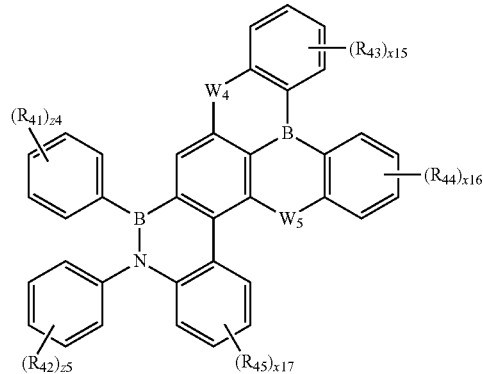

Formula 1-4 in Formula 1-1, $y_1$ is an integer of 0 to 3,
in Formula 1-1 to Formula 1-4,
$R_{11}$ to $R_{17}$, $R_{21}$ to $R_{25}$, $R_{31}$ to $R_{36}$, and $R_{41}$ to $R_{45}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{11}$ to $R_{17}$, $R_{21}$ to $R_{25}$, $R_{31}$ to $R_{36}$, and $R_{41}$ to $R_{45}$ are each independently optionally linked with an adjacent group to form a ring,
x11 to x17 are each independently an integer of 0 to 4,
z1 to z5 are each independently an integer of 0 to 5,
$W_1$ to $W_5$ are each independently a direct linkage, *—O—*, or *—NRa—*, and
Ra is the same as defined in Formula 1.

6. The organic electroluminescence device of claim 1, wherein a boron atom of the substituted or unsubstituted boryl group is not directly linked to a neighboring nitrogen atom.

7. The organic electroluminescence device of claim 1, wherein the first to fourth rings are each independently a substituted or unsubstituted aryl group of 6 to 30 carbon atoms for forming a ring, or a substituted or unsubstituted heteroaryl group of 2 to 30 carbon atoms for forming a ring.

8. The organic electroluminescence device of claim 1, wherein the first to fourth rings are each independently a substituted or unsubstituted benzene ring.

9. The organic electroluminescence device of claim 1, wherein at least one hydrogen atom in the polycyclic compound is substituted with a deuterium atom.

10. The organic electroluminescence device of claim 1, wherein the emission layer comprises at least one of Compound Group 1:
Compound Group 1
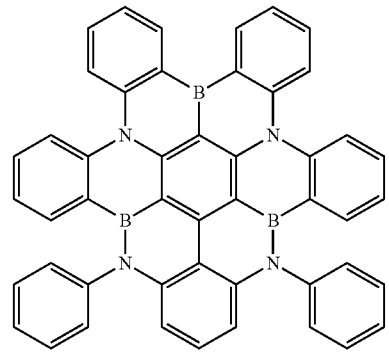
1
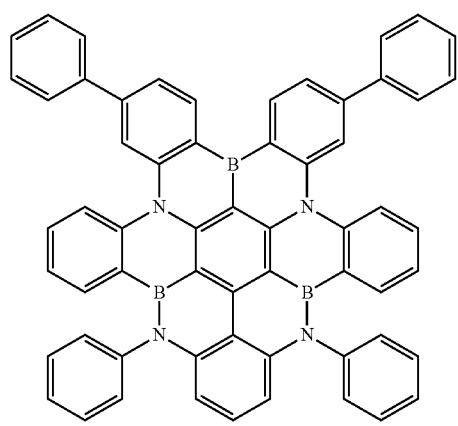
2
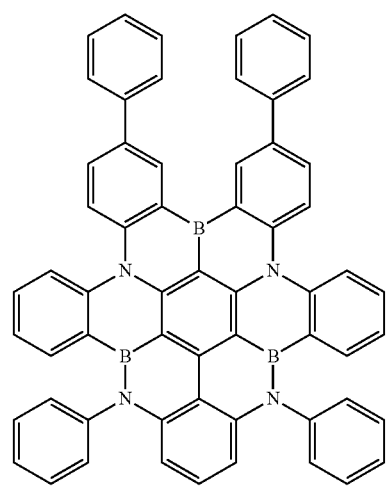
3
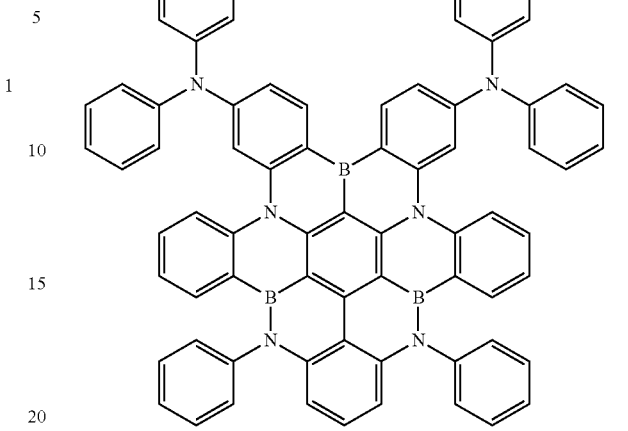
4
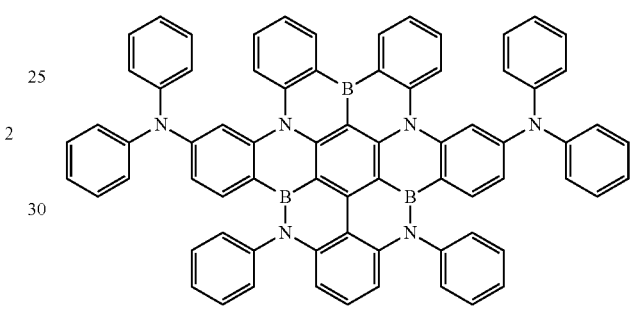
5
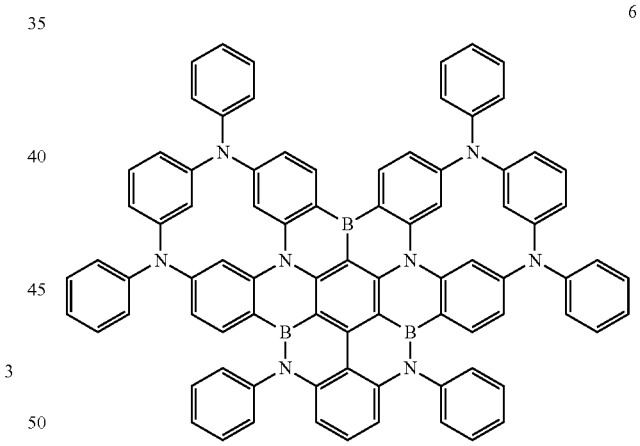
6
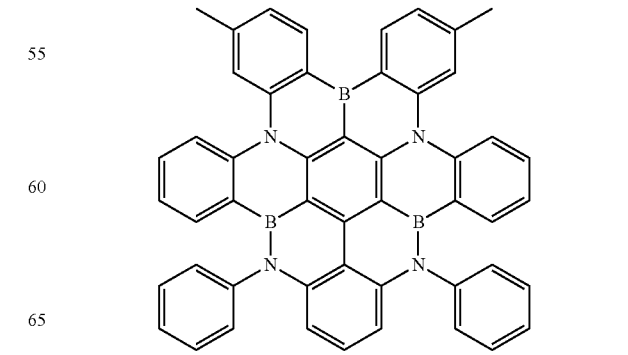
7

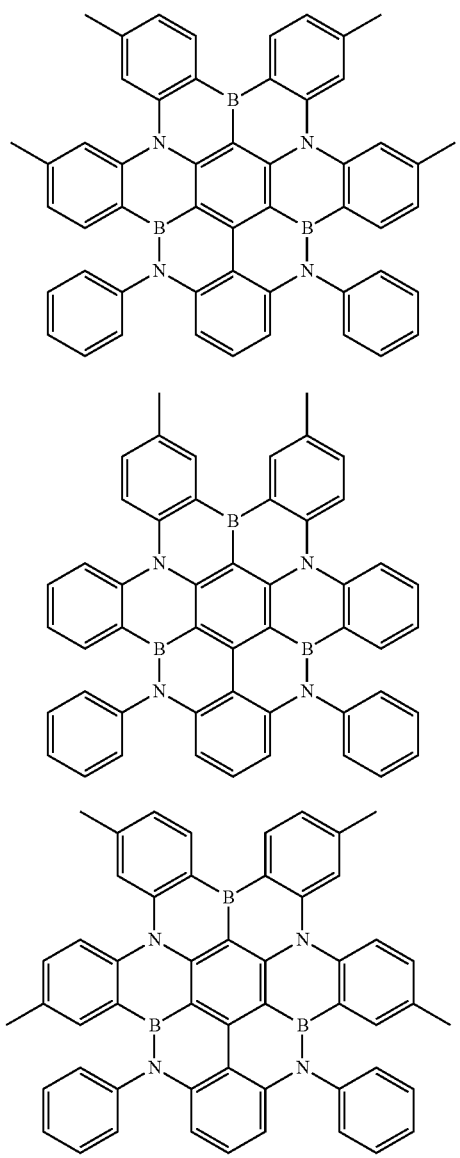
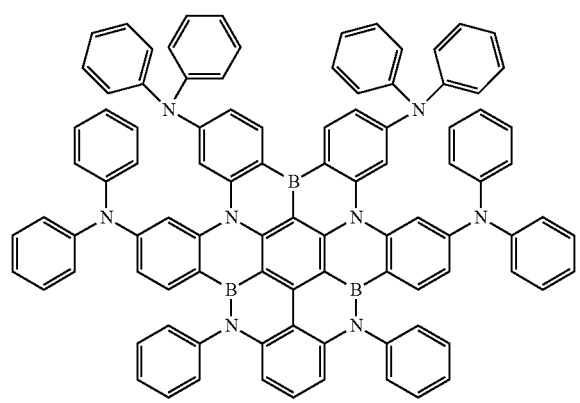
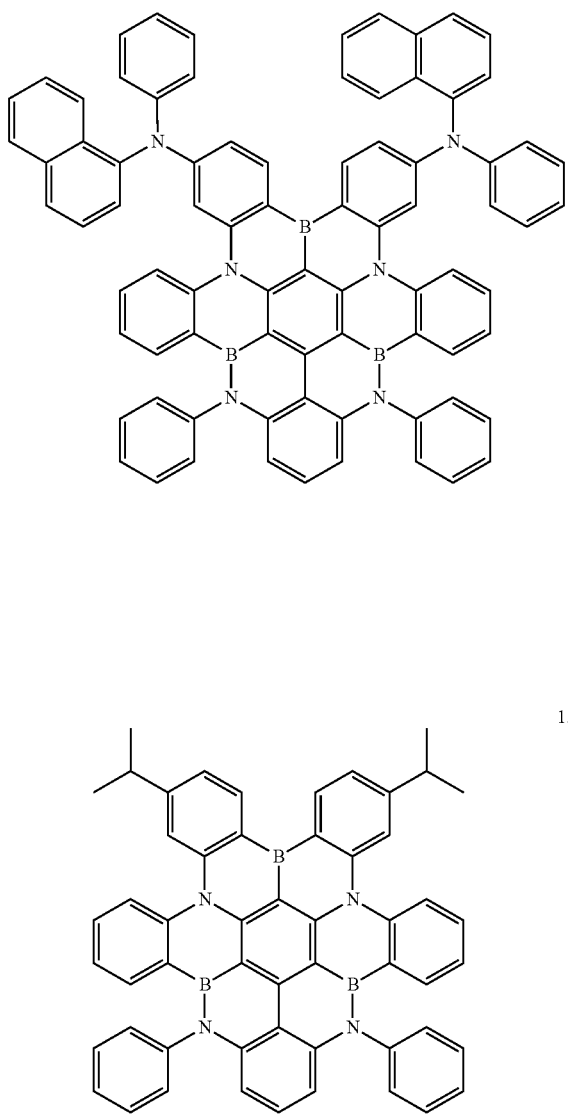

15
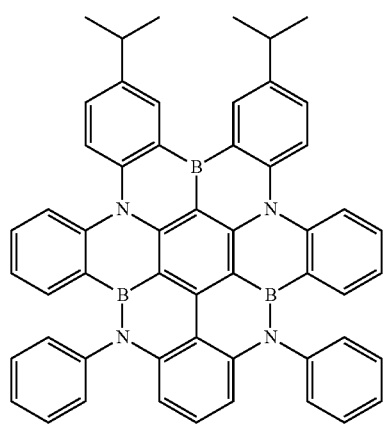
16
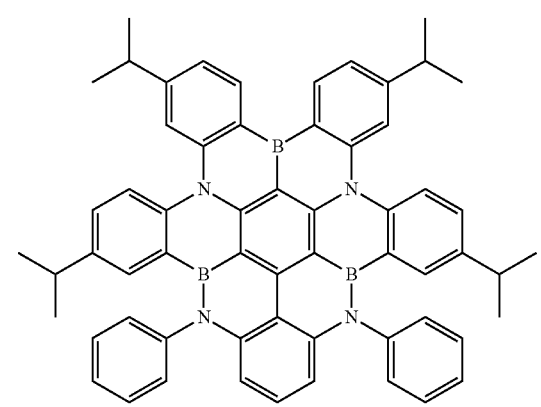
17
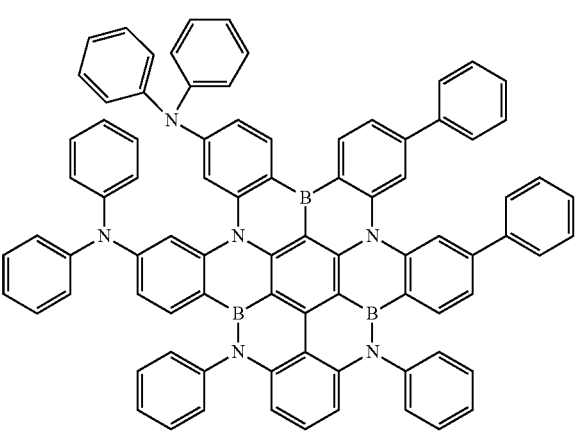
18
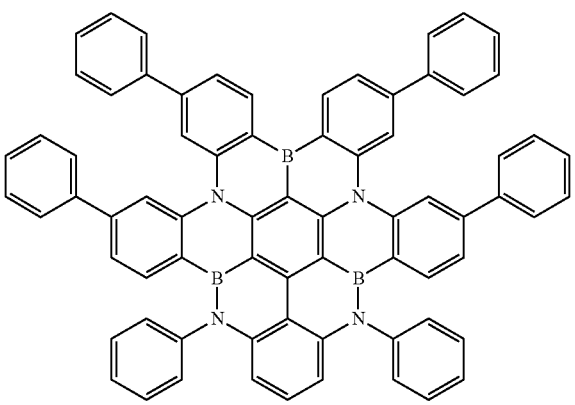
19
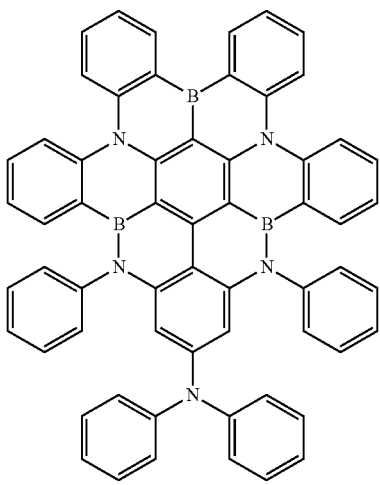
20
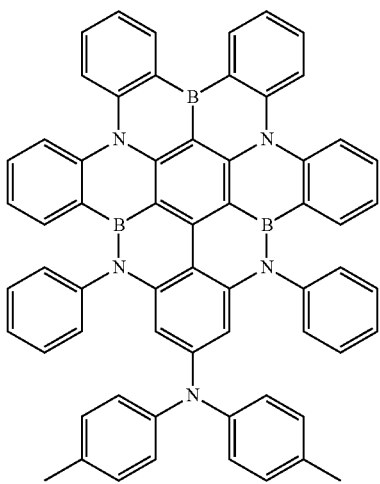

21
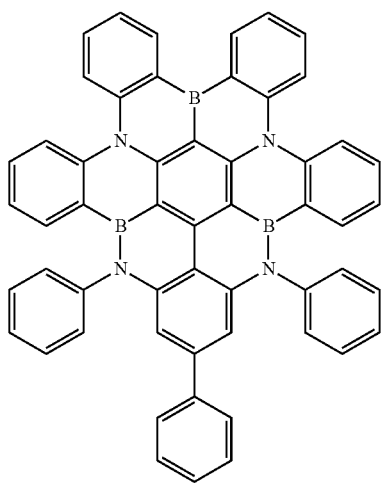
22
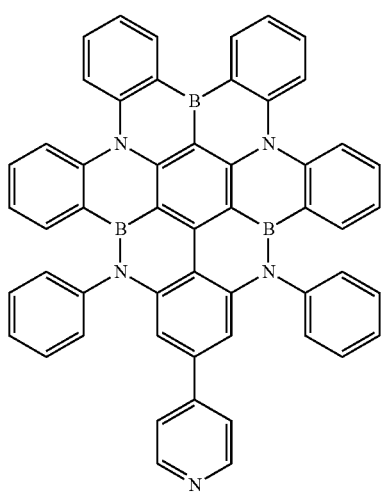
23
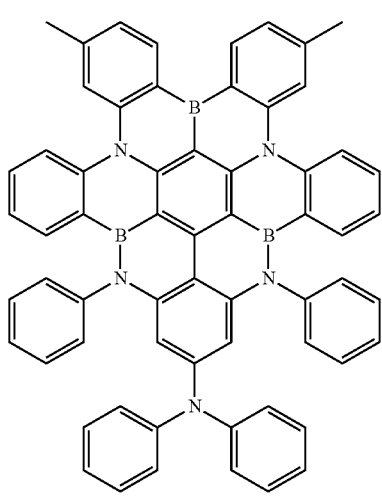
24
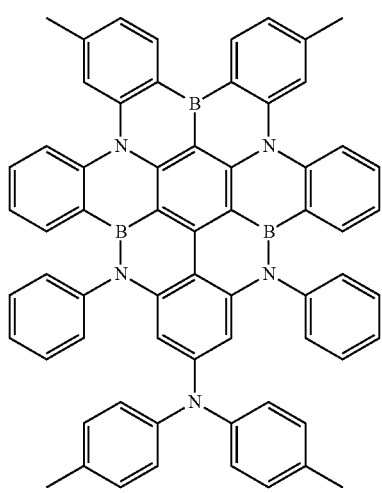
25
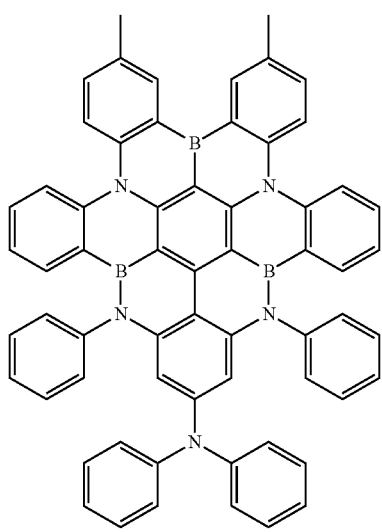
26
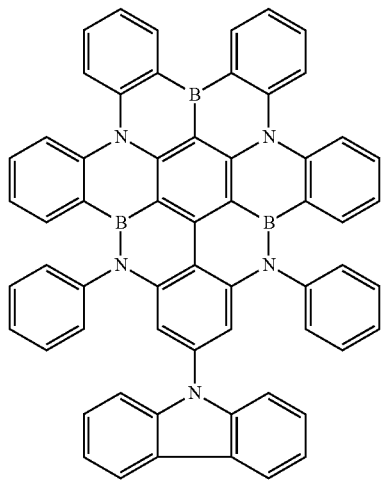

27
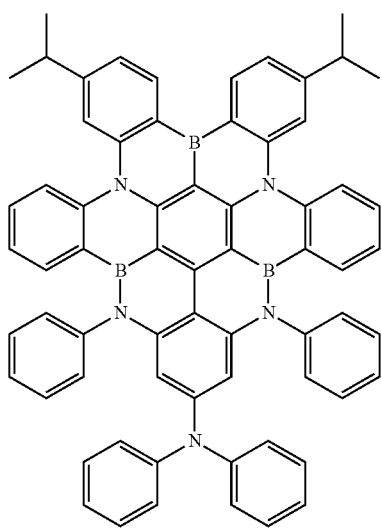
28
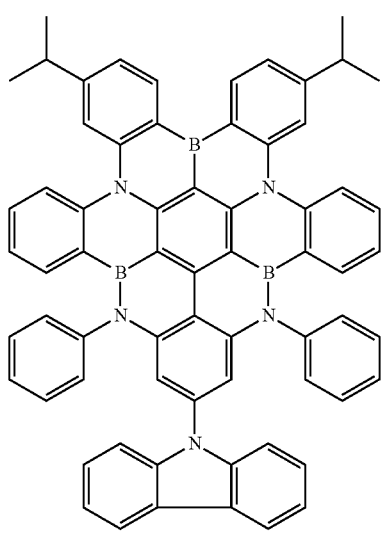
29
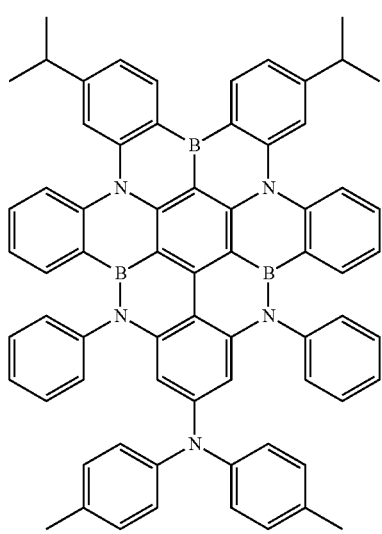
30
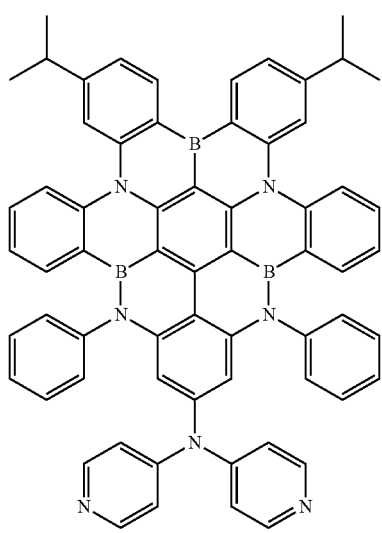
31
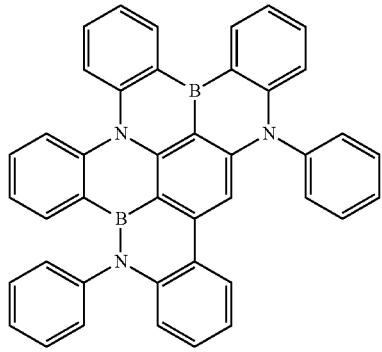
32
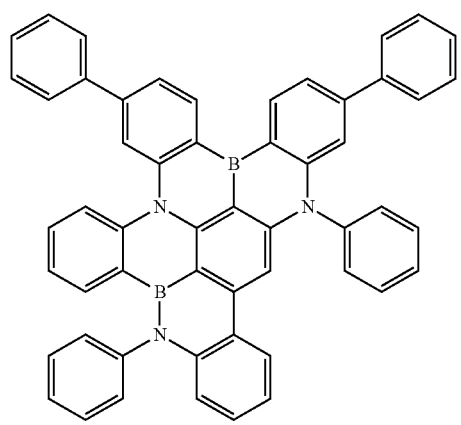

33
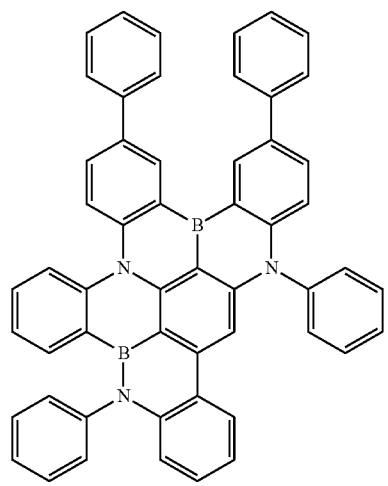
34
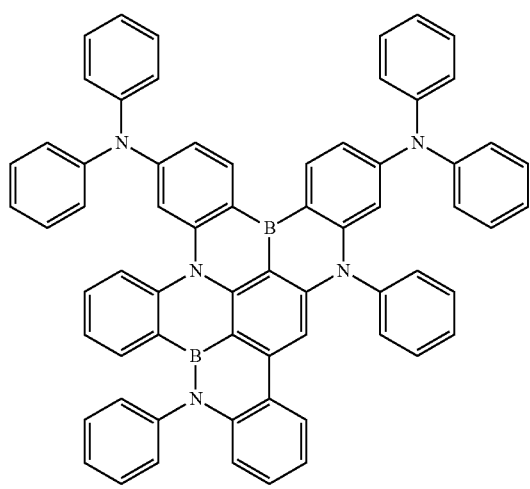
35
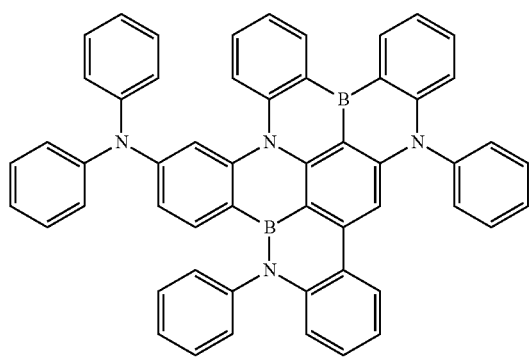
36
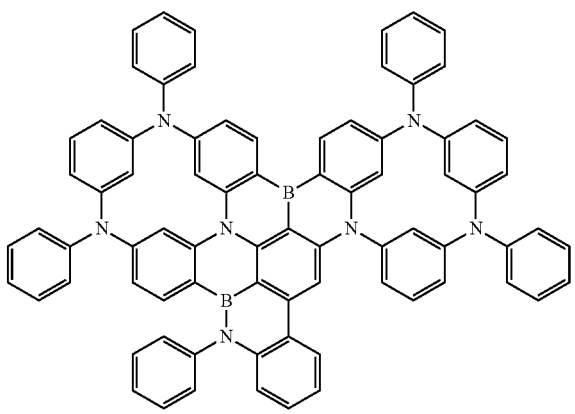
37
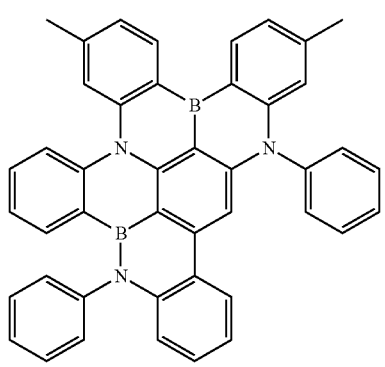
38
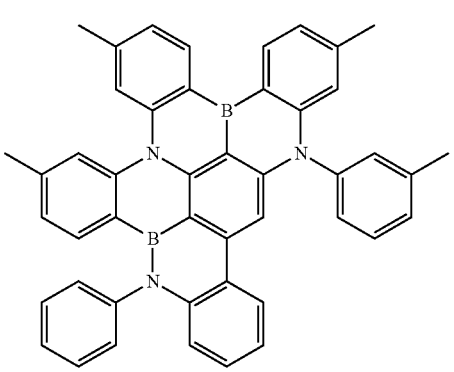
39
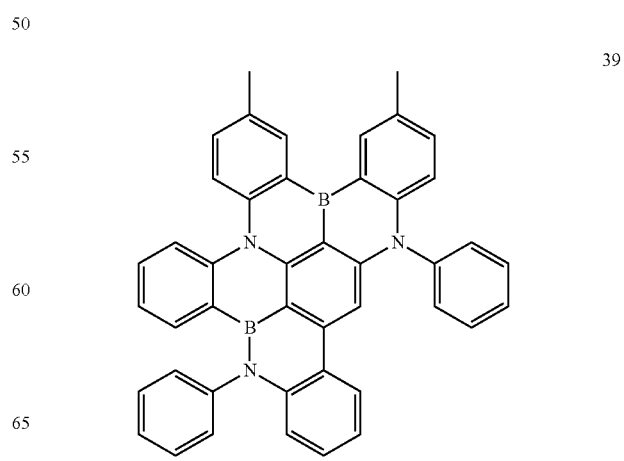

40
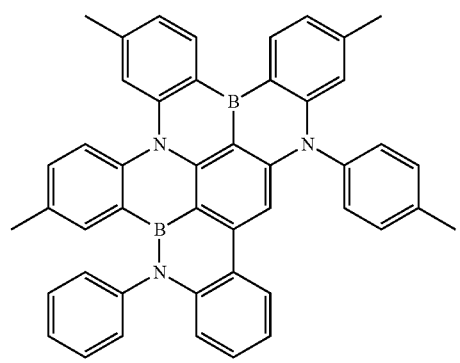
41
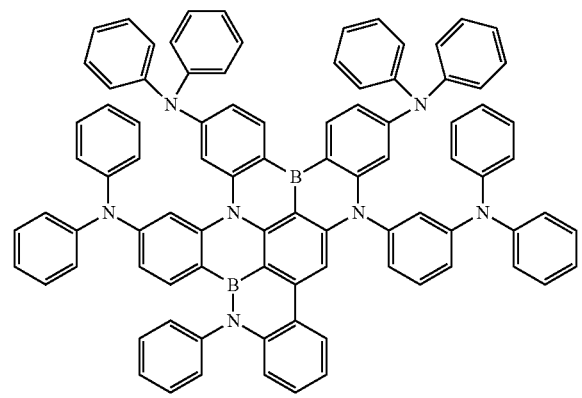
42
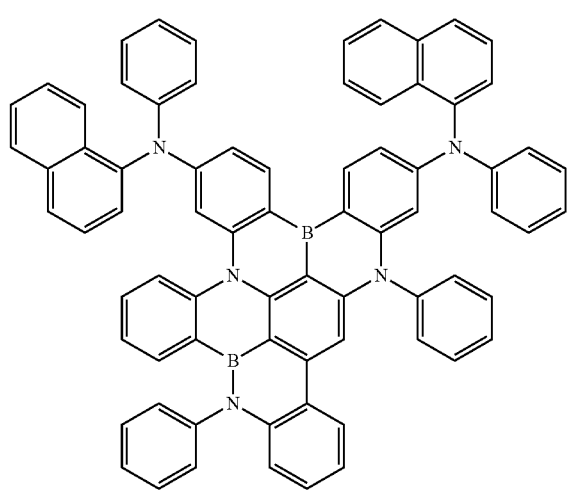
43
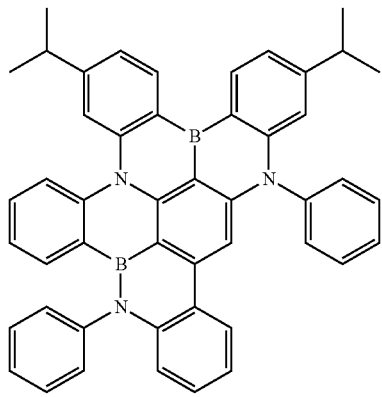
44
45
46
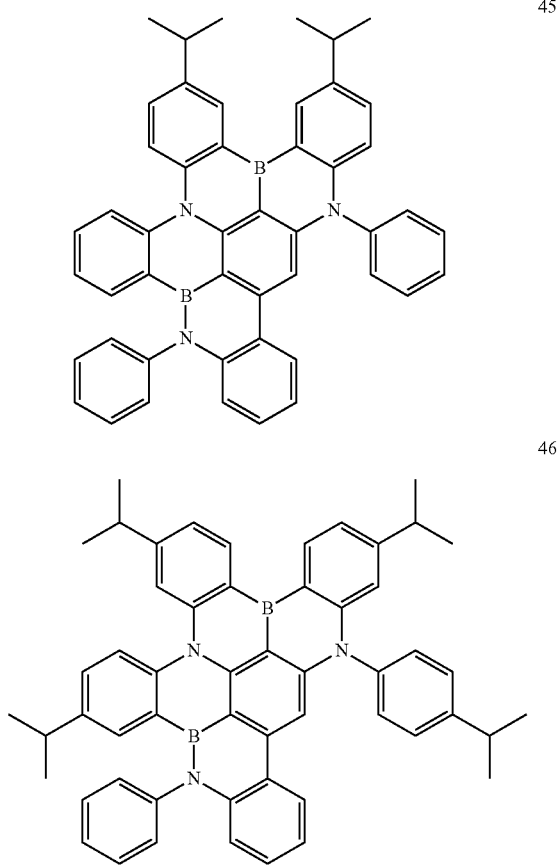

-continued
47
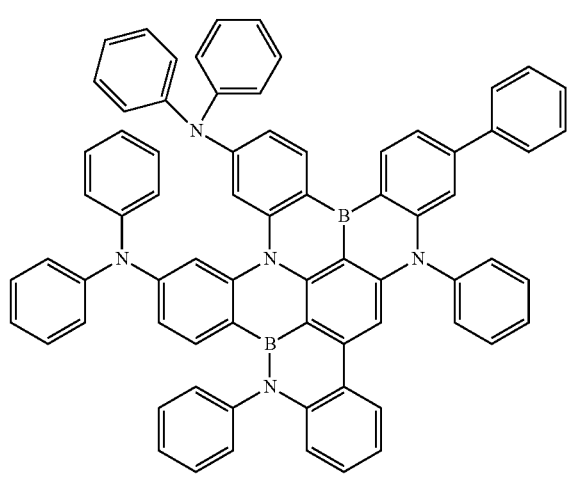
48
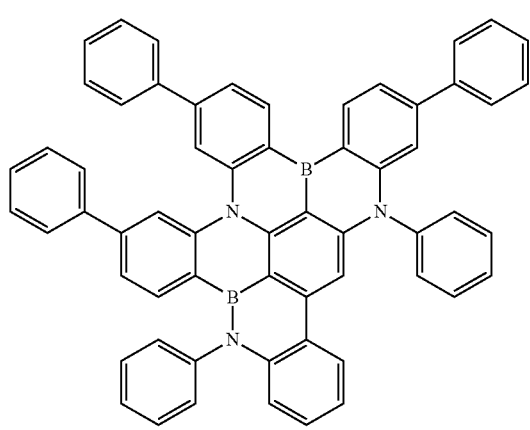
49
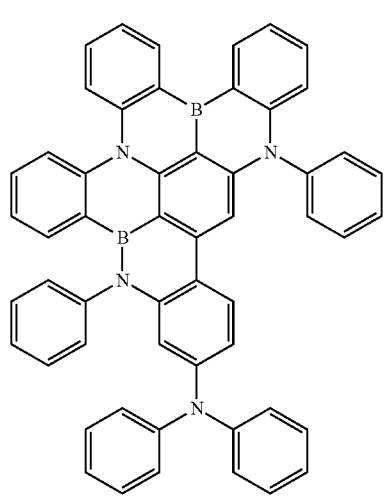
-continued
50
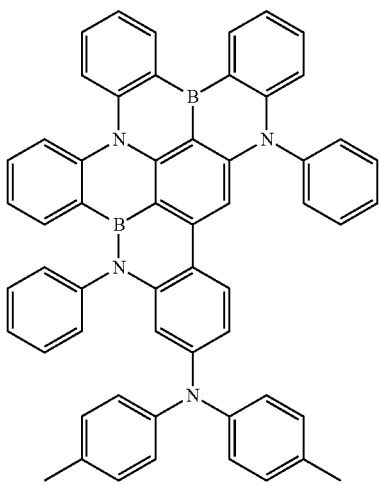
51
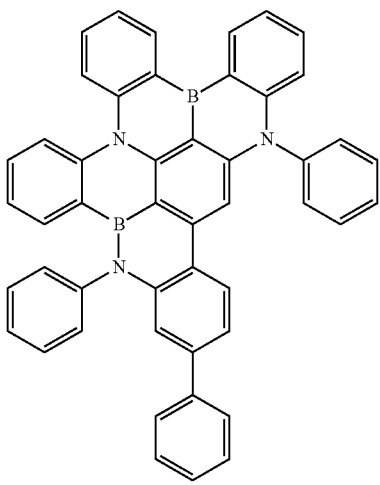
52
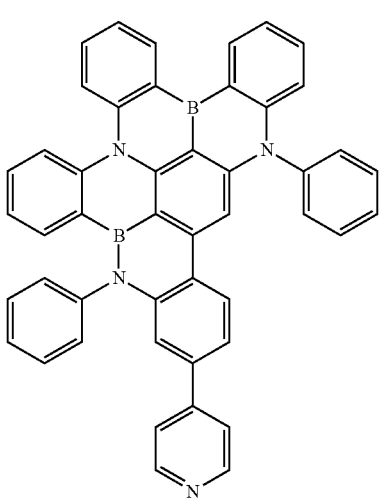

53
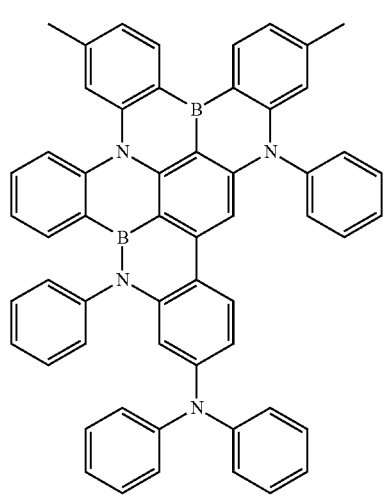
54
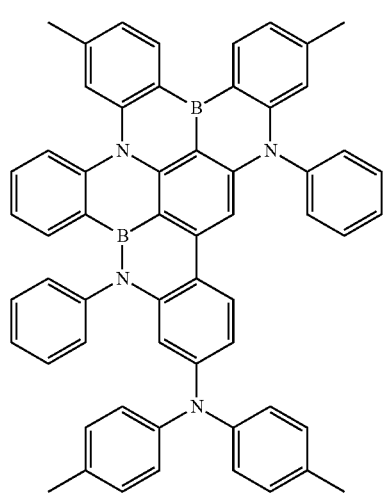
55
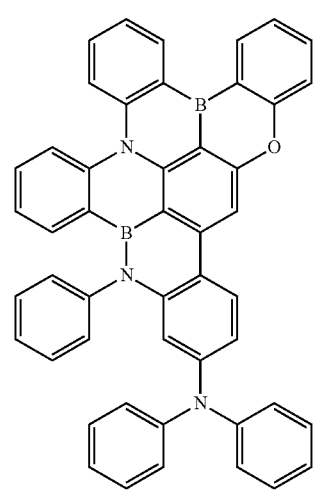
56
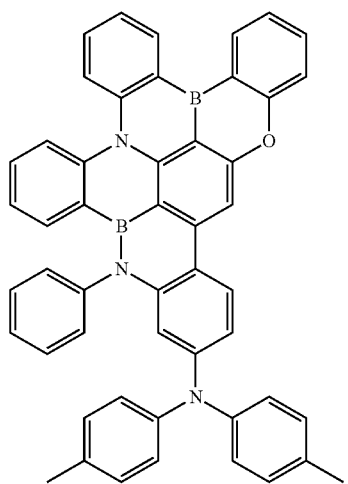
57
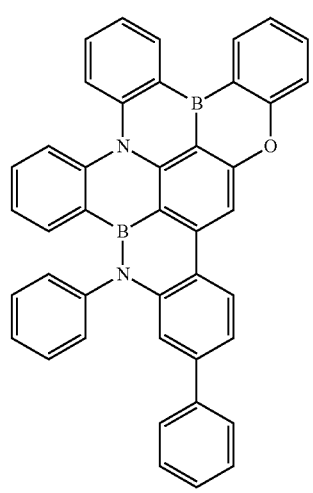
58
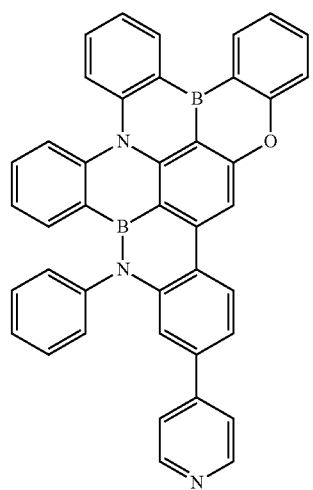

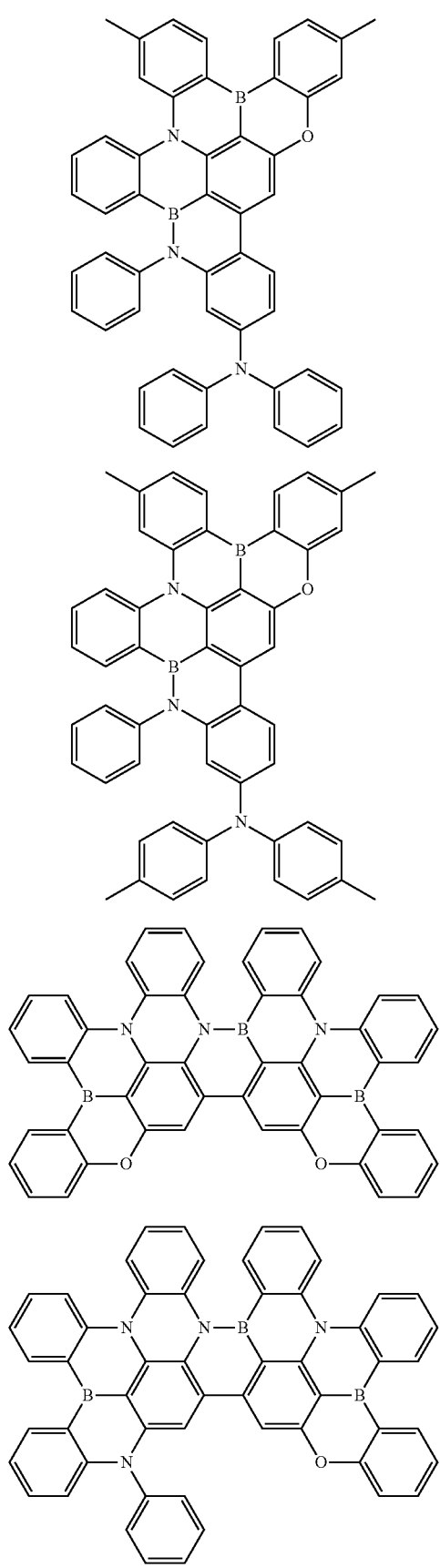
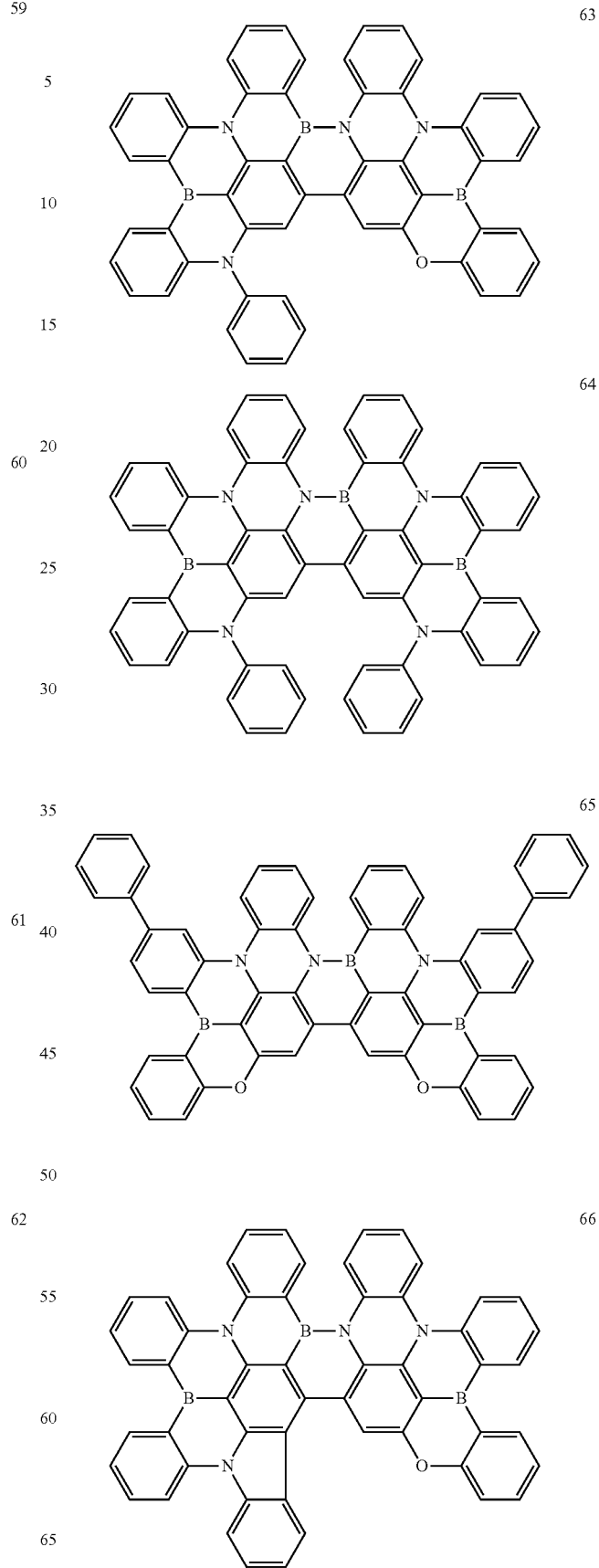

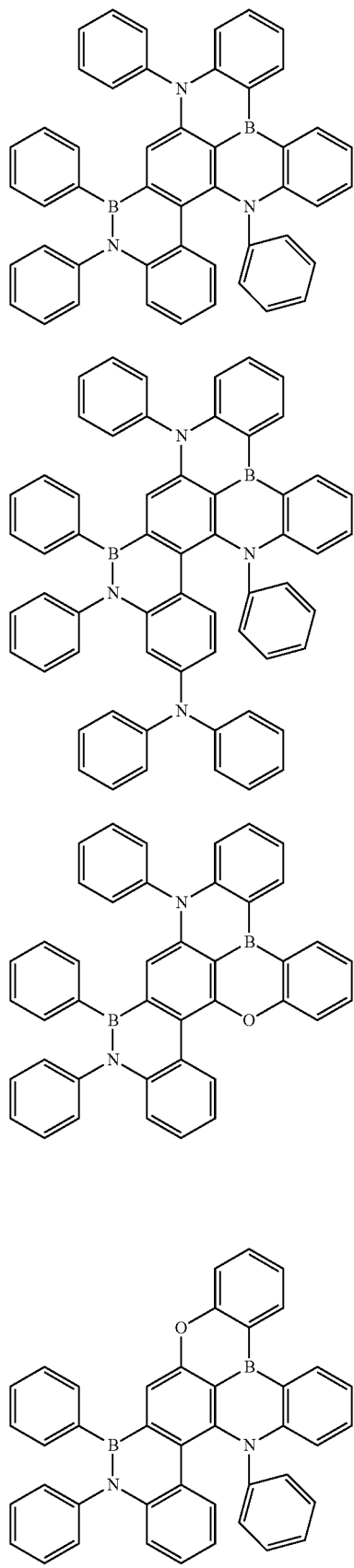
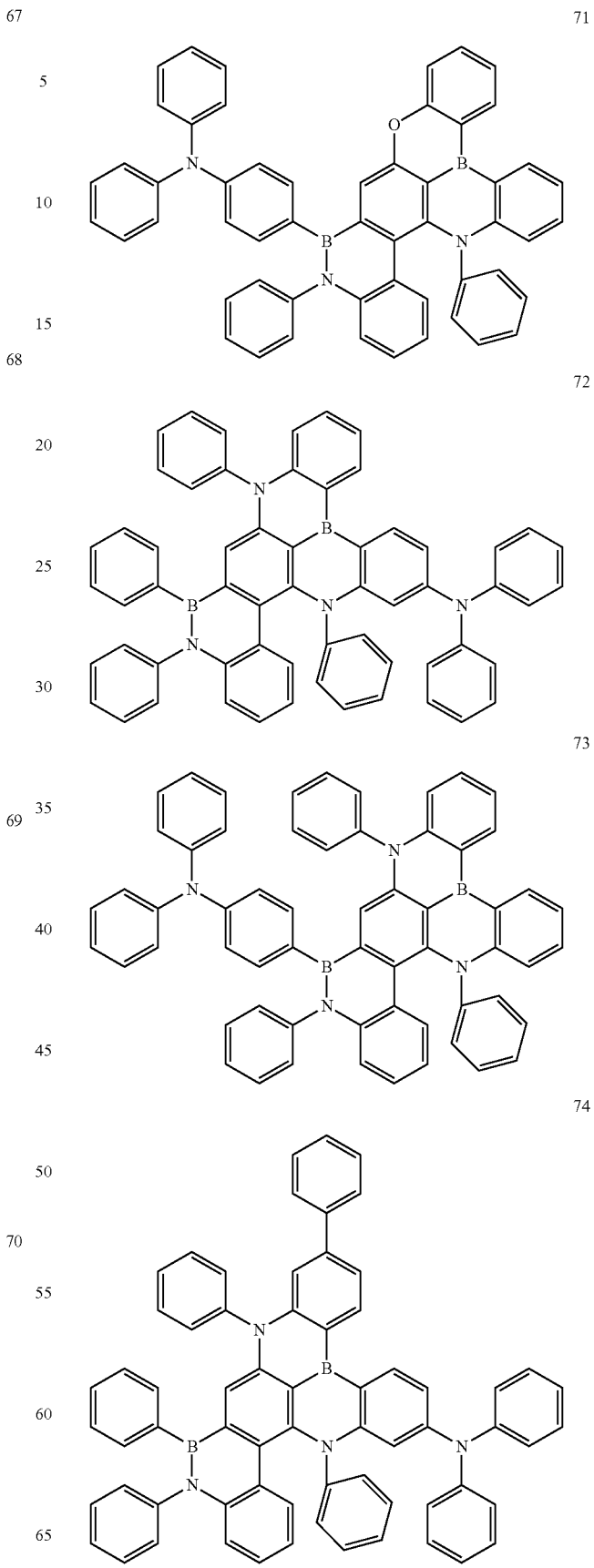

75

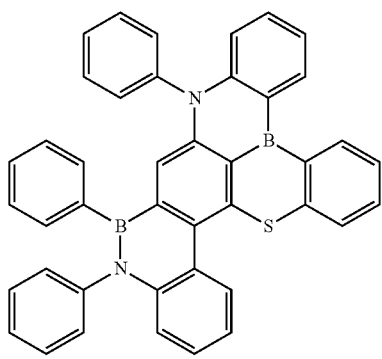

76

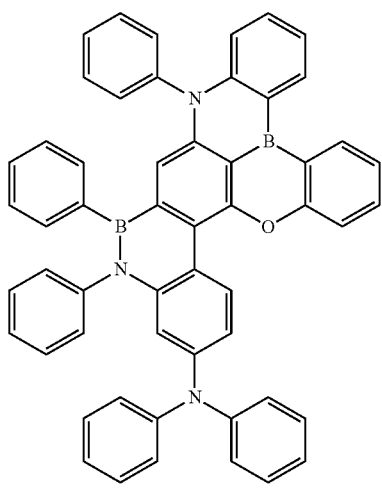

77

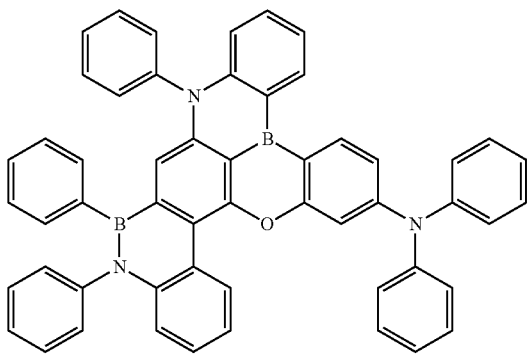

78

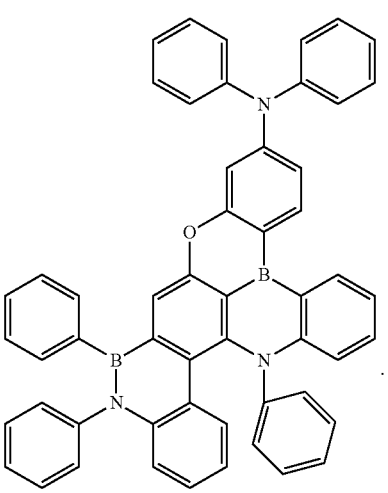

11. The organic electroluminescence device of claim 1, wherein the emission layer emits delayed fluorescence.

12. The organic electroluminescence device of claim 1, wherein the emission layer comprises a host and a dopant, and the dopant comprises the polycyclic compound.

13. The organic electroluminescence device of claim 1, wherein the emission layer emits light having a central wavelength of about 430 nm to about 470 nm.

14. An organic electroluminescence device, comprising:

a first electrode;

a second electrode disposed on the first electrode; and an emission layer disposed between the first electrode and the second electrode and comprising a polycyclic compound, and wherein the first electrode and the second electrode each independently comprise at least one of Ag, Mg, Cu, Al, Pt, Pd, Au, Ni, Nd, Ir, Cr, Li, Ca, LiF/Ca, LiF/Al, Mo, Ti, In, Sn, Zn, a compound comprising two or more of the foregoing, an oxide thereof, or a combination thereof:

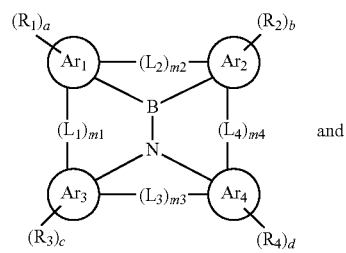 and wherein the polycyclic compound is represented by any one among the following Formula 1-1 to Formula 1-4:

Formula 1-1

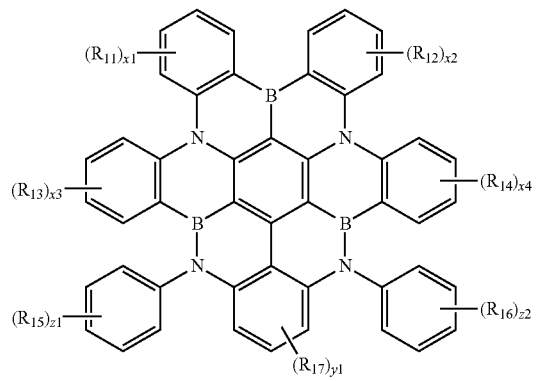

Formula 1-2

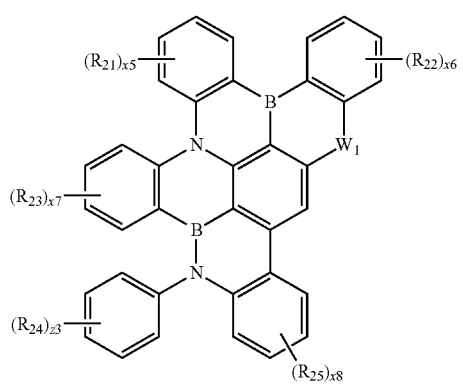

Formula 1-3

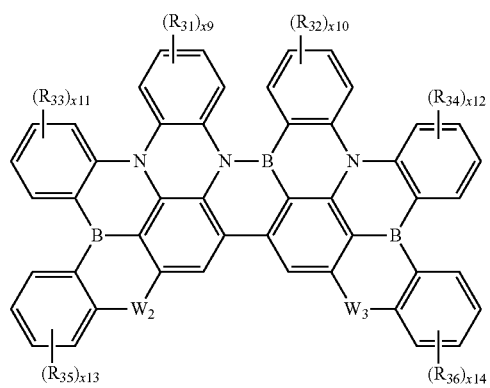

Formula 1-4 wherein:

in Formula 1-1, $y_1$ is an integer of 0 to 3, in Formula 1-1 to Formula 1-4, $R_{11}$ to $R_{17}$, $R_{21}$ to $R_{25}$, $R_{31}$ to $R_{36}$, and $R_{41}$ to $R_{45}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, $R_{11}$ to $R_{17}$, $R_{21}$ to $R_{25}$, $R_{31}$ to $R_{36}$, and $R_{41}$ to $R_{45}$ are each independently optionally linked with an adjacent group to form a ring, x11 to x17 are each independently an integer of 0 to 4, z1 to z5 are each independently an integer of 0 to 5, $W_1$ to $W_5$ are each independently a direct linkage, *—O—*, or *—NRa—*, and Ra is a hydrogen atom, a deuterium atom, a halogen atom, a cyano group, a nitro group, a substituted or unsubstituted amine group, a substituted or unsubstituted alkoxy group, a substituted or unsubstituted aryloxy group, a substituted or unsubstituted alkylthio group, a substituted or unsubstituted arylthio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, or optionally linked with an adjacent group to form a ring.

15. The organic electroluminescence device of claim 14, wherein the emission layer comprises at least one among Compound Group 1:

Compound Group 1

1

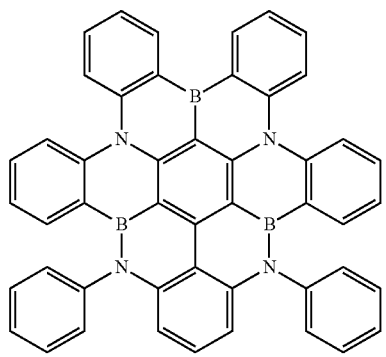

2

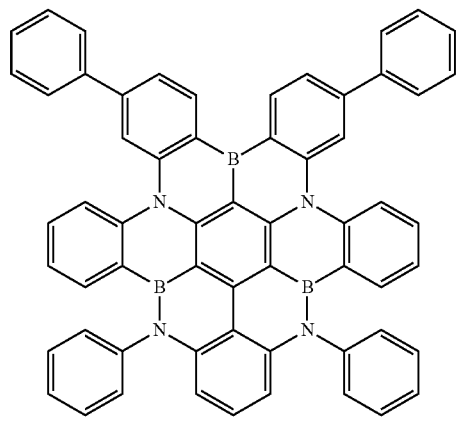

3
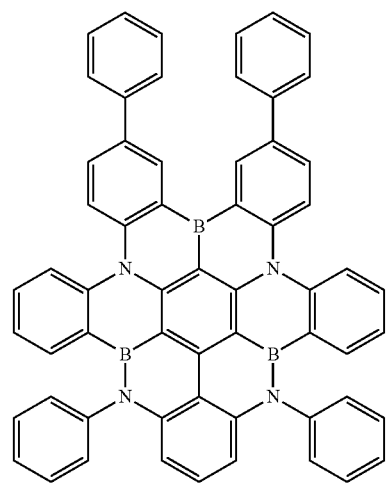
4
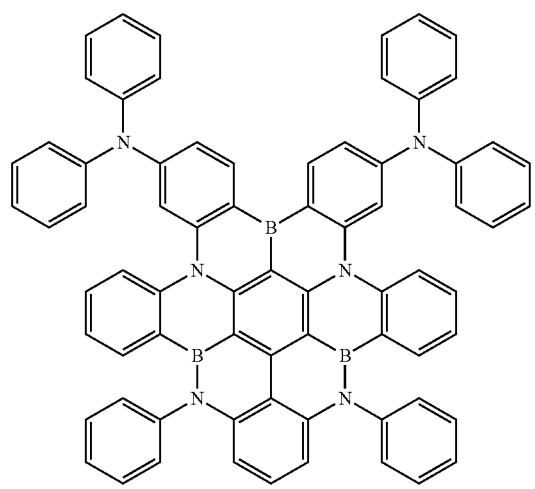
5
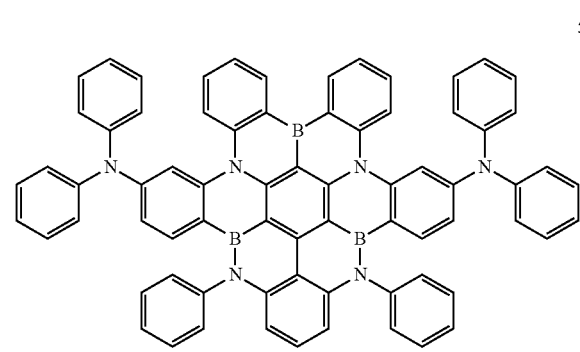
6
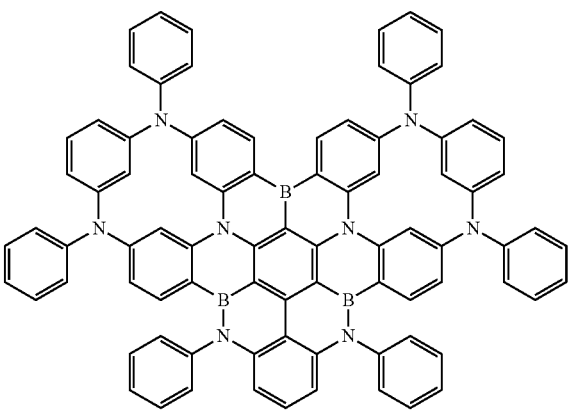
7
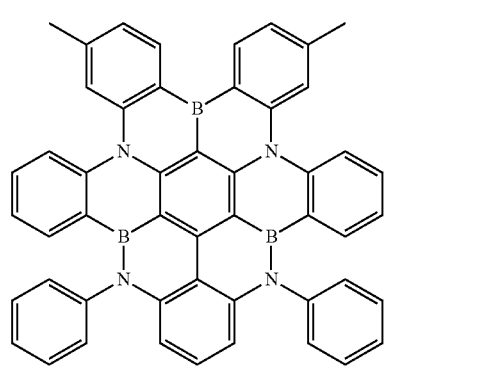
8
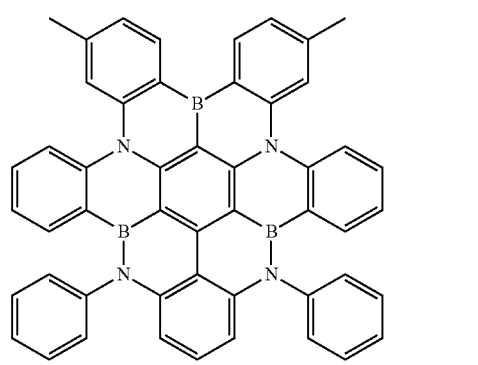
9
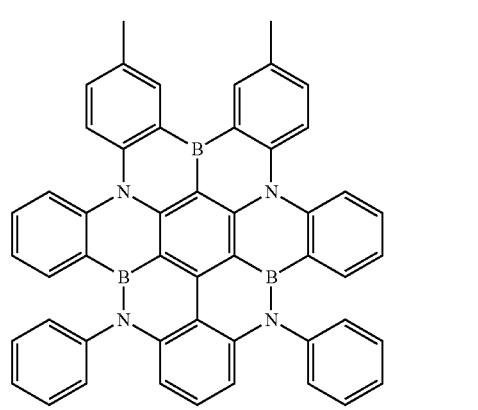

10
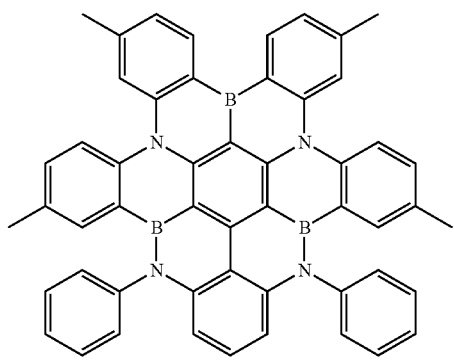
11
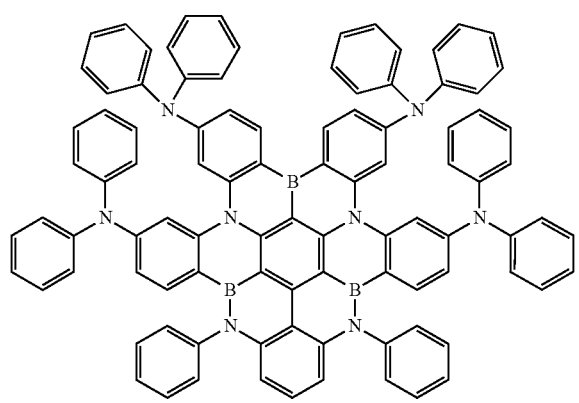
12
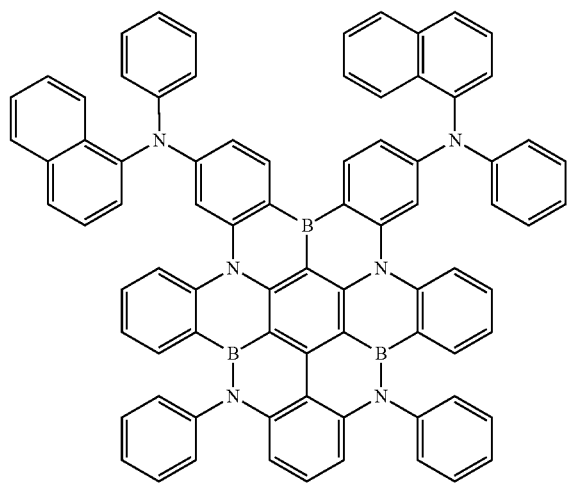
13
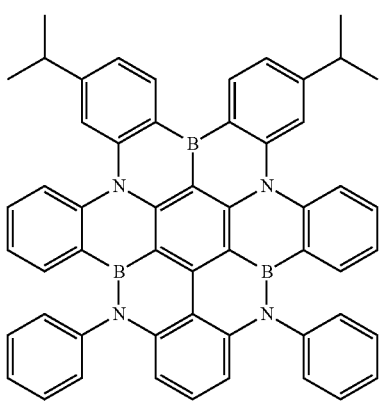
14
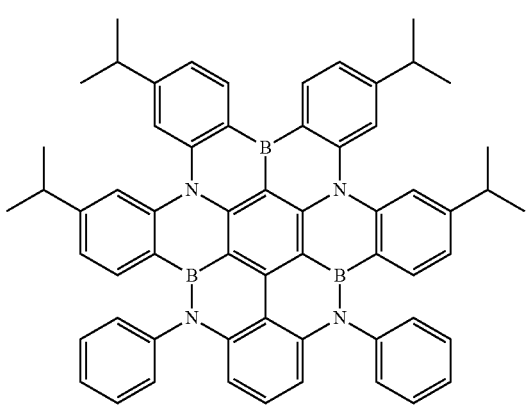
15
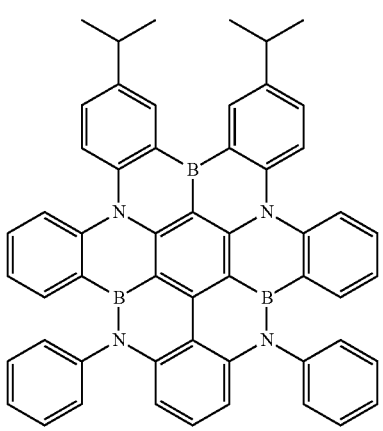
16
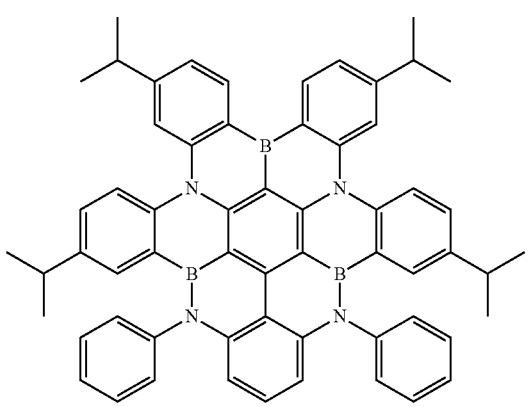

17
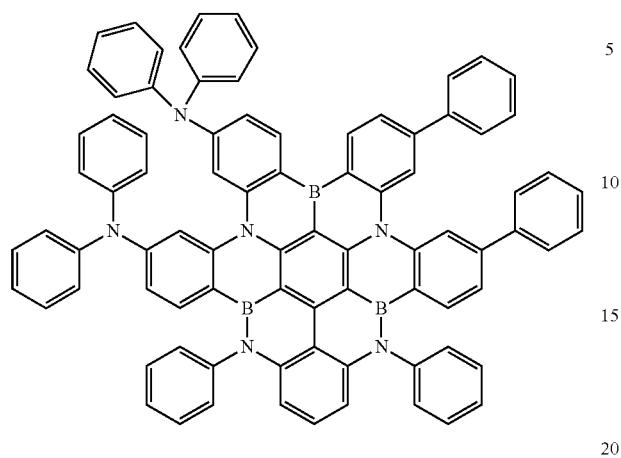
20
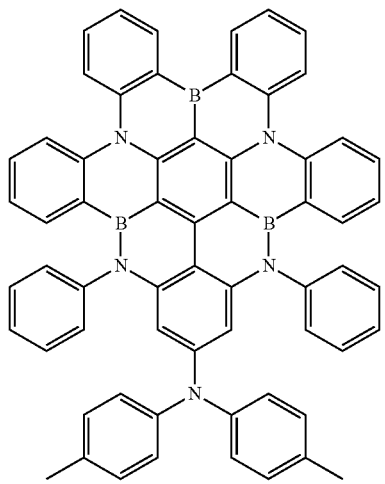
18
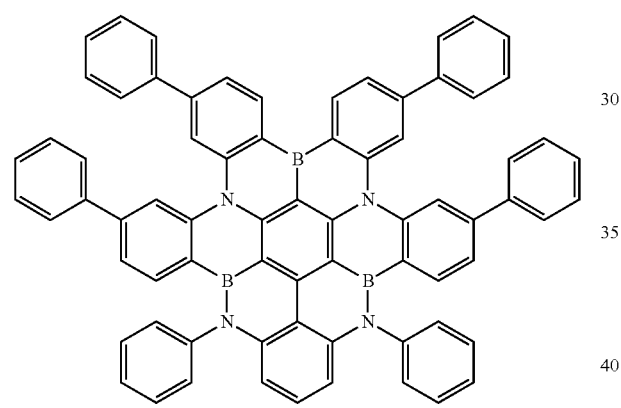
21
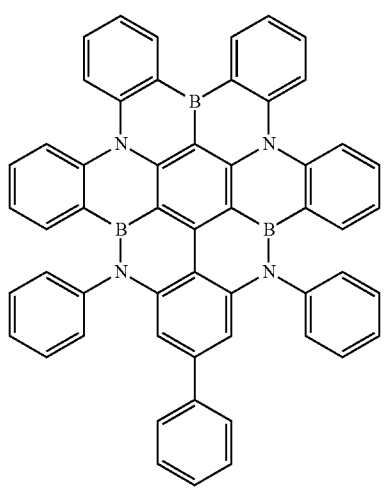
19
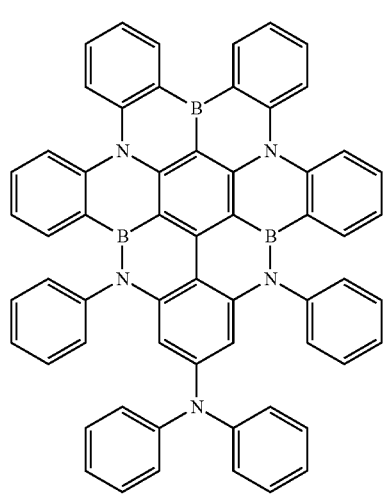
22
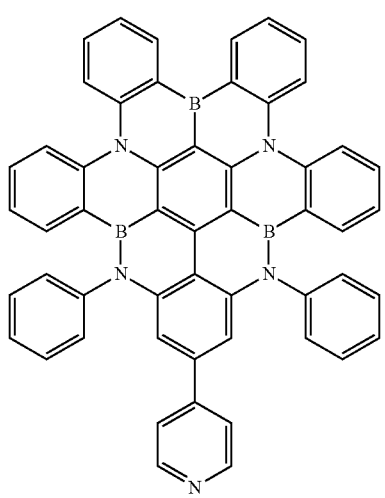

93
-continued
23
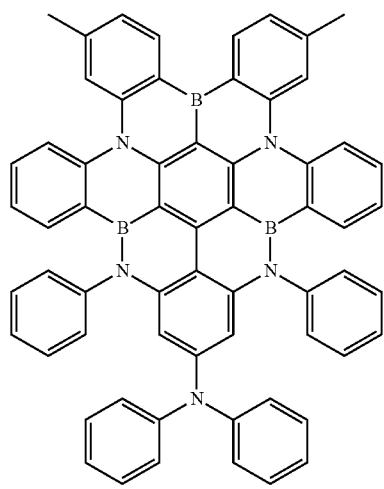
24
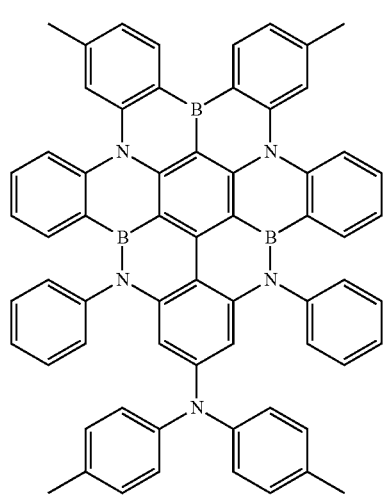
25
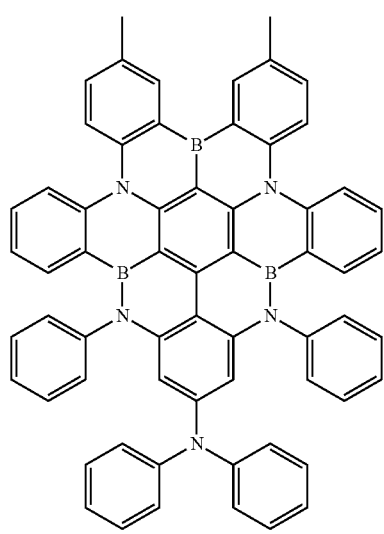
94
-continued
26
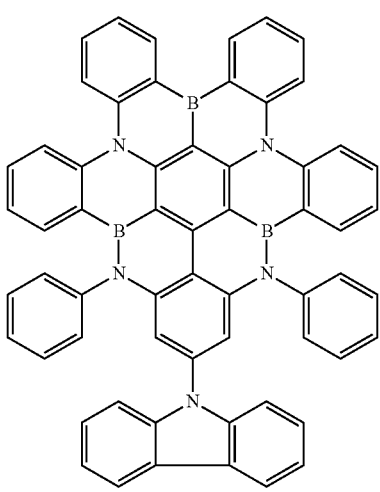
27
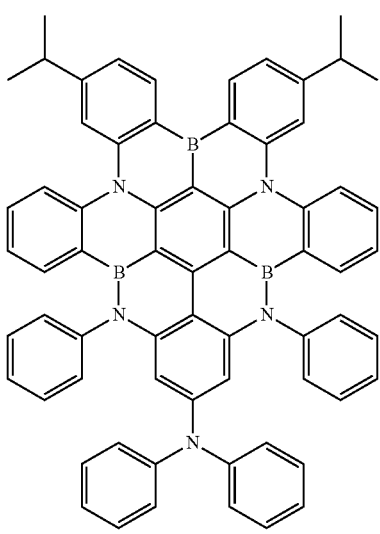
28
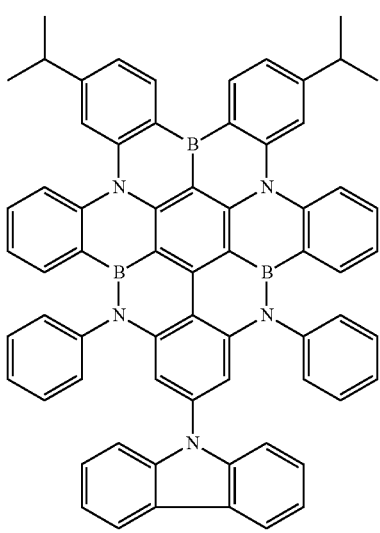

95
-continued
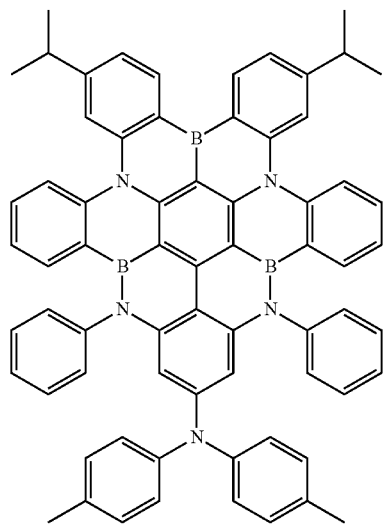
29
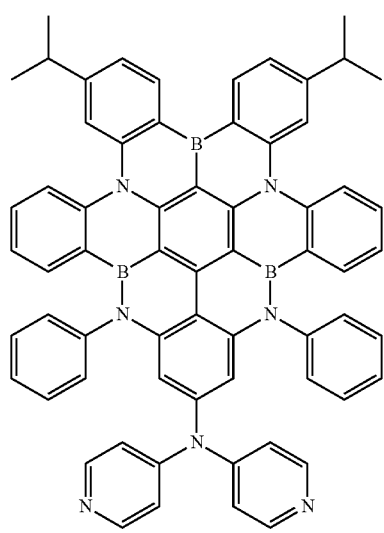
30
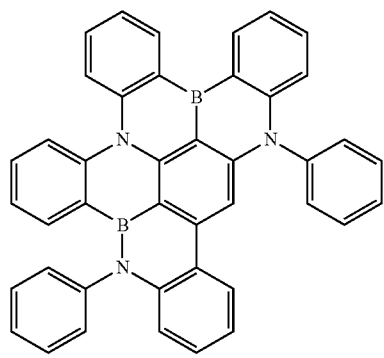
31
96
-continued
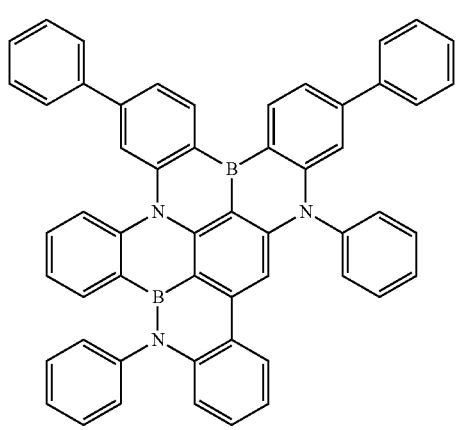
32
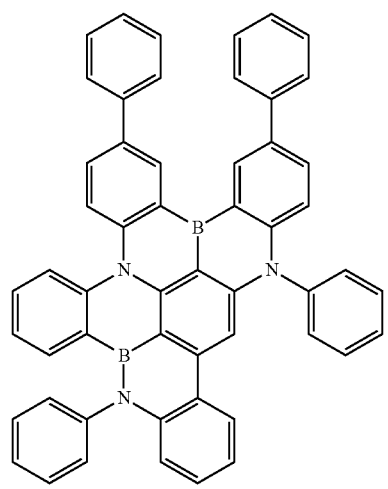
33
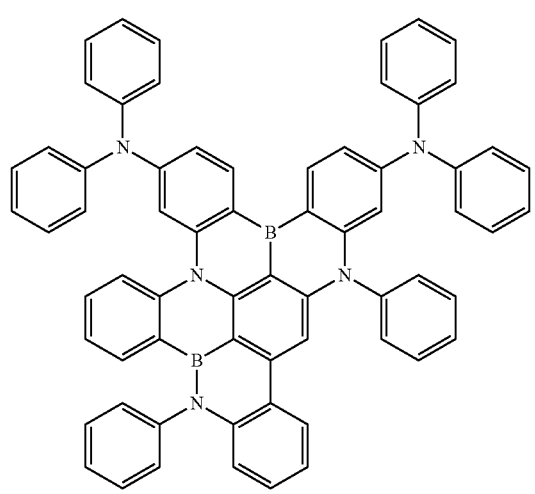
34

35
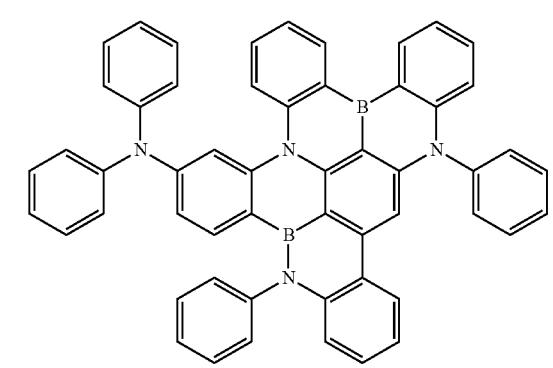
36
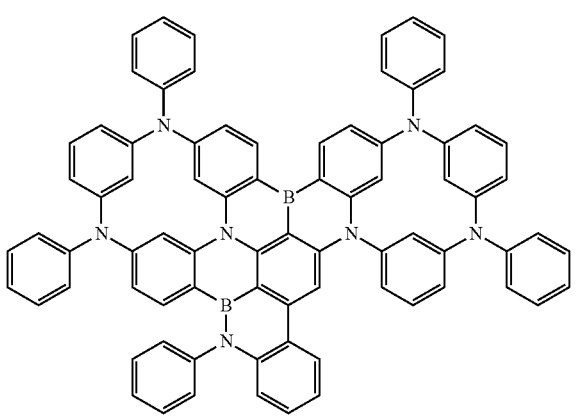
37
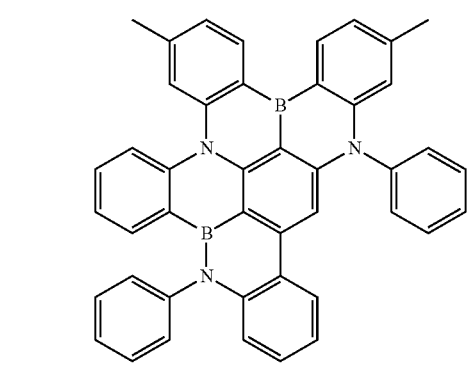
38
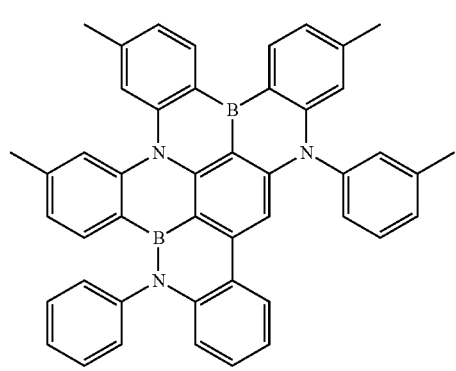
39
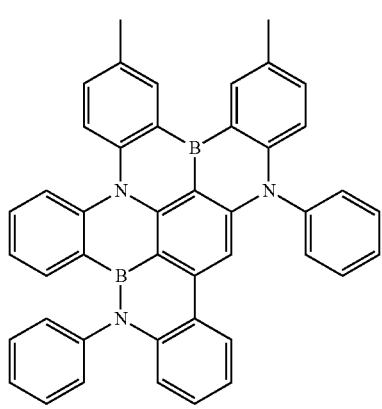
40
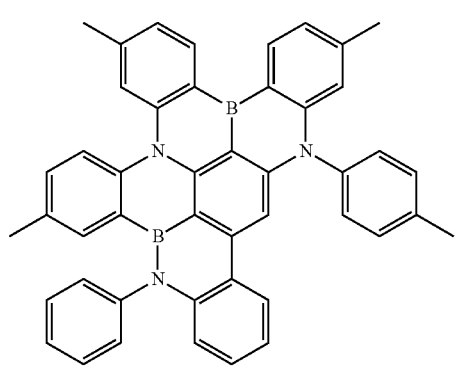
41
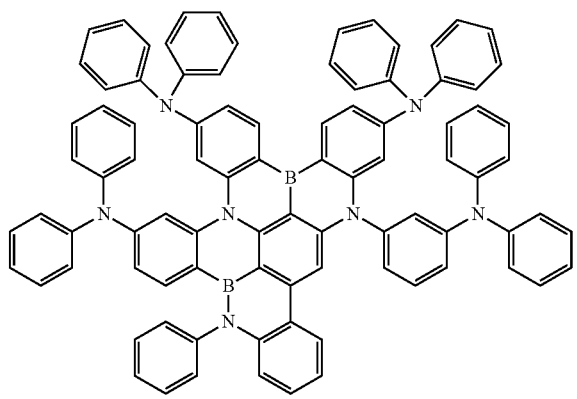

42
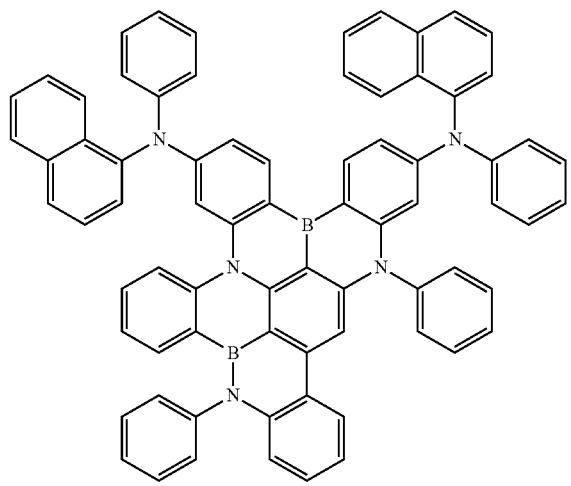
45
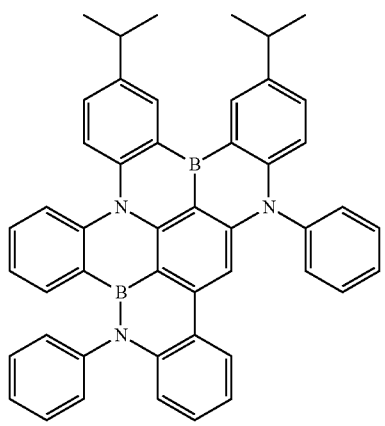
43
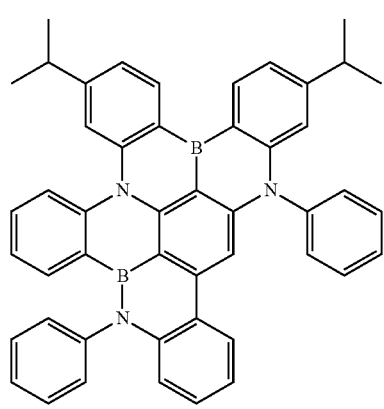
46
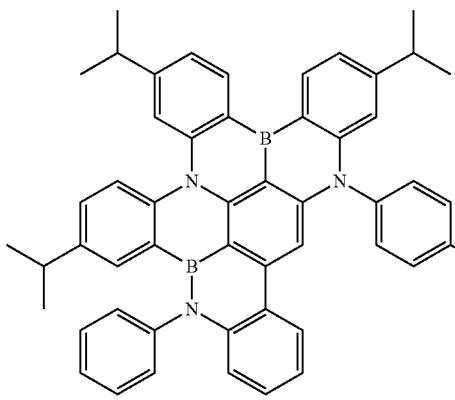
44
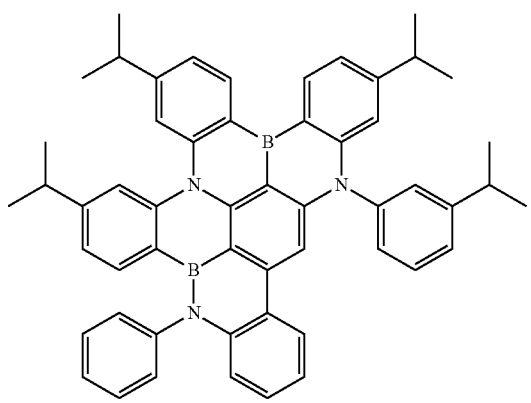
47
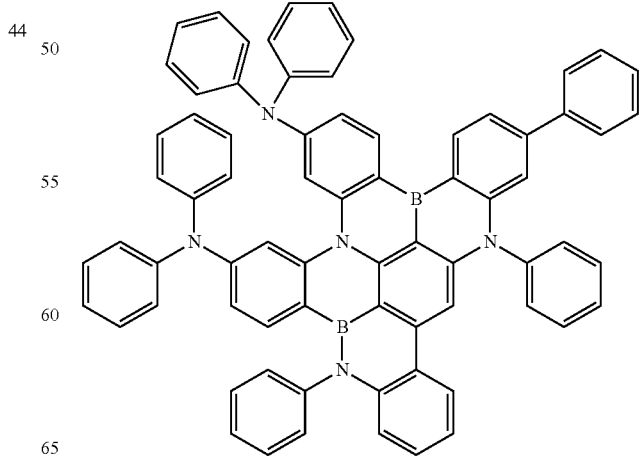

101
-continued
48
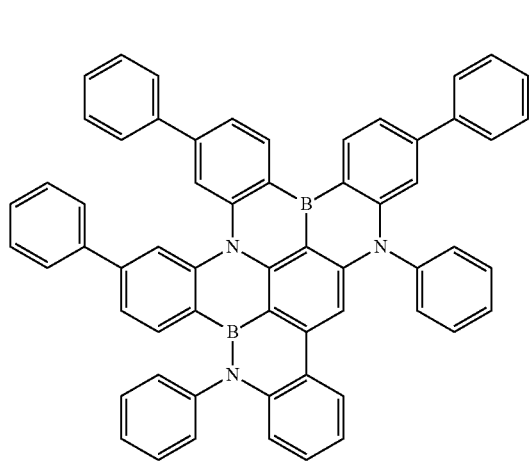
49
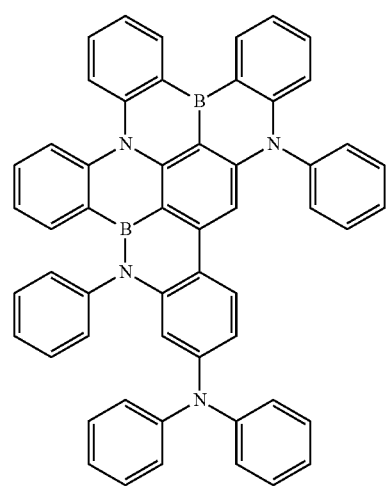
50
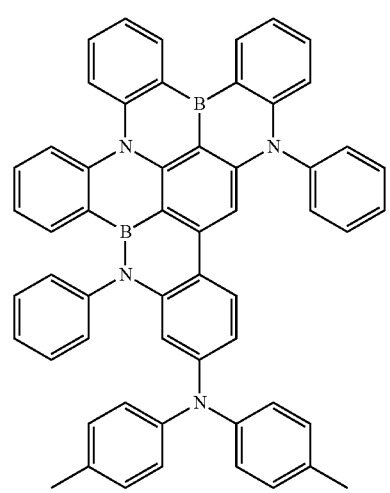
102
-continued
51
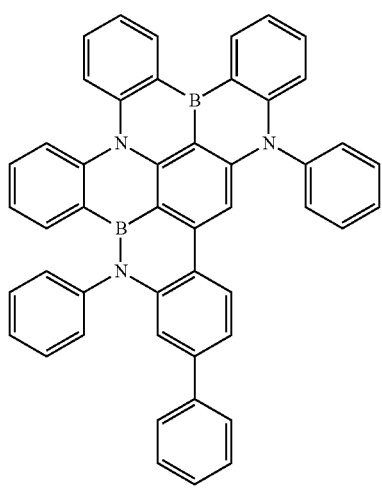
52
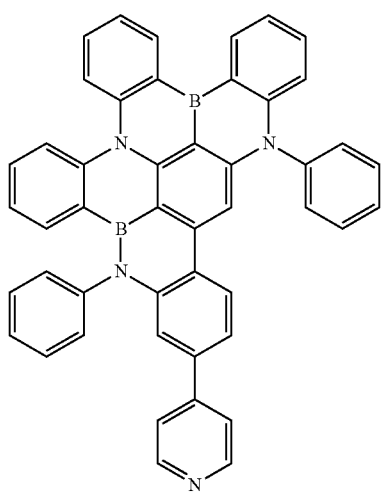
53
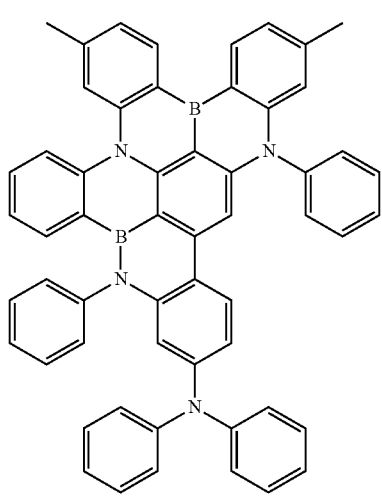

54
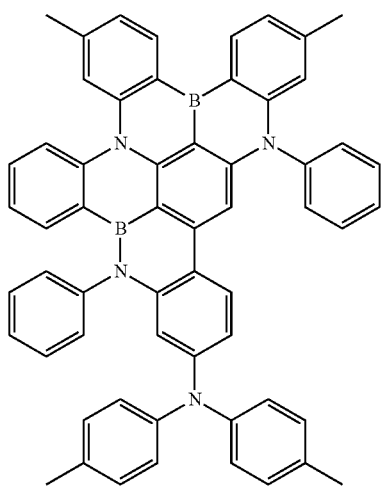
55
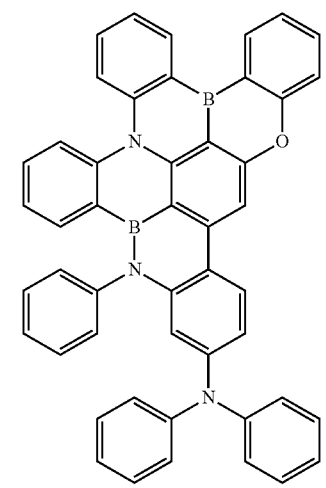
56
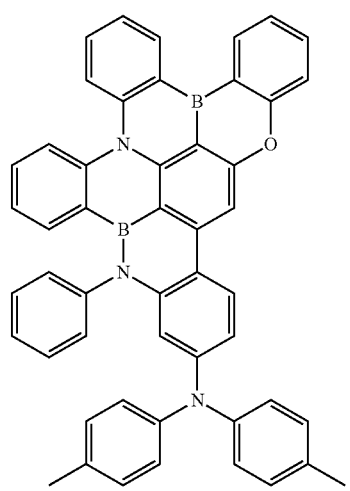
57
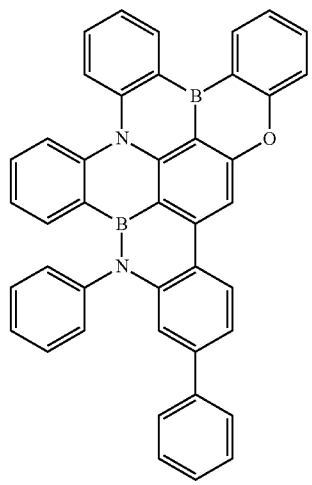
58
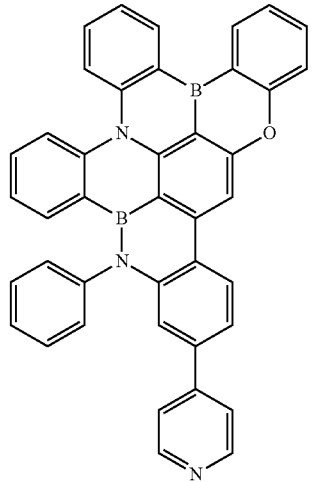
59
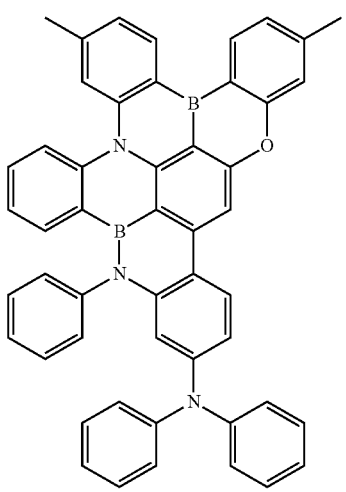

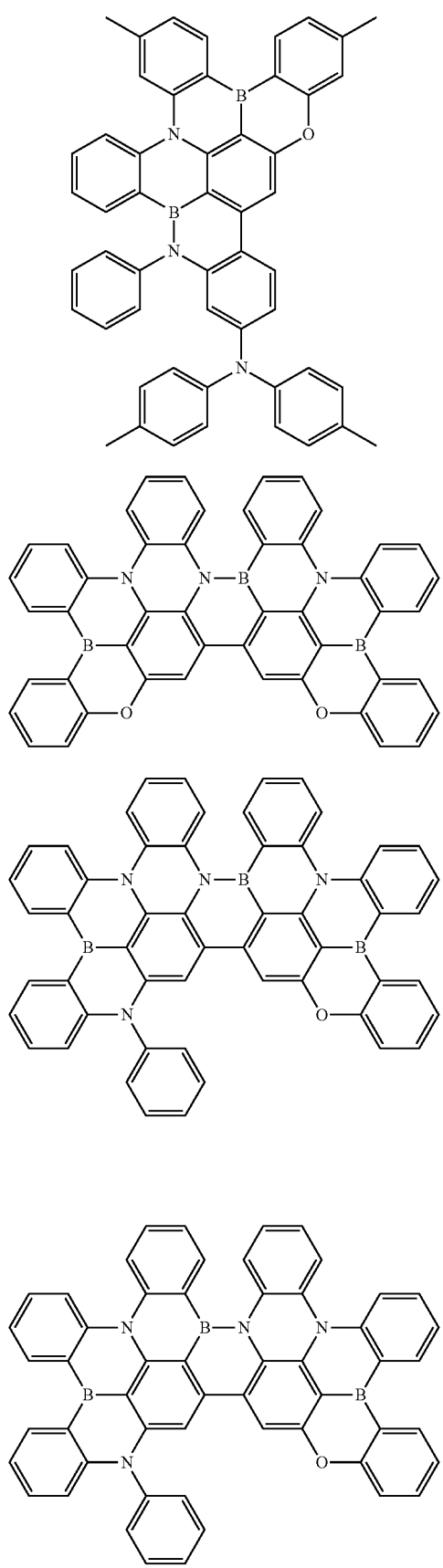
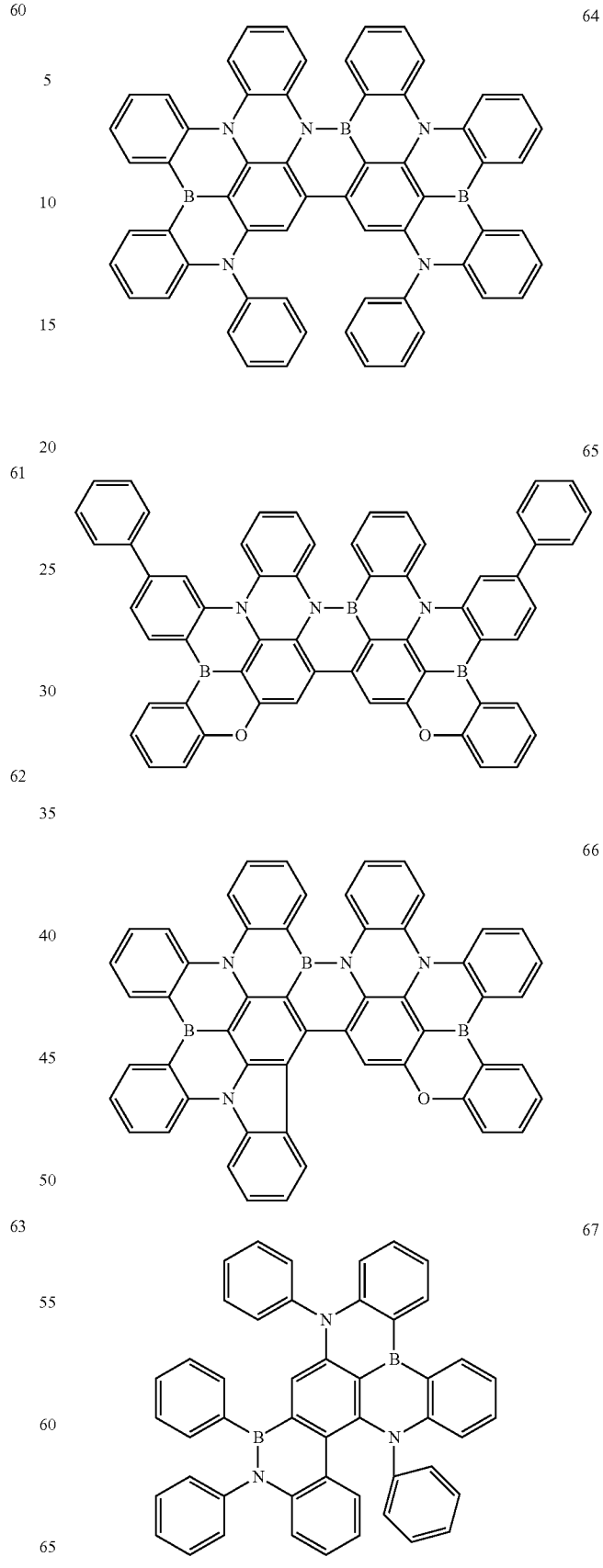

68
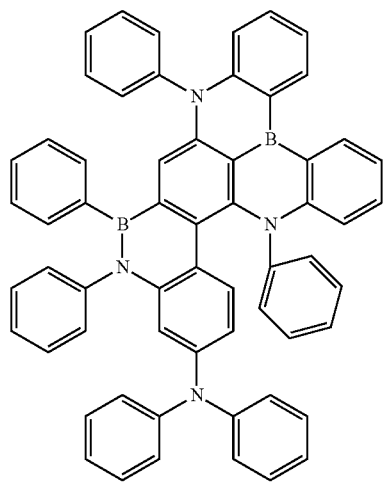
69
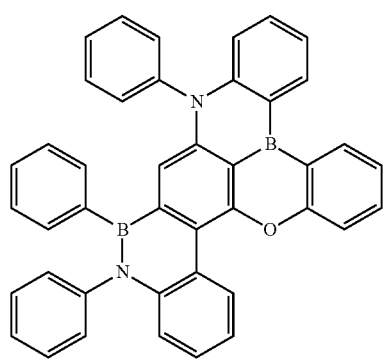
70
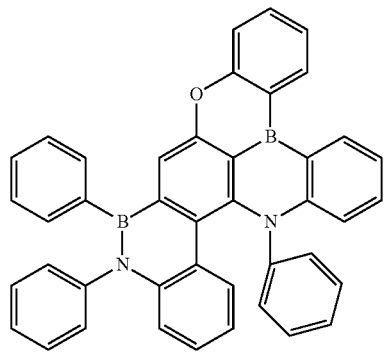
71
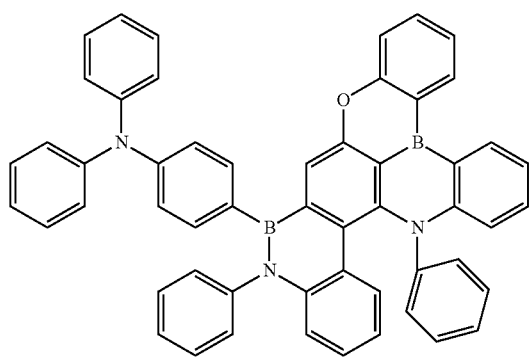
72
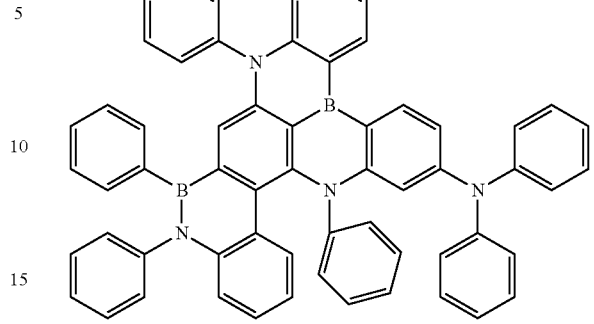
73
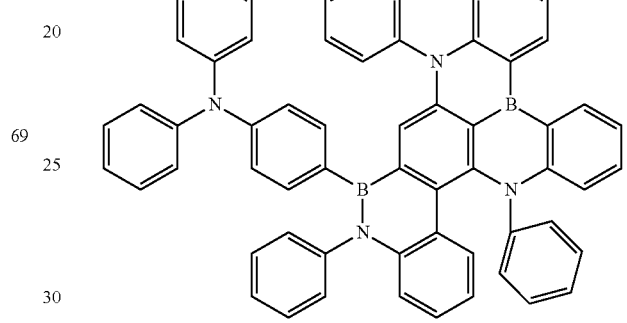
74
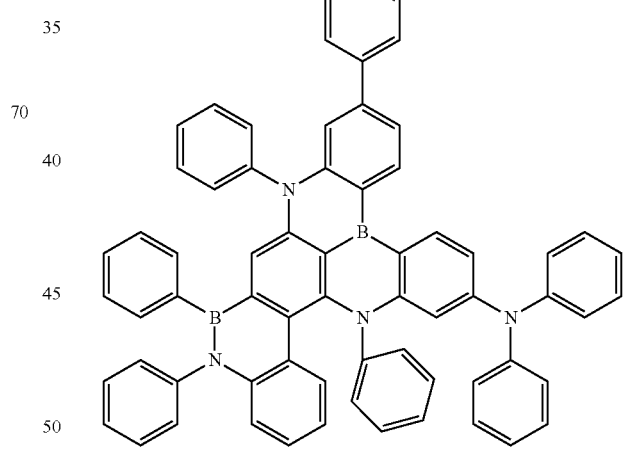
75
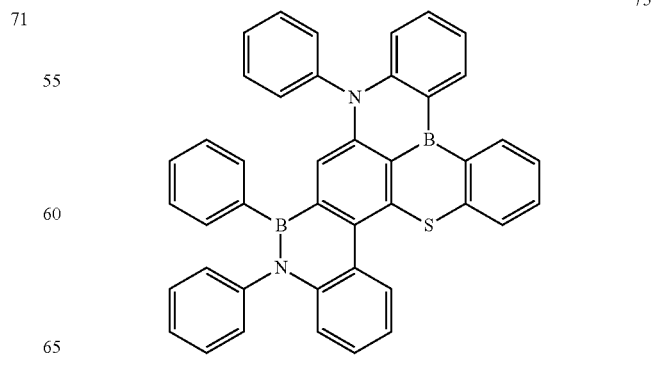

-continued
76
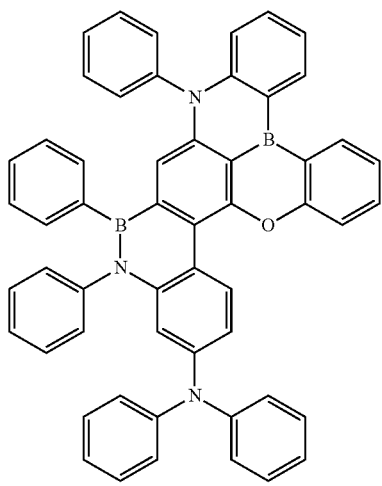
77
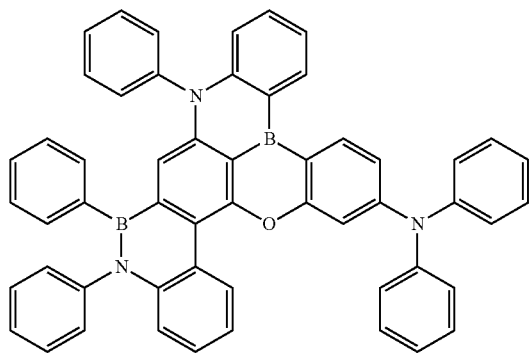
78
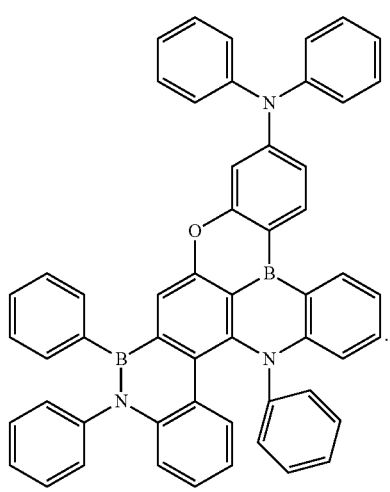
16. A polycyclic compound represented by
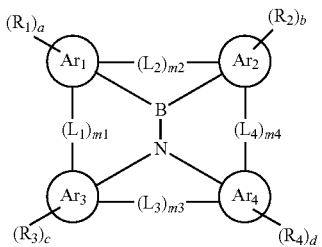
any one among the following Formula 1-1 to Formula 1-4:
Formula 1-1
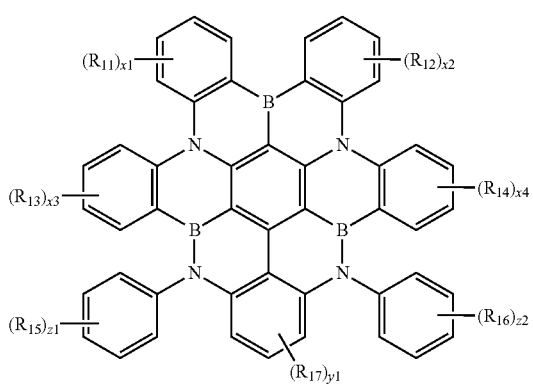
Formula 1-2
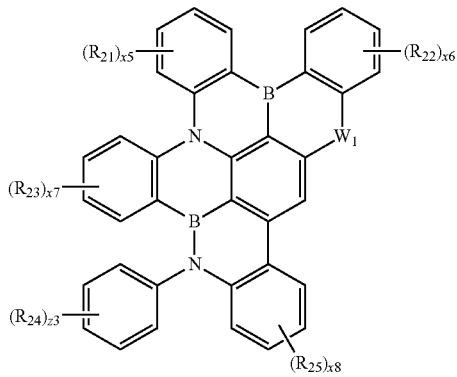
Formula 1-3
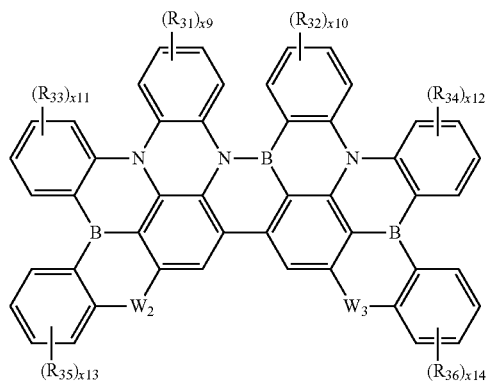

-continued

Formula 1-4

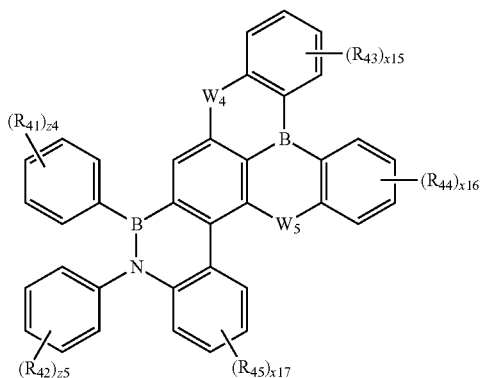

wherein:
in Formula 1-1, $y_1$ is an integer of 0 to 3,
in Formula 1-1 to Formula 1-4,
$R_{11}$ to $R_{17}$, $R_{21}$ to $R_{25}$, $R_{31}$ to $R_{36}$, and $R_{41}$ to $R_{45}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring,
$R_{11}$ to $R_{17}$, $R_{21}$ to $R_{25}$, $R_{31}$ to $R_{36}$, and $R_{41}$ to $R_{45}$ are each independently optionally linked with an adjacent group to form a ring,
x11 to x17 are each independently an integer of 0 to 4,
z1 to z5 are each independently an integer of 0 to 5,
$W_1$ to $W_5$ are each independently a direct linkage, *—O—*, or *—NRa—*, and
Ra is a hydrogen atom, a deuterium atom, a halogen atom, a cyano group, a nitro group, a substituted or unsubstituted amine group, a substituted or unsubstituted alkoxy group, a substituted or unsubstituted aryloxy group, a substituted or unsubstituted alkylthio group, a substituted or unsubstituted arylthio group, a substituted or unsubstituted alkyl group of 1 to 20 carbon atoms, a substituted or unsubstituted alkenyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, or optionally linked with an adjacent group to form a ring.

17. The polycyclic compound of claim 16, wherein at least one among $R_{11}$ to $R_{17}$, $R_{21}$ to $R_{25}$, $R_{31}$ to $R_{36}$, and $R_{41}$ to $R_{45}$ is a deuterium atom, an alkyl group of 1 to 20 carbon atoms, which is substituted with a deuterium atom, an alkenyl group of 2 to 20 carbon atoms, which is substituted with a deuterium atom, an aryl group of 6 to 30 carbon atoms for forming a ring, which is substituted with a deuterium atom, or a heteroaryl group of 2 to 30 carbon atoms for forming a ring, which is substituted with a deuterium atom.

18. The polycyclic compound of claim 16, wherein the polycyclic compound is a blue dopant emitting blue light having a central wavelength of about 470 nm or less.

19. The polycyclic compound of claim 16, wherein the polycyclic compound is a material for emitting thermally activated delayed fluorescence.

20. The polycyclic compound of claim 16, wherein the polycyclic compound is any one among compounds represented by Compound Group 1:

Compound Group 1

1

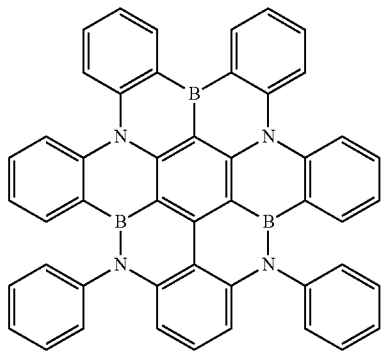

2

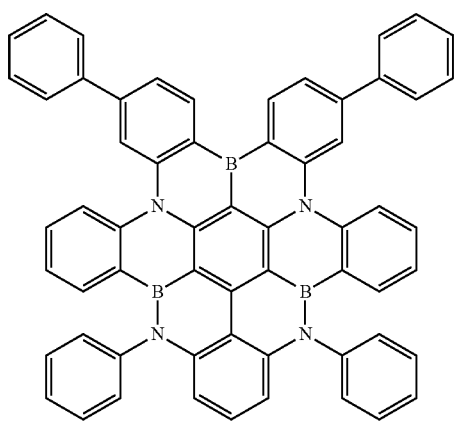

3

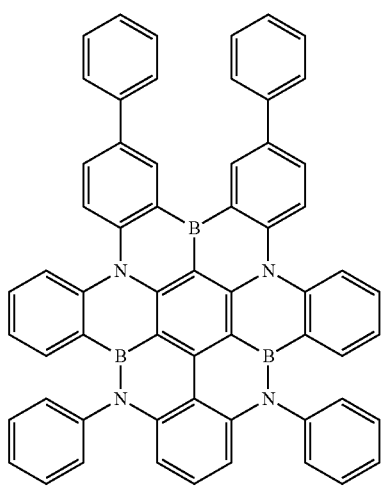

4
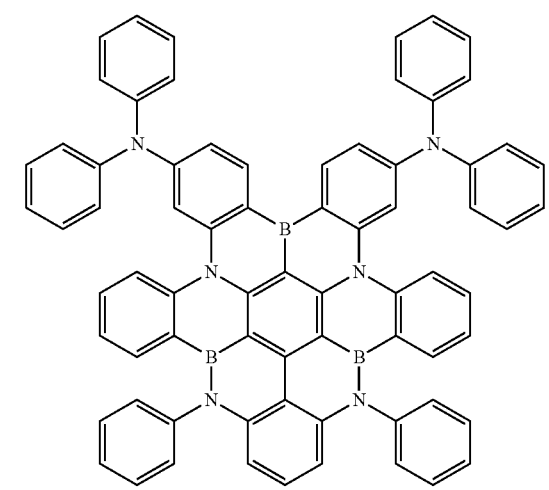
5
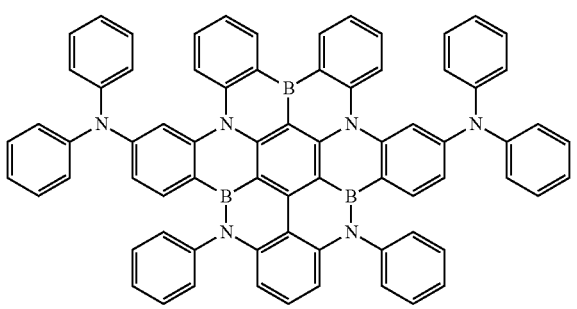
6
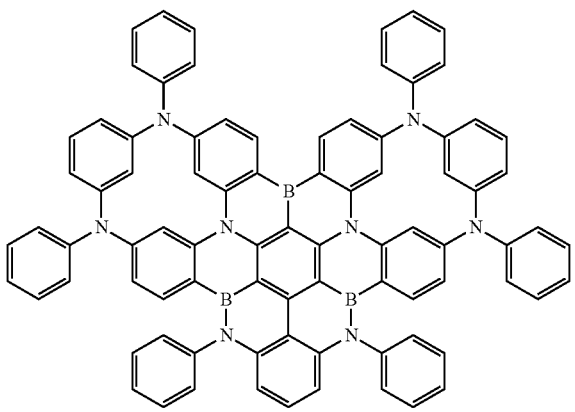
7
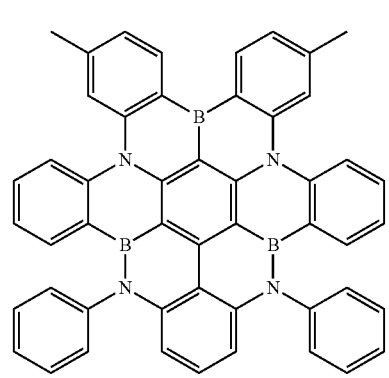
8
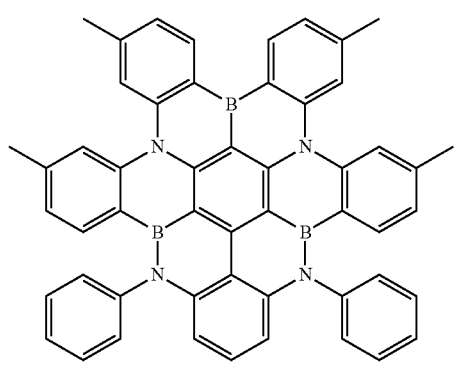
9
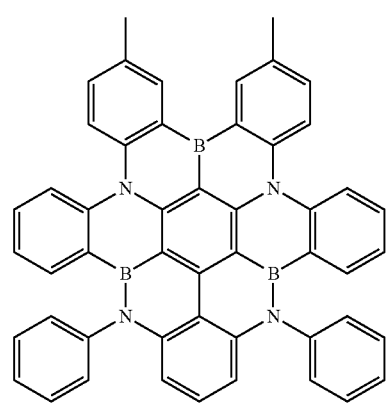
10
11
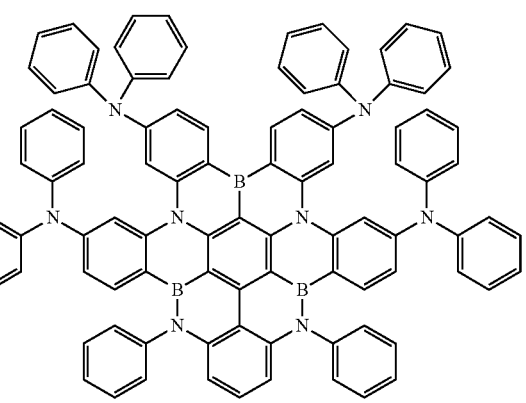

12
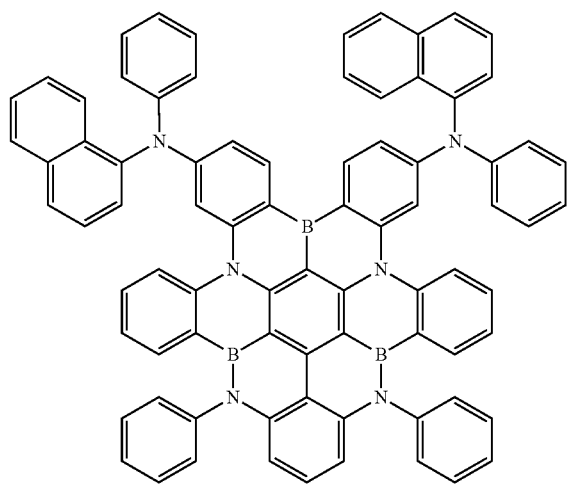
13
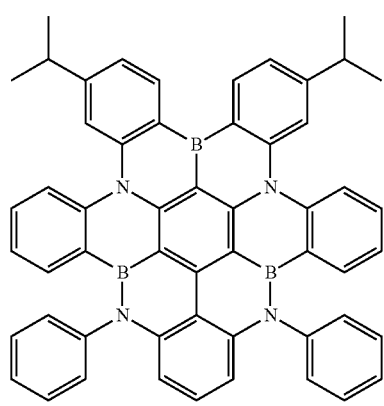
14
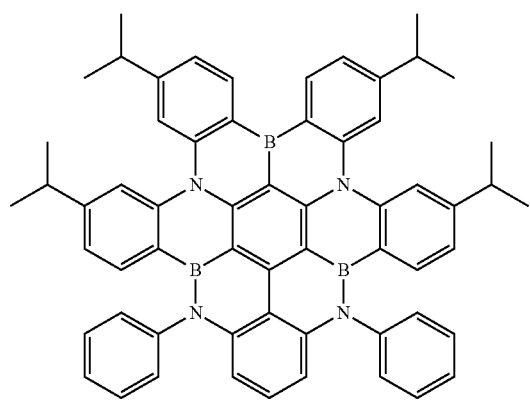
15
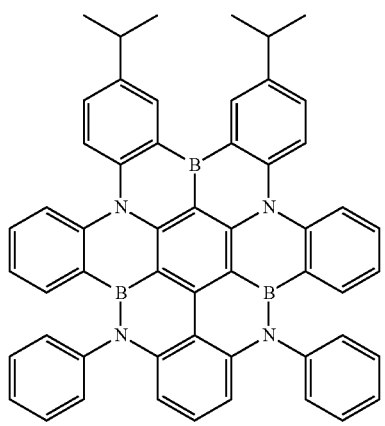
16
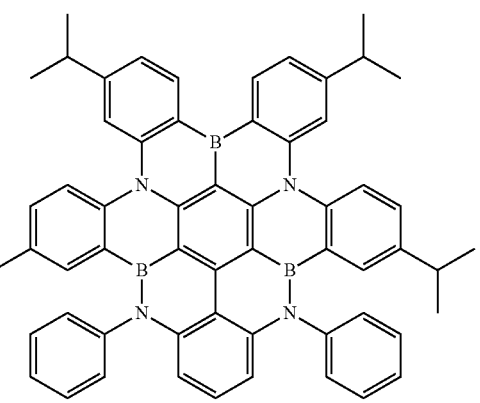
17
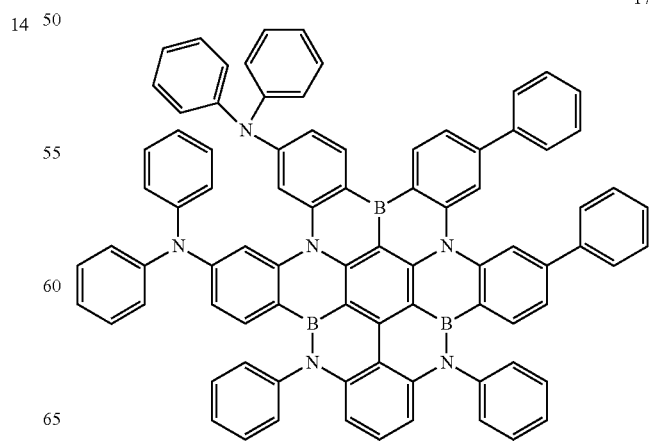

117
-continued
18
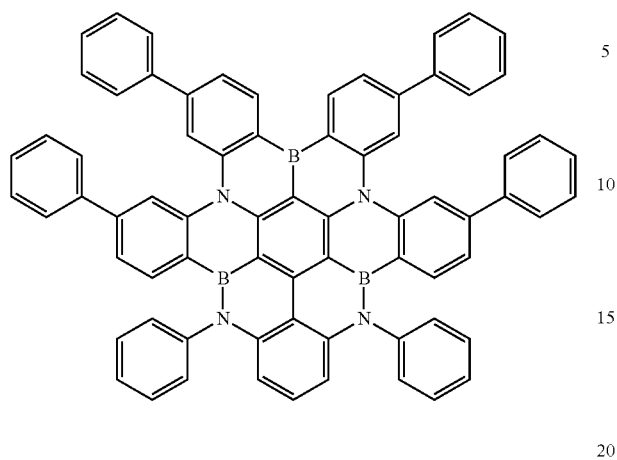
19
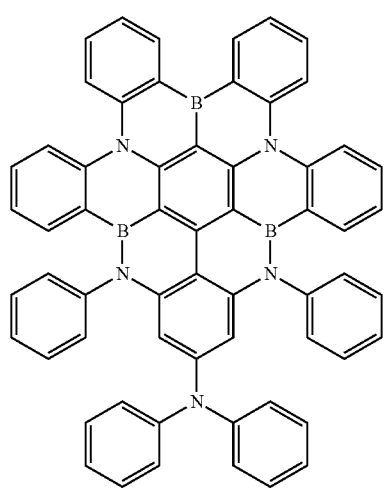
20
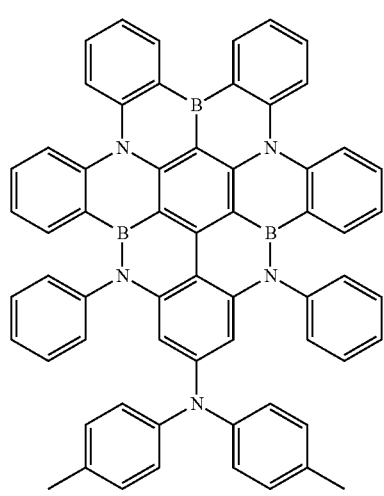
118
-continued
21
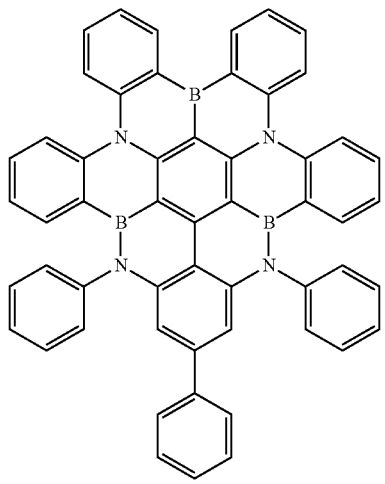
22
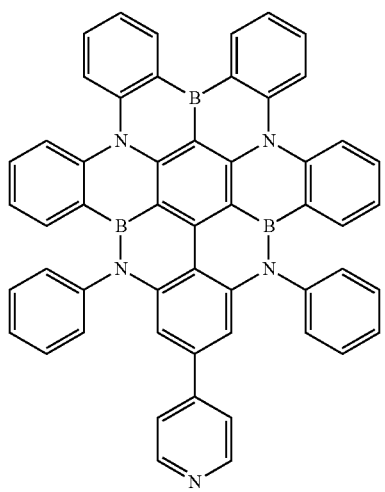
23
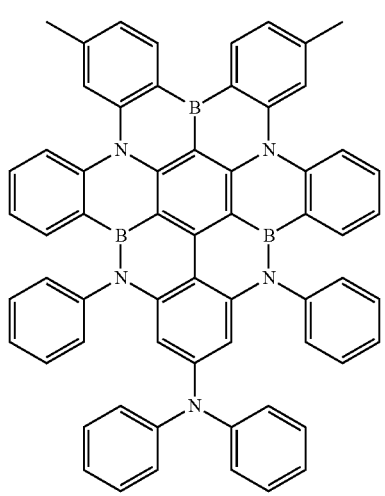

| 24 | 27 |
|---|---|
| 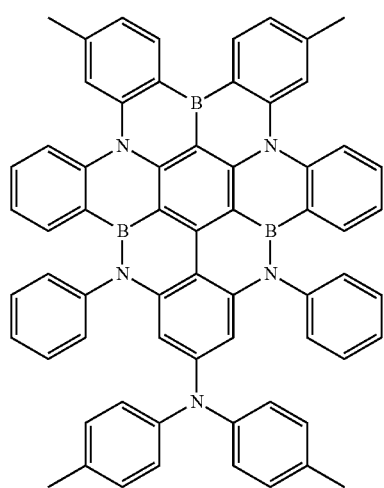 | 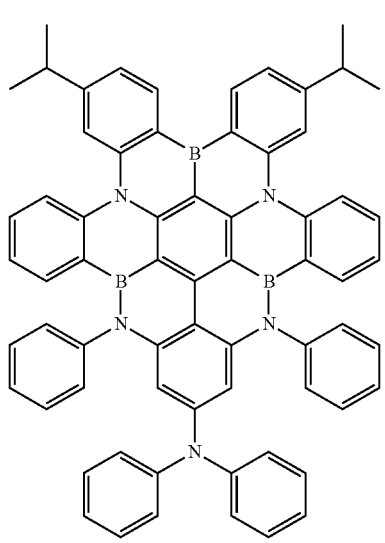 |
| 25 | 28 |
| 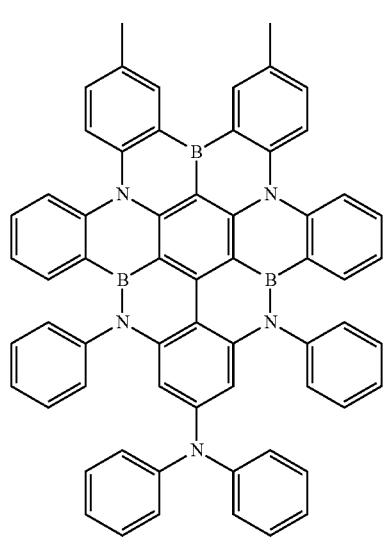 | 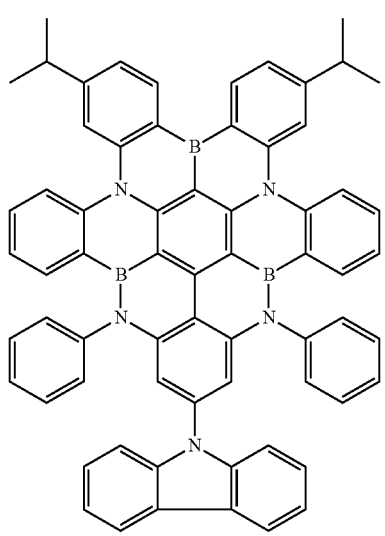 |
| 26 | 29 |
| 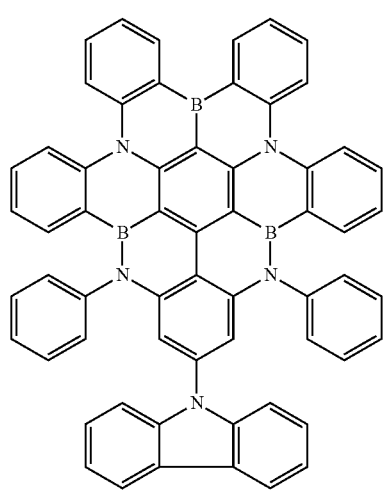 | 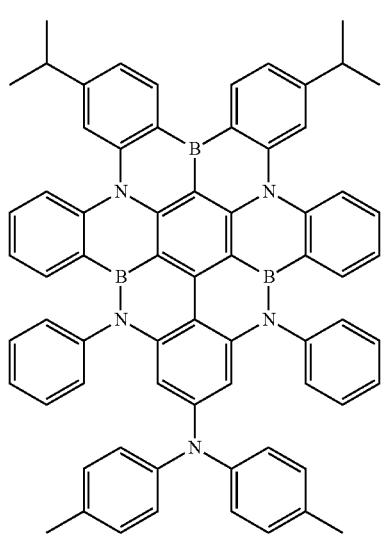 |

121
-continued
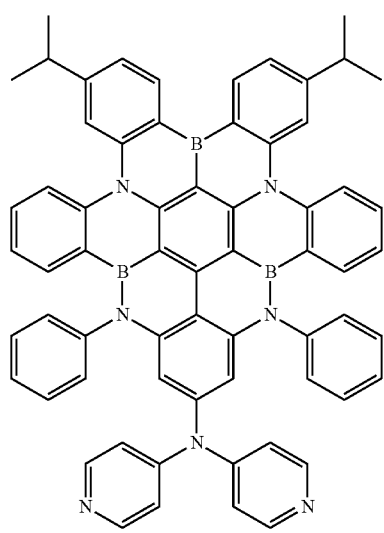
30
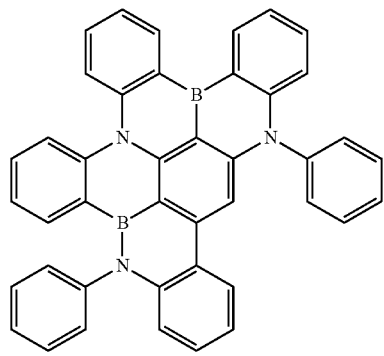
31
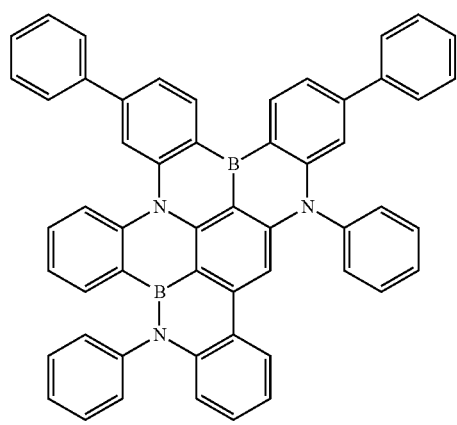
32
122
-continued
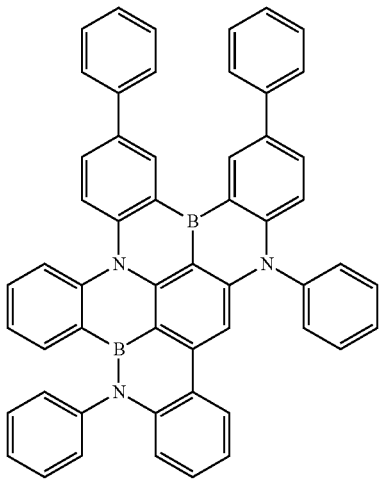
33
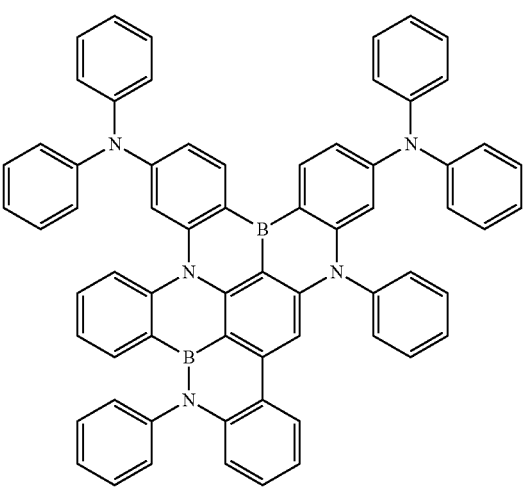
34
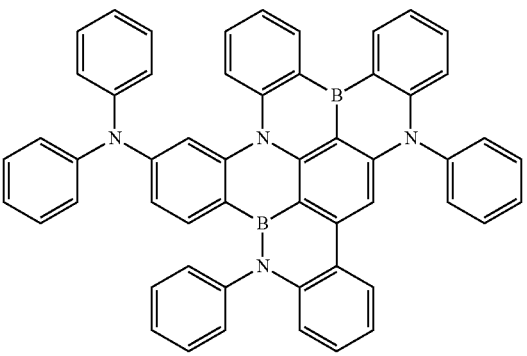
35

36
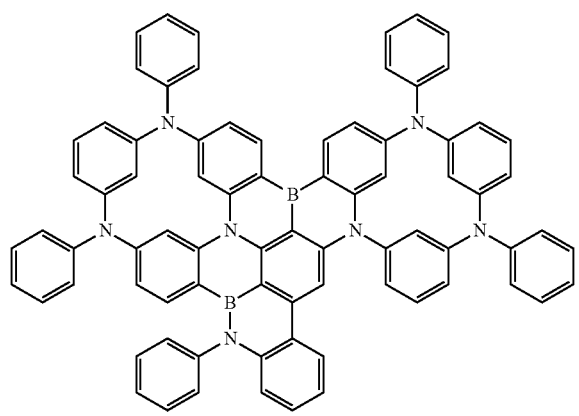
37
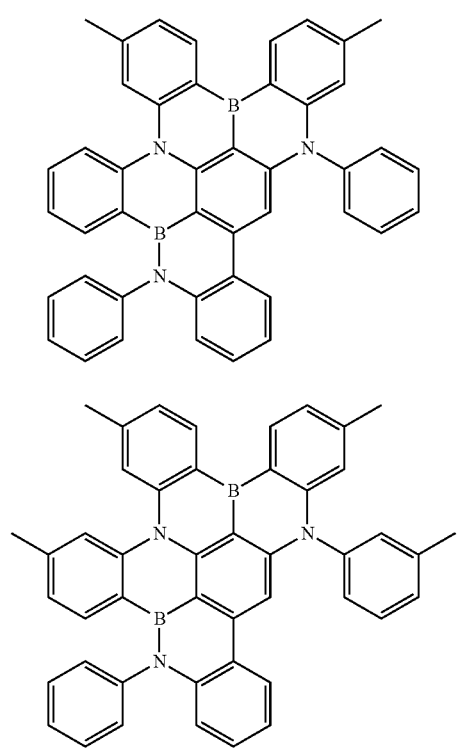
38
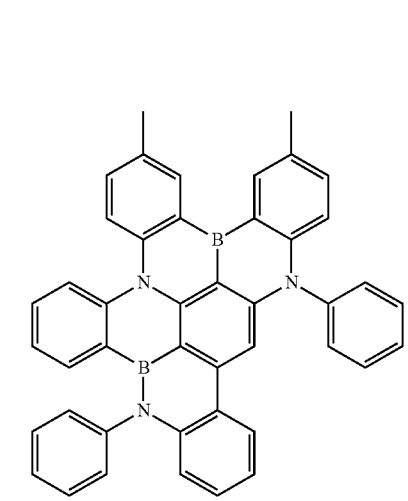
40
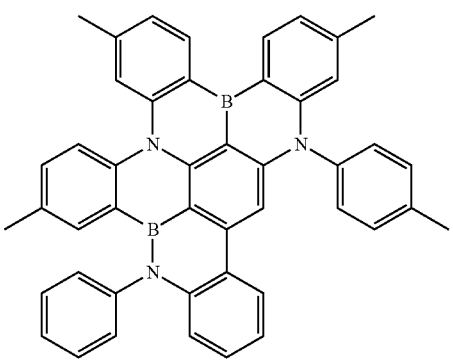
41
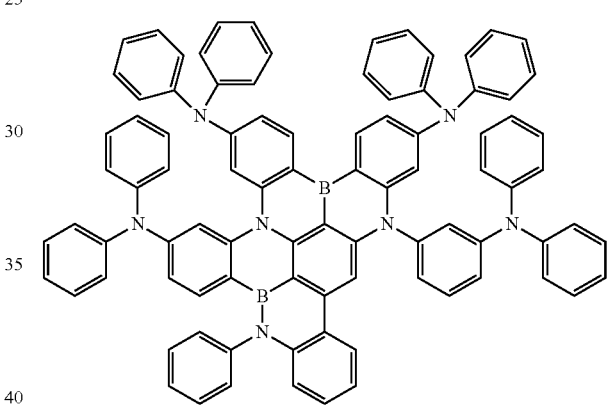
42
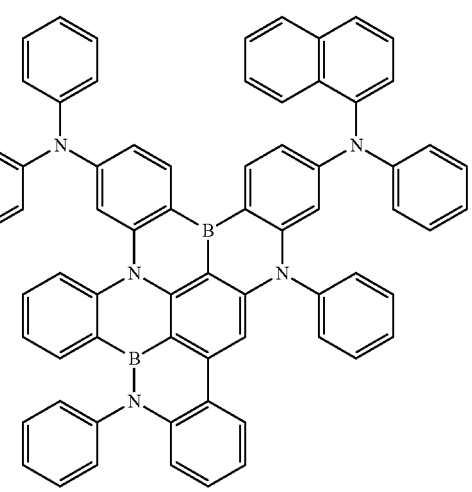

125
-continued
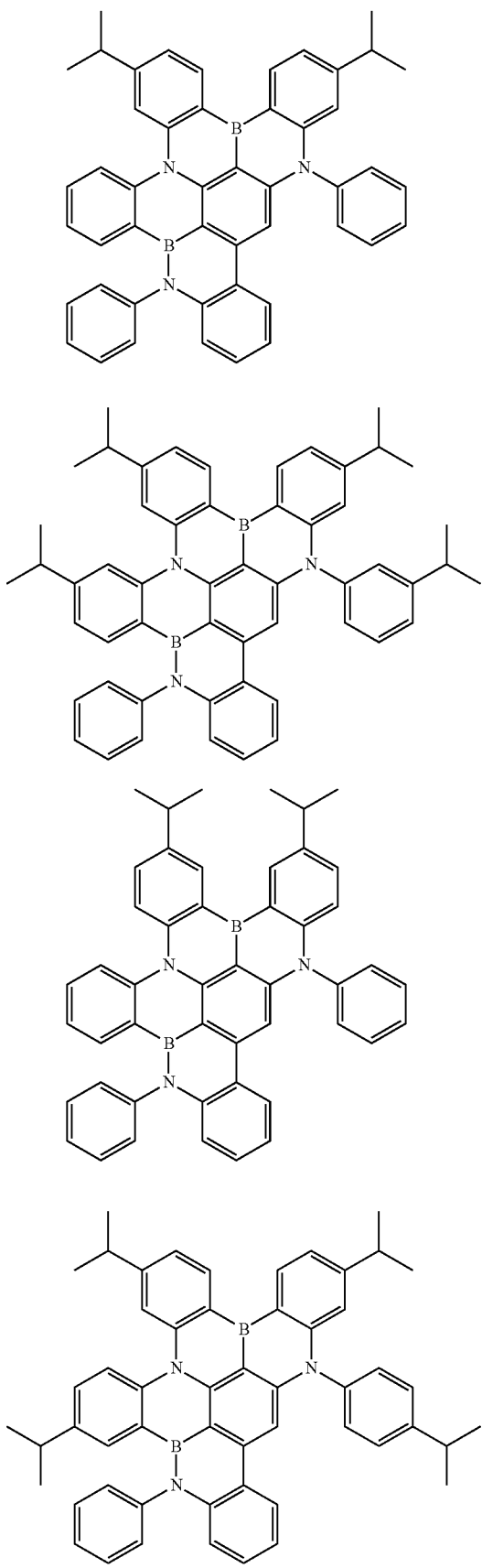
43
44
45
46
126
-continued
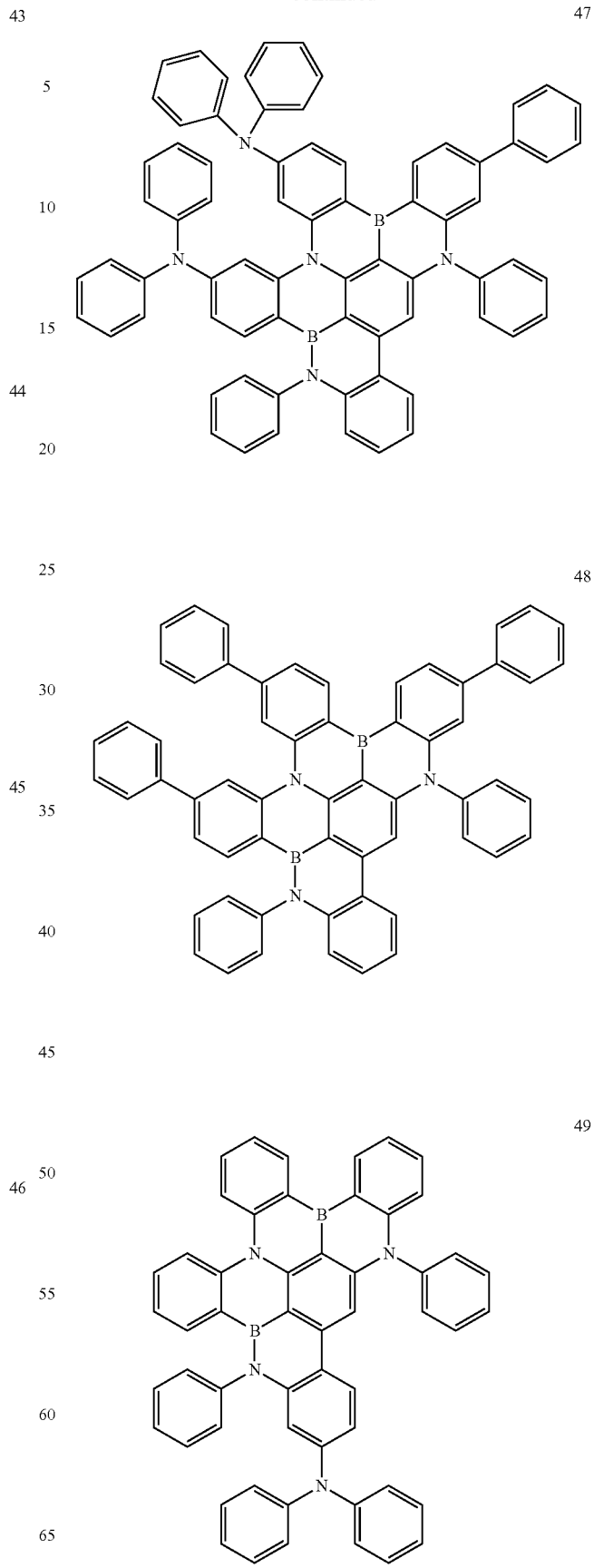
47
48
49

127
-continued
50
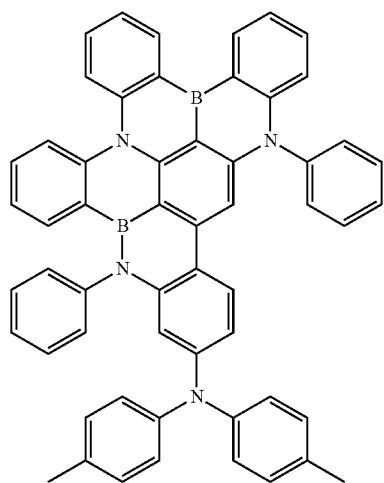
128
-continued
53
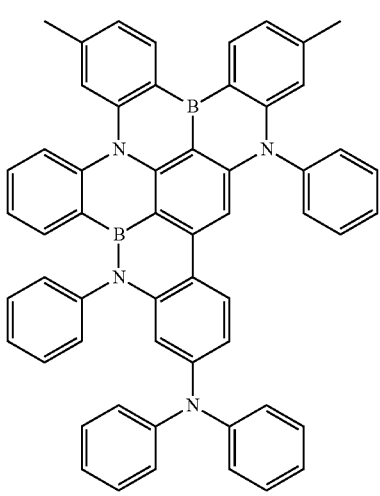
51
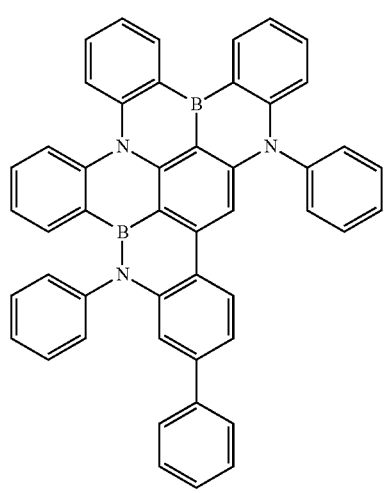
54
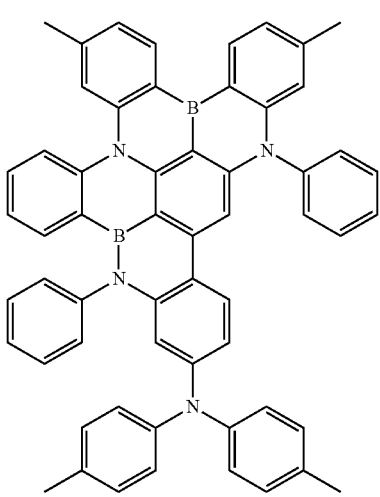
52
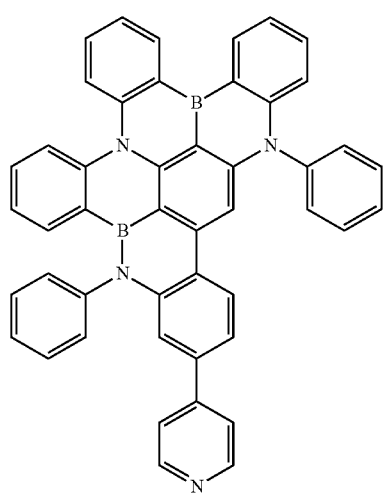
55
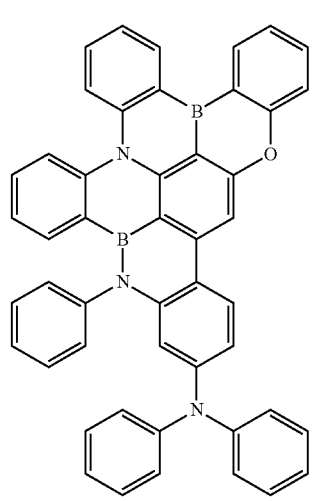

129
-continued
56
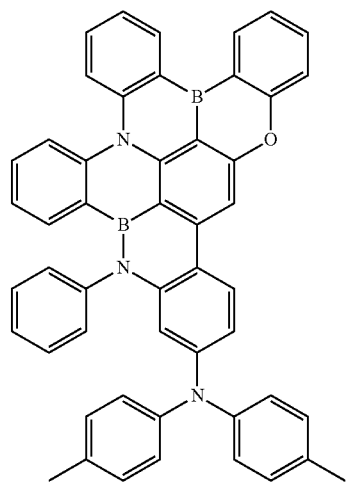
57
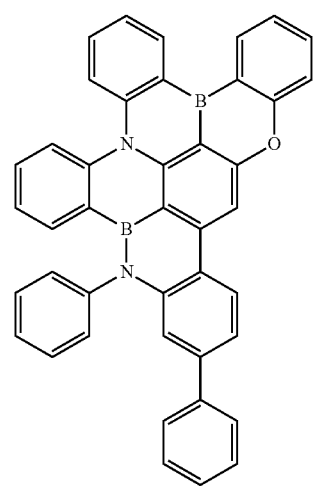
58
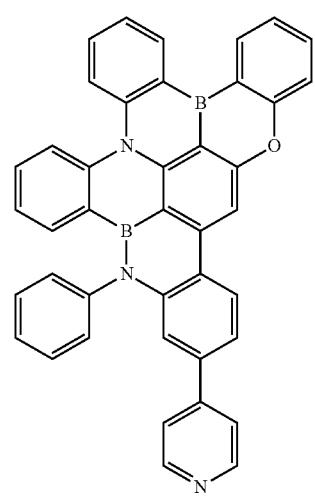
130
-continued
59
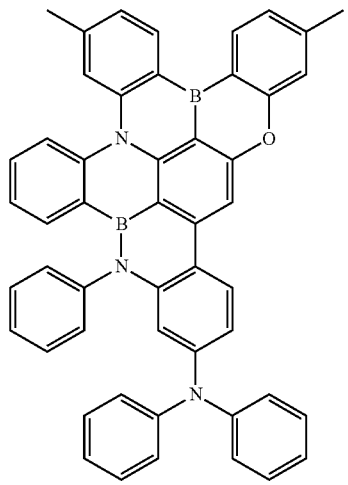
60
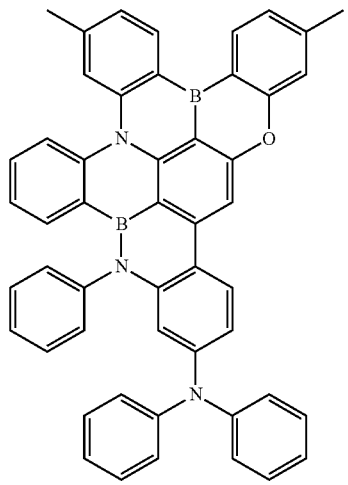
61
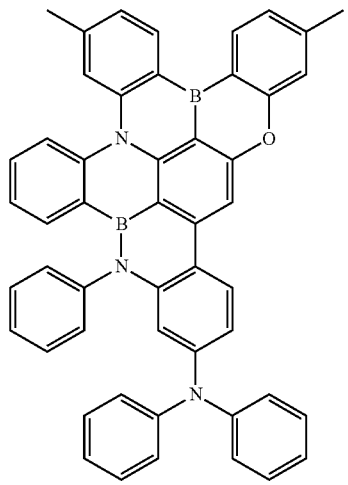
62
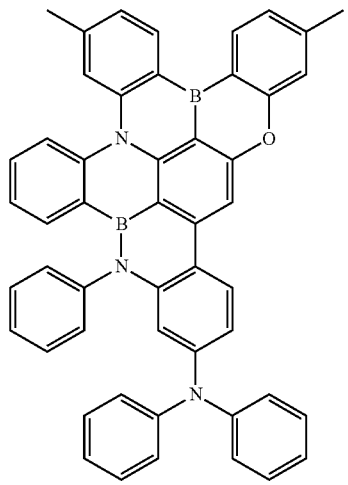

131
-continued
63
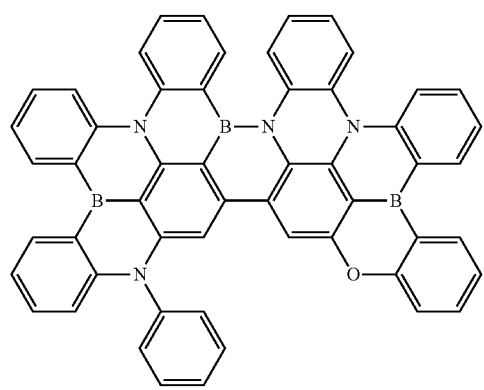
64
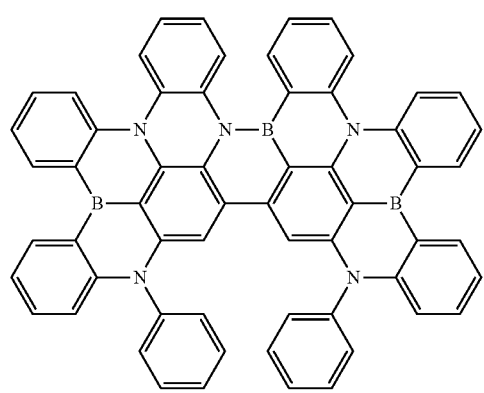
65
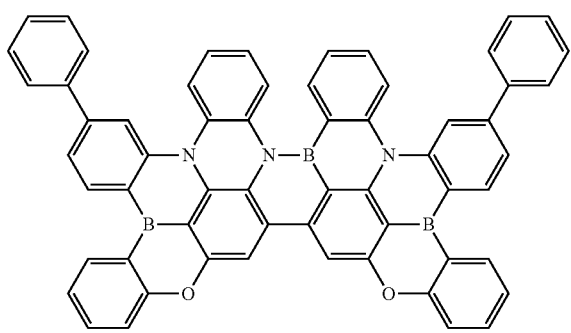
66
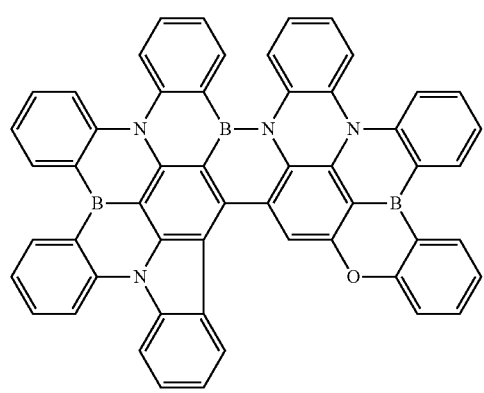
132
-continued
67
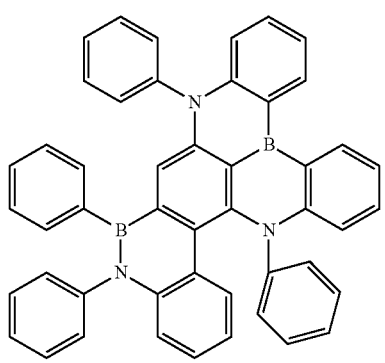
68
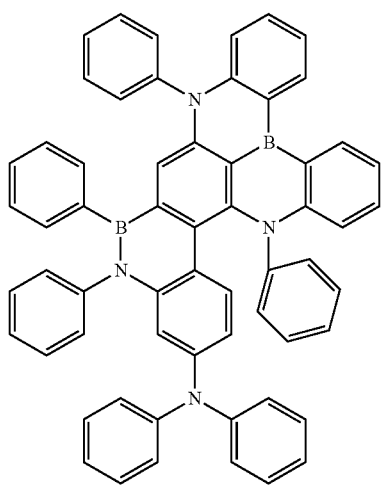
69
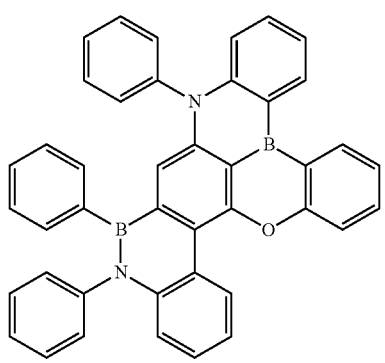
70
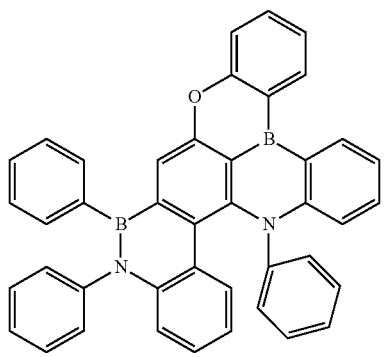

133
-continued
71
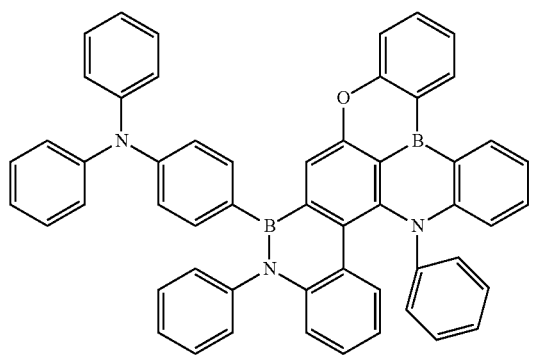
72
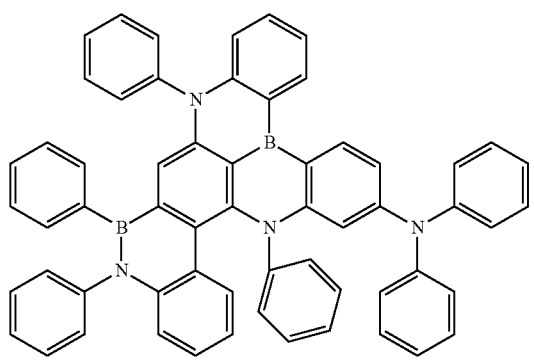
73
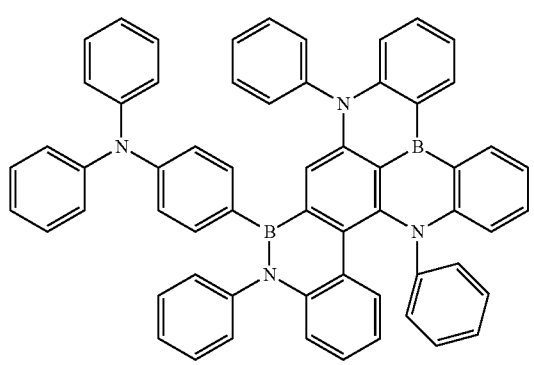
74
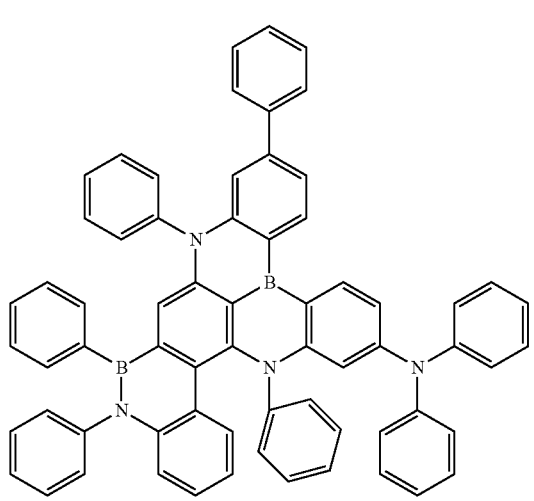
134
-continued
75
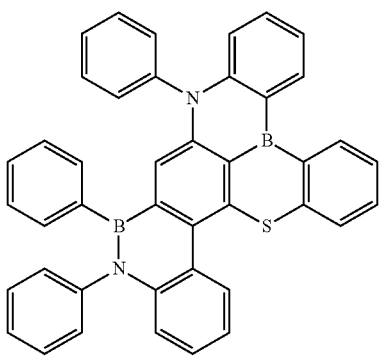
76
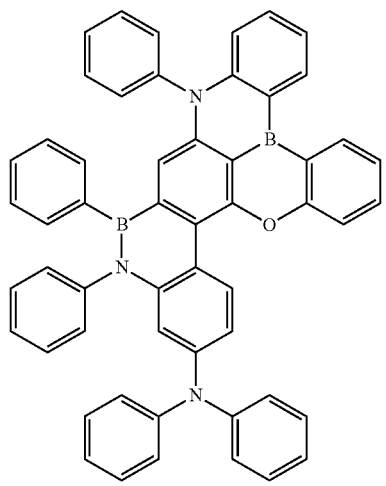
77
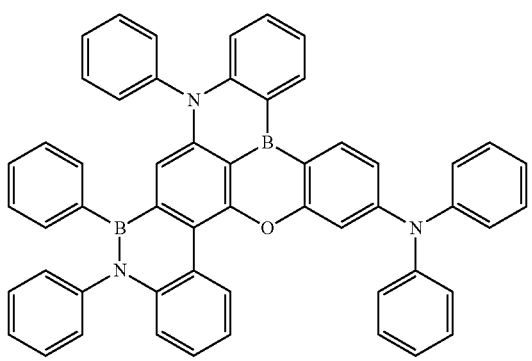

-continued
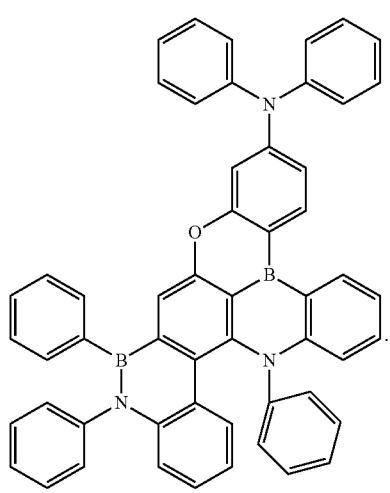
78
* * * * *